(12) United States Patent
Nosaka

(10) Patent No.: US 11,476,835 B2
(45) Date of Patent: Oct. 18, 2022

(54) HIGH-FREQUENCY FILTER CIRCUIT, HIGH-FREQUENCY FRONT END CIRCUIT, AND COMMUNICATION DEVICE

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 997 days.

(21) Appl. No.: 16/199,362

(22) Filed: Nov. 26, 2018

(65) Prior Publication Data
US 2019/0097605 A1  Mar. 28, 2019

Related U.S. Application Data

(63) Continuation of application No. PCT/JP2017/019792, filed on May 26, 2017.

(30) Foreign Application Priority Data

May 27, 2016  (JP) .............................. JP2016-106802

(51) Int. Cl.
*H03H 9/64* (2006.01)
*H03H 9/05* (2006.01)
(Continued)

(52) U.S. Cl.
CPC ............ *H03H 9/6406* (2013.01); *H03H 7/46* (2013.01); *H03H 9/0542* (2013.01);
(Continued)

(58) Field of Classification Search
CPC ......... H03H 7/0115; H03H 2001/0085; H03H 9/6483; H03H 7/09; H03H 9/725;
(Continued)

(56) References Cited

U.S. PATENT DOCUMENTS 6,472,953 B1  10/2002  Sakuragawa et al.
2008/0197941 A1  8/2008  Suzuki et al.
(Continued)

FOREIGN PATENT DOCUMENTS

JP  H09-321573 A  12/1997
JP  H10-163808 A  6/1998
(Continued)

OTHER PUBLICATIONS

International Search Report for International Application No. PCT/JP2017/019792 dated Aug. 15, 2017.
(Continued)

*Primary Examiner* — Ajibola A Akinyemi
(74) *Attorney, Agent, or Firm* — Pearne & Gordon LLP

(57) ABSTRACT

A filter (22A) includes: a series arm circuit (11) that is connected between an input/output terminal (22m) and an input/output terminal (22n); and a parallel arm circuit (12) that is connected between a node (x1), which is on a path that connects the input/output terminal (22m) and the input/output terminal (22n), and ground. The parallel arm circuit (12) includes a parallel arm resonator (22p) and an impedance circuit (13) that is serially connected to the parallel arm resonator (22p). The impedance circuit (13) includes a first impedance element, which is one of an inductor and a capacitor, a second impedance element, which is the other of an inductor and a capacitor, and a switch (22SW) that is serially connected to the second impedance element. A first series circuit (14) comprising of the second impedance element and the switch (22SW) is connected in parallel with the first impedance element.

19 Claims, 21 Drawing Sheets

(51) Int. Cl.
*H04B 1/04* (2006.01)
*H04B 1/00* (2006.01)
*H04B 1/20* (2006.01)
*H03H 7/46* (2006.01)
*H04B 1/40* (2015.01)
*H03H 9/54* (2006.01)

(52) U.S. Cl.
CPC .......... *H03H 9/542* (2013.01); *H03H 9/6403* (2013.01); *H03H 9/6483* (2013.01); *H04B 1/0053* (2013.01); *H04B 1/0458* (2013.01); *H04B 1/20* (2013.01); *H04B 1/40* (2013.01)

(58) Field of Classification Search
CPC .......... H03H 9/0009; H03H 9/64; H03H 1/00; H03H 9/542; H03H 9/605; H03H 9/6433; H03H 7/075; H03H 9/52; H03H 9/6403; H03H 9/6423; H03H 2001/0021; H03H 2210/025; H03H 2250/00; H03H 5/02; H03H 7/0123; H03H 7/1766; H03H 7/1783; H03H 9/0057; H03H 9/568; H03H 9/6479; H03H 2001/0092; H03H 5/12; H03H 7/0161; H03H 7/1708; H03H 7/1725
USPC .......................................................... 310/313
See application file for complete search history.

(56) References Cited

U.S. PATENT DOCUMENTS

| | | |
|---|---|---|
| 2009/0201104 A1 | 8/2009 | Ueda et al. |
| 2009/0251235 A1 | 10/2009 | Belot et al. |
| 2013/0135154 A1* | 5/2013 | Sumi .................. H01Q 9/42 343/700 MS |
| 2013/0229836 A1* | 9/2013 | Wang .................. H02M 7/4837 363/40 |
| 2016/0204755 A1* | 7/2016 | Kando .................. H03H 9/6483 333/175 |
| 2016/0204763 A1* | 7/2016 | Tani .................. H03H 9/6403 333/188 |

FOREIGN PATENT DOCUMENTS

| | | |
|---|---|---|
| JP | 2000-114873 A | 4/2000 |
| JP | 2000-323961 A | 11/2000 |
| JP | 2003-60479 A | 2/2003 |
| JP | 2008-205947 A | 9/2008 |
| JP | 2008-306359 A | 12/2008 |
| JP | 2009-207116 A | 9/2009 |

OTHER PUBLICATIONS

Written Opinion for International Application No. PCT/JP2017/019792 dated Aug. 15, 2017.

* cited by examiner

FIG. 14D
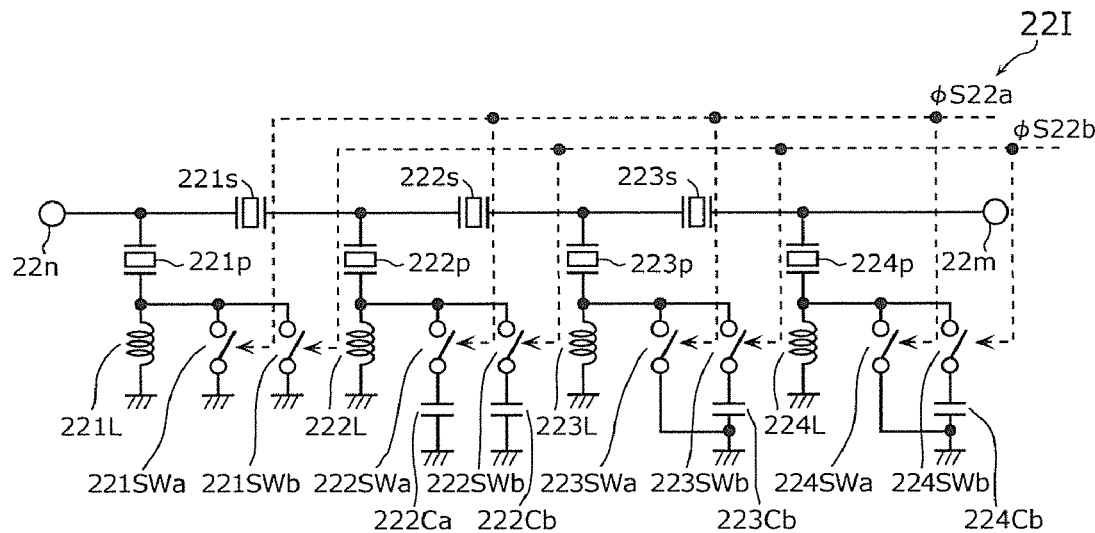
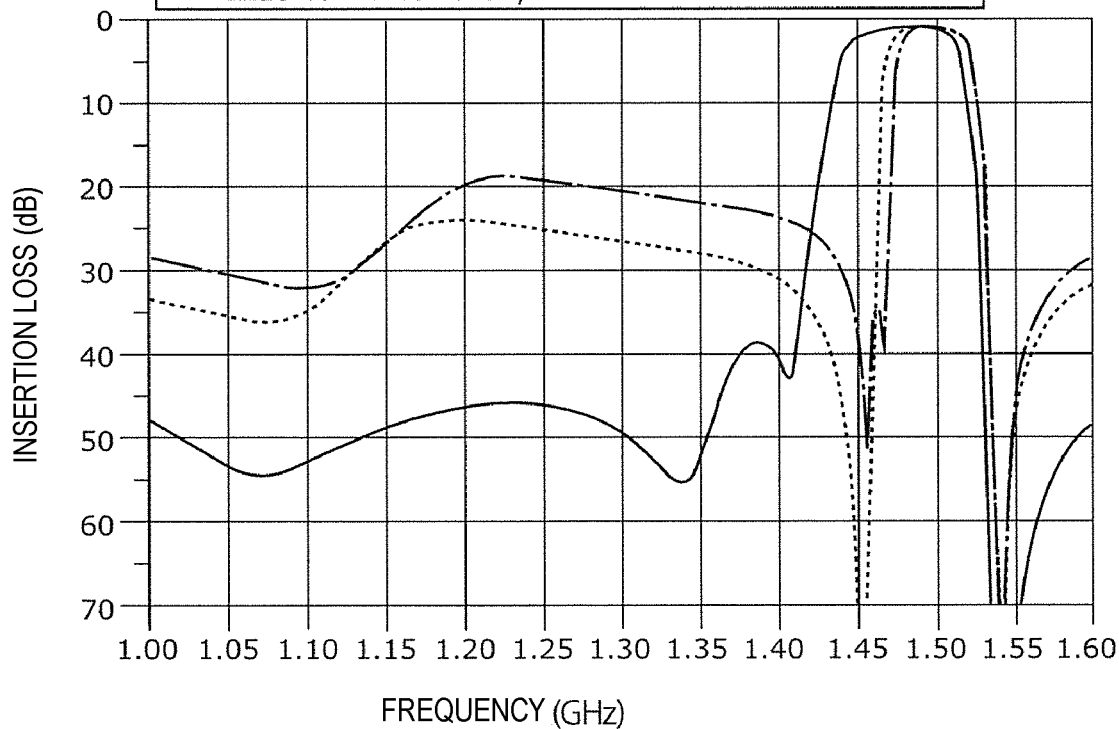

HIGH-FREQUENCY FILTER CIRCUIT, HIGH-FREQUENCY FRONT END CIRCUIT, AND COMMUNICATION DEVICE

This is a continuation of International Application No. PCT/JP2017/019792 filed on May 26, 2017 which claims priority from Japanese Patent Application No. 2016-106802 filed on May 27, 2016. The contents of these applications are incorporated herein by reference in their entireties.

BACKGROUND OF THE DISCLOSURE

Field of the Disclosure

The present disclosure relates to a high-frequency filter circuit that includes resonators, to a high-frequency front end circuit, and to a communication device.

Description of the Related Art

Heretofore, elastic wave filters that employ elastic waves have been widely used in band pass filters and so on that are arranged in the front end units of mobile communication devices. In addition, high-frequency front end circuits have been implemented that include a plurality of elastic wave filters in order to support combinations such as multiple modes, multiple bands, and so on.

For example, a ladder filter structure formed of a series arm circuit and a parallel arm circuit that include bulk acoustic wave (BAW) resonators can be used as the configuration of an elastic wave filter that supports multiple bands (for example, refer to Patent Document 1). Specifically, an elastic wave filter disclosed in Patent Document 1 is formed of a series arm circuit that comprises of a series arm resonator and a parallel arm circuit in which a capacitor and a switch connected in parallel with each other are serially connected to a parallel arm resonator. This elastic wave filter is a tunable filter (that is, a variable frequency filter in which the frequency can be changed) that can switch the frequency of a pass band and the frequency of an attenuation pole by switching the switches between a conductive state (on) and a non-conductive state (off).

Patent Document 1: U.S. Patent Application Publication No. 2009/0251235

BRIEF SUMMARY OF THE DISCLOSURE

Typically, in a basic ladder filter structure formed of a series arm circuit and a parallel arm circuit, the frequency of a pass band is defined by the anti-resonant frequency of the parallel arm circuit and the resonant frequency of the series arm circuit, the frequency of an attenuation pole on the low-frequency side of the pass band is defined by the resonant frequency of the parallel arm circuit, and the frequency of an attenuation pole on the high-frequency side of the pass band is defined by the anti-resonant frequency of the series arm circuit.

In the configuration of the related art described above, when the switch of the parallel arm circuit is in a conductive state, the impedance element (capacitor in configuration of the related art) is short circuited, and the parallel arm circuit becomes a circuit comprising of just the parallel arm resonator. Thus, the resonant frequency of the parallel arm resonator is the resonant frequency of the parallel arm circuit. In addition, when the switch of the parallel arm circuit is in a non-conductive state, the parallel arm circuit becomes a circuit in which the parallel arm resonator and the capacitor are connected in series with each other. Therefore, the resonant frequency of the parallel arm circuit when the switch is in a non-conductive state is a resonant frequency that is higher than the resonant frequency of the parallel arm resonator of the parallel arm circuit. Therefore, the frequency of the attenuation pole on the low-frequency side of the pass band can be switched (changed) in accordance with the switch being switched between a conductive state and a non-conductive state.

However, in the configuration of the related art described above, since the resonant frequency of the parallel arm circuit when the switch is in a non-conductive state is a resonant frequency that is higher than the resonant frequency of the parallel arm resonator of the parallel arm circuit, the frequency of the attenuation pole of the low-frequency side of the pass band cannot be switched to a frequency that is lower than the resonant frequency of the parallel arm resonator. Therefore, there is a problem in that it is difficult to secure sufficient attenuation in an attenuation band at a frequency lower than the resonant frequency of the parallel arm resonator.

Accordingly, the present disclosure was made in order to solve the above-described problem, and an object of the present disclosure is to provide a high-frequency filter circuit, a high-frequency front end circuit, and a communication device that can secure sufficient attenuation in an attenuation band at a frequency lower than the resonant frequency of a parallel arm resonator.

In order to achieve this object, a high-frequency filter circuit according to an aspect of the present disclosure includes: a series arm circuit connected between a first input/output terminal and a second input/output terminal; and a parallel arm circuit connected between a node on a path that connects the first input/output terminal and the second input/output terminal, and ground. The parallel arm circuit includes a parallel arm resonator and an impedance circuit that is serially connected to the parallel arm resonator. The impedance circuit includes a first impedance element, which is one of an inductor and a capacitor, a second impedance element, which is the other of an inductor and a capacitor, and a switch element that is serially connected to the second impedance element. A first series circuit comprising of the second impedance element and the switch element is connected in parallel with the first impedance element.

Due to this configuration, the second impedance element in the impedance circuit is switched between a connected state and a disconnected state in accordance with the switch element being switched between a conductive state and a non-conductive state, and as a result the impedance of the impedance circuit is switched. In addition, the first impedance element is one of an inductor and a capacitor and the second impedance element is the other of an inductor and a capacitor, and therefore the impedance circuit in the case where the switch element is in a conductive state has a frequency at which the impedance is maximum due to the parallel circuit comprising of the inductor and the capacitor. Therefore, the parallel arm circuit in the case where the switch element is in a conductive state has two resonant frequencies including a resonant frequency that is lower than the resonant frequency of the parallel arm resonator.

Therefore, with the parallel arm circuit in the case where the switch element is in a conductive state, the resonant frequency can be arranged on the low-frequency side of the resonant frequency of the parallel arm resonator, and therefore sufficient attenuation can be secured in an attenuation band at a frequency lower than the resonant frequency of the parallel arm resonator.

Furthermore, the first impedance element may be a capacitor and the second impedance element may be an inductor.

Due to this configuration, the impedance circuit in the case where the switch element is in a conductive state is a circuit in which an inductor and a capacitor are connected in parallel with each other, and the impedance circuit has an impedance characteristic having a frequency at which the impedance is maximum. Therefore, the parallel arm circuit in the case where the switch element is in a conductive state has two resonant frequencies including a resonant frequency that is on the low-frequency side of the resonant frequency of the parallel arm resonator.

On the other hand, the impedance circuit in the case where the switch element is in a non-conductive state is a circuit comprising of just a capacitor, and therefore the impedance circuit has a capacitive impedance. Therefore, the parallel arm circuit in the case where the switch element is in a non-conductive state has only one resonant frequency that is on the high-frequency side of the resonant frequency of the parallel arm resonator and on the low-frequency side of the anti-resonant frequency of the parallel arm resonator.

Therefore, a resonant frequency of the parallel arm circuit and the number of resonant frequencies of the parallel arm circuit can be switched in accordance with the switch element being switched between a conductive state and a non-conductive state, and therefore the frequency of an attenuation pole and the number of attenuation poles can be switched. Furthermore, sufficient attenuation can be secured in an attenuation band at a frequency lower than the resonant frequency of the parallel arm resonator in the case where the switch element is in a conductive state.

In addition, the high-frequency filter circuit may be configured such that when the switch element is in a conductive state, a frequency at which the impedance of the impedance circuit is maximum is higher than a resonant frequency of the parallel arm resonator.

Due to this configuration, in the impedance circuit in the case where the switch element is in a conductive state, since the frequency at which the impedance is maximum is located at a higher frequency than the resonant frequency of the parallel arm resonator, the impedance circuit has an inductive impedance at the resonant frequency of the parallel arm resonator. Therefore, the parallel arm circuit in the case where the switch element is in a conductive state has two resonant frequencies, namely, a resonant frequency on the low-frequency side of the resonant frequency of the parallel arm resonator and a resonant frequency on the high-frequency side of the resonant frequency and the anti-resonant frequency of the parallel arm resonator.

On the other hand, the impedance circuit in the case where the switch element is in a non-conductive state is a circuit comprising of just a capacitor, and therefore the impedance circuit has a capacitive impedance. Therefore, the parallel arm circuit in the case where the switch element is in a non-conductive state has only one resonant frequency that is on the high-frequency side of the resonant frequency of the parallel arm resonator and on the low-frequency side of the anti-resonant frequency of the parallel arm resonator.

Therefore, the frequency of the attenuation pole on the low-frequency side of the pass band and the presence/absence of an attenuation pole on the high-frequency side of the pass band can be switched in accordance with switching of the switch element between a conductive state and a non-conductive state. Furthermore, sufficient attenuation can be secured in an attenuation band at a frequency lower than the resonant frequency of the parallel arm resonator in the case where the switch element is in a conductive state.

In addition, the high-frequency filter circuit may be configured such that when the switch element is in a conductive state, a frequency at which the impedance of the impedance circuit is maximum is lower than a resonant frequency of the parallel arm resonator.

Due to this configuration, in the impedance circuit in the case where the switch element is in a conductive state, the frequency at which the impedance is maximum is located at a lower frequency than the resonant frequency of the parallel arm resonator, and therefore the impedance circuit has a capacitive impedance at the resonant frequency of the parallel arm resonator. Therefore, the parallel arm circuit in the case where the switch element is in a conductive state has two resonant frequencies, namely, a resonant frequency on the low-frequency side of the resonant frequency of the parallel arm resonator and a resonant frequency on the high-frequency side of the resonant frequency of the parallel arm resonator and on the low-frequency side of the anti-resonant frequency of the parallel arm resonator.

On the other hand, the impedance circuit in the case where the switch element is in a non-conductive state is a circuit comprising of just a capacitor, and therefore the impedance circuit has a capacitive impedance. Therefore, the parallel arm circuit in the case where the switch element is in a non-conductive state has only one resonant frequency that is on the high-frequency side of the resonant frequency of the parallel arm resonator and on the low-frequency side of the anti-resonant frequency of the parallel arm resonator.

Therefore, the frequency of an attenuation pole and the number of attenuation poles on the low-frequency side of the pass band can be switched in accordance with switching of the switch element between a conductive state and a non-conductive state. Furthermore, sufficient attenuation can be secured in an attenuation band at a frequency lower than the resonant frequency of the parallel arm resonator in the case where the switch element is in a conductive state.

Furthermore, the first impedance element may be an inductor and the second impedance element may be a capacitor.

Due to this configuration, the impedance circuit in the case where the switch element is in a conductive state is a circuit in which an inductor and a capacitor are connected in parallel with each other, and the impedance circuit has an impedance characteristic having a frequency at which the impedance is maximum. Therefore, the parallel arm circuit in the case where the switch element is in a conductive state has two resonant frequencies including a resonant frequency that is on the low-frequency side of the resonant frequency of the parallel arm resonator.

On the other hand, the impedance circuit in the case where the switch element is in a non-conductive state is a circuit comprising of just an inductor, and therefore the impedance circuit has an inductive impedance. Therefore, the parallel arm circuit in the case where the switch element is in a non-conductive state has two resonant frequencies, namely, a resonant frequency on the low-frequency side of the resonant frequency of the parallel arm resonator and a resonant frequency on the high-frequency side of the resonant frequency of the parallel arm resonator.

Therefore, the frequency of an attenuation pole can be switched in accordance with switching of the switch element between a conductive state and a non-conductive state. Furthermore, sufficient attenuation can be secured in an attenuation band at a frequency lower than the resonant frequency of the parallel arm resonator in the case where the switch element is in a conductive state.

In addition, the high-frequency filter circuit may be configured such that when the switch element is in a conductive state, a frequency at which the impedance of the impedance circuit is maximum is lower than a resonant frequency of the parallel arm resonator.

Due to this configuration, in the impedance circuit in the case where the switch element is in a conductive state, the frequency at which the impedance is maximum is located at a lower frequency than the resonant frequency of the parallel arm resonator, and therefore the impedance circuit has a capacitive impedance at the resonant frequency of the parallel arm resonator. Therefore, the parallel arm circuit in the case where the switch element is in a conductive state has two resonant frequencies that are on the low-frequency side of the resonant frequency of the parallel arm resonator.

On the other hand, the impedance circuit in the case where the switch element is in a non-conductive state is a circuit comprising of just an inductor, and therefore the impedance circuit has an inductive impedance. Therefore, the parallel arm circuit in the case where the switch element is in a non-conductive state has two resonant frequencies, namely, a resonant frequency on the low-frequency side of the resonant frequency of the parallel arm resonator and a resonant frequency on the high-frequency side of the resonant frequency of the parallel arm resonator.

Therefore, the frequency of an attenuation pole and the number of attenuation poles on the low-frequency side of the pass band and the presence/absence of an attenuation pole on the high-frequency side of the pass band can be switched in accordance with switching of the switch element between a conductive state and a non-conductive state. Furthermore, sufficient attenuation can be secured in an attenuation band at a frequency lower than the resonant frequency of the parallel arm resonator in the case where the switch element is in a conductive state.

In addition, the high-frequency filter circuit may be configured such that when the switch element is in a conductive state, a frequency at which the impedance of the impedance circuit is maximum is higher than a resonant frequency of the parallel arm resonator.

Due to this configuration, in the impedance circuit in the case where the switch element is in a conductive state, since the frequency at which the impedance is maximum is located at a higher frequency than the resonant frequency of the parallel arm resonator, the impedance circuit has an inductive impedance at the resonant frequency of the parallel arm resonator. Therefore, the parallel arm circuit in the case where the switch element is in a conductive state has two resonant frequencies, namely, a resonant frequency on the low-frequency side of the resonant frequency of the parallel arm resonator and a resonant frequency on the high-frequency side of the resonant frequency and the anti-resonant frequency of the parallel arm resonator.

On the other hand, the impedance circuit in the case where the switch element is in a non-conductive state is a circuit comprising of just an inductor, and therefore the impedance circuit has an inductive impedance. Therefore, the parallel arm circuit in the case where the switch element is in a non-conductive state has two resonant frequencies, namely, a resonant frequency on the low-frequency side of the resonant frequency of the parallel arm resonator and a resonant frequency on the high-frequency side of the resonant frequency of the parallel arm resonator.

Therefore, the frequency of an attenuation pole on the low-frequency side of the pass band and the frequency of an attenuation pole on the high-frequency side of the pass band can be switched in accordance with switching of the switch element between a conductive state and a non-conductive state. Furthermore, sufficient attenuation can be secured in an attenuation band at a frequency lower than the resonant frequency of the parallel arm resonator in the case where the switch element is in a conductive state.

Furthermore, the high-frequency filter circuit may further include: a third impedance element, which is one of an inductor and a capacitor; and a switch element that is serially connected to the third impedance element; and a second series circuit comprising of the third impedance element and the switch element may be connected in parallel with the first impedance element.

Thus, the frequencies of attenuation poles and the number of attenuation poles can be finely adjusted by appropriately switching the switch elements of the first series circuit and second series circuit between a conductive state and a non-conductive state.

In addition, the high-frequency filter circuit may have a ladder filter structure comprising of at least two of the parallel arm circuits and at least one of the series arm circuits.

Furthermore, in each of the at least two parallel arm circuits, the first impedance element may be a capacitor and the second impedance element may be an inductor.

Furthermore, in each of the at least two parallel arm circuits, the first impedance element may be an inductor and the second impedance element may be a capacitor.

In addition, in each of some parallel arm circuits among the at least two parallel arm circuits, the first impedance element may be a capacitor and the second impedance element may be an inductor, and in each of the remaining parallel arm circuits, the first impedance element may be an inductor and the second impedance element may be a capacitor.

A high-frequency filter circuit according to another aspect includes: a series arm resonator connected between a first input/output terminal and a second input/output terminal; a parallel arm resonator connected between a node on a path that connects the first input/output terminal and the second input/output terminal, and ground; a first impedance element that is one of an inductor and a capacitor, and that is serially connected to the parallel arm resonator between the node and the ground; a second impedance element, which is the other of an inductor and a capacitor; and a switch element that is serially connected to the second impedance element. A first series circuit comprising of the second impedance element and the switch element is connected in parallel with the first impedance element.

In addition, a high-frequency front end circuit according to an aspect of the present disclosure includes: a plurality of high-frequency filter circuits including any of the high-frequency filter circuits described above; and a switch circuit that is provided in at least one of a stage prior to and a stage subsequent to the plurality of high-frequency filter circuits, and that has a plurality of selection terminals that are individually connected to the plurality of high-frequency filter circuits and a common terminal that is selectively connected to the plurality of selection terminals.

Due to this configuration, sufficient attenuation can be secured in an attenuation band at a low frequency in a high-frequency front end circuit that supports multiple bands.

In addition, a high-frequency front end circuit according to another aspect of the present disclosure includes: any of the high-frequency filter circuits described above; and a control unit that controls switching of the switch element between a conductive state and a non-conductive state.

A communication device according to an aspect of the present disclosure includes: an RF signal processing circuit that processes a high-frequency signal transmitted or received by an antenna element; and any of the high-frequency front end circuits described above that transmits the high-frequency signal between the antenna element and the RF signal processing circuit.

Due to this configuration, sufficient attenuation can be secured in an attenuation band at a low frequency in a communication device that supports multiple bands.

With the high-frequency filter circuit and so forth according to the present disclosure, sufficient attenuation can be secured in an attenuation band at a frequency lower than the resonant frequency of a parallel arm resonator.

BRIEF DESCRIPTION OF THE SEVERAL VIEWS OF THE DRAWINGS

FIG. 14D illustrates a graph depicting the bandpass characteristics of the filter according to embodiment 3.

DETAILED DESCRIPTION OF THE DISCLOSURE

Figure 1:
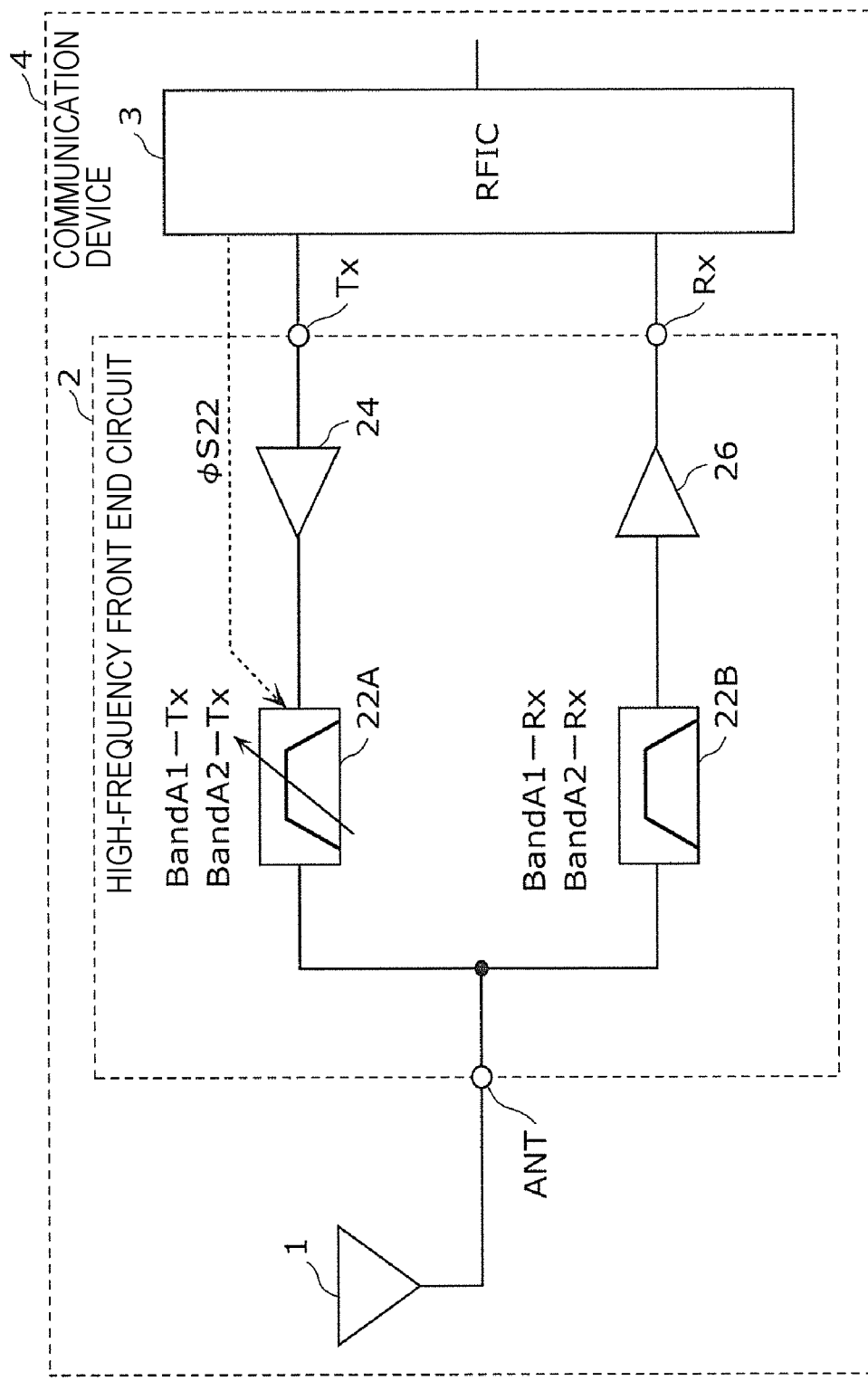
FIG. 1 is a configuration diagram of a communication device according to embodiment 1.

Hereafter, embodiments of the present disclosure will be described in detail using the examples and the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure. Constituent elements not described in the independent claims among constituent elements in the following embodiments are described as arbitrary constituent elements. In addition, the sizes of the constituent elements illustrated in the drawings and the ratios between the sizes are not necessarily strictly accurate. Furthermore, in the drawings, the parts of the configurations that are substantially the same as each other are denoted by the same symbols and the repeated description thereof may be omitted or simplified.

In addition, hereafter, "the low-frequency end of the pass band" means "the lowest frequency inside the pass band". Furthermore, "the high-frequency end of the pass band" means "the highest frequency inside the pass band". In addition, "the low-frequency side of the pass band" refers to "frequencies that are outside the pass band and lower than the pass band". Furthermore, "the high-frequency side of the pass band" refers to "frequencies that are outside the pass band and higher than the pass band". In addition, hereafter, "the side located at low frequencies" may be referred to as "the low-frequency side" and "the side located at high frequencies" may be referred to as "the high-frequency side".

Furthermore, hereafter, switch elements are described as ideal elements in which the impedance is infinite when the switch element is in a conductive state (on) and the impedance is zero when the switch element is in a non-conductive state (off). In reality, a switch element has parasitic components such as a capacitive component when the switch element is off, an inductance component when the switch element is on, and a resistive component, and therefore in reality slightly different characteristics will be obtained compared to those obtained when a switch element that is an ideal element is used.

Embodiment 1

1. Circuit Configuration of Communication Device

FIG. 1 is a configuration diagram of a communication device 4 according to embodiment 1. As illustrated in the diagram, the communication device 4 includes an antenna element 1, a high-frequency front end circuit 2, and a radio frequency integrated circuit (RFIC) 3. The communication device 4 is a cellular phone that supports multiple modes/ multiple bands, for example. The antenna element 1, the high-frequency front end circuit 2, and the RFIC 3 are arranged in a front end unit of the cellular phone, for example.

The antenna element 1 is an antenna that transmits and receives high-frequency signals and supports multiple bands in accordance with communication standards such as those of the third generation partnership project (3GPP), for example. The antenna element 1 does not need to support all of the bands of the communication device 4, and may support just the bands of a low frequency band group or a high frequency band group, for example. In addition, the antenna element 1 does not need to be built into the communication device 4.

The high-frequency front end circuit 2 is a circuit that transmits a high-frequency signal between the antenna element 1 and the RFIC 3. Specifically, the high-frequency front end circuit 2 transmits a high-frequency signal outputted from the RFIC 3 (in this case, high-frequency transmission signal) to the antenna element 1 via a transmission-side signal path that connects a transmission terminal Tx and an antenna terminal ANT. In addition, the high-frequency front end circuit 2 transmits a high-frequency signal received by the antenna element 1 (in this case, high-frequency reception signal) to the RFIC 3 via a reception-side signal path that connects the antenna terminal ANT and a reception terminal Rx. The detailed configuration of the high-frequency front end circuit 2 will be described later.

The RFIC 3 is an RF signal processing circuit that processes high-frequency signals transmitted and received by the antenna element 1. Specifically, the RFIC 3 performs signal processing using down conversion and so forth on a high-frequency signal inputted from the antenna element 1 via the reception-side signal path of the high-frequency front end circuit 2 (in this case, high-frequency reception signal), and outputs a reception signal generated through this signal processing to a baseband signal processing circuit (not illustrated). In addition, the RFIC 3 performs signal processing using up conversion and so forth on a high-frequency signal inputted from the base band signal processing circuit, and outputs a high-frequency signal generated through this signal processing (in this case, high-frequency transmission signal) to the transmission-side signal path of the high-frequency front end circuit 2.

Furthermore, in this embodiment, the RFIC 3 also functions as a control unit (such as a controller, processor, integrated circuit, or the like) that controls switching of the switches of the high-frequency front end circuit 2 between a conductive state (on) and a non-conductive state (off) on the basis of the frequency band (band) to be used. Specifically, the RFIC 3 controls switching of each switch between on and off using a control signal ϕS22.

2. Configuration of High-Frequency Front End Circuit

Next, the detailed configuration of the high-frequency front end circuit 2 will be described.

As illustrated in FIG. 1, the high-frequency front end circuit 2 includes filters 22A and 22B, a transmission amplification circuit 24, and a reception amplification circuit 26.

The filter 22A is a tunable filter that is a high-frequency filter circuit having a variable frequency function. Specifically, the pass band of the filter 22A can be switched to a first pass band or a second pass band. In other words, the filter 22A can be switched between a first bandpass characteristic and a second bandpass characteristic, which have different pass bands from each other. In this embodiment, the filter 22A is a transmission filter in which the first pass band is a Band A1 transmission band and the second pass band is a Band A2 transmission band, and the filter 22A is provided on the transmission-side signal path. The detailed configuration of the filter 22A will be described later. In addition, the first pass band and the second pass band are not limited to these examples, and it is sufficient that the first pass band and the second pass band be bands that are different from each other. Here, the meaning of "bands that are different from each other" is not limited to a case in which the bands are completely separated from each other and also includes a case in which the bands partially overlap each other.

The filter 22B is a fixed filter that is high-frequency filter circuit that does not have a variable frequency function. In this embodiment, the filter 22B is a reception filter in which the pass bands are Band A1 and Band A2 reception bands, and the filter 22B is provided on the reception-side signal path. The filter 22B may also be a tunable filter in which the pass band can be switched similarly to the case of the filter 22A.

The transmission amplification circuit 24 is a power amplifier that amplifies the power of a high-frequency transmission signal outputted from the RFIC 3. In this embodiment, the transmission amplification circuit 24 is provided between the filter 22A and the transmission terminal Tx.

The reception amplification circuit 26 is a low-noise amplifier that amplifies the power of a high-frequency reception signal received by the antenna element 1. In this embodiment, the reception amplification circuit 26 is provided between the filter 22B and the reception terminal Rx.

The thus-configured high-frequency front end circuit 2 appropriately switches the pass band of the filter 22A and transmits a high-frequency signal in accordance with the control signal ϕS22 from a control unit (RFIC 3 in this embodiment).

In other words, the frequency of the pass band and the frequency of an attenuation pole of the filter 22A can be switched by switching a switch element, which will be described later, inside the filter 22A between on and off in accordance with the control signal ϕS22 from the control unit.

For example, the control unit sets the switch element inside the filter 22A to one of on and off in an environment in which Band A1 is used and sets the switch element to the other one of on and off in an environment in which Band A2 is used. That is, either one of on and off is selected for the switch element inside the filter 22A in a certain environment, and the selection of on or off is fixed (not changed) in that environment.

3. Configuration of Filter (Tunable Filter)

Next, the detailed configuration of the filter 22A will be described.

Figure 2:
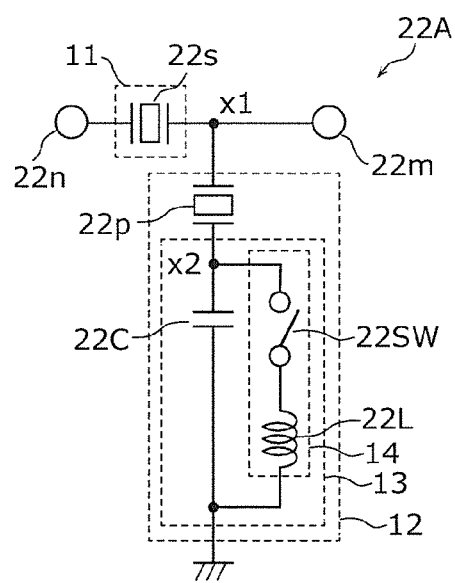
FIG. 2 is a circuit configuration diagram of a filter according to embodiment 1.

FIG. 2 is a circuit configuration diagram of the filter 22A according to embodiment 1. The filter 22A illustrated in the figure includes a series arm resonator 22s, a parallel arm resonator 22p, a switch 22SW, a capacitor 22C, and an inductor 22L.

The series arm resonator 22s is connected between an input/output terminal 22m (first input/output terminal) and an input/output terminal 22n (second input/output terminal). That is, the series arm resonator 22s is a resonator that is provided in a series arm that connects the input/output terminal 22m and the input/output terminal 22n. In this embodiment, the series arm resonator 22s forms a series arm circuit 11 that is connected between the input/output terminal 22m (first input/output terminal) and the input/output terminal 22n (second input/output terminal).

The series arm circuit 11 is not limited to this configuration, and may instead be a resonance circuit formed of a plurality of resonators such as longitudinally coupled resonators. Furthermore, the series arm circuit 11 is not limited to being a resonance circuit, and may be an impedance element such as an inductor or a capacitor.

The parallel arm resonator 22p is connected between a node (node x1 in FIG. 2) on a path that connects the input/output terminal 22m and the input/output terminal 22n, and the ground (reference terminal). That is, the parallel arm resonator 22p is a resonator that is provided in a parallel arm that connects the series arm and the ground.

The capacitor 22C is a first impedance element that is serially connected to the parallel arm resonator 22p between the parallel arm resonator 22p and ground. That is, one terminal of the capacitor 22C is connected to a ground-side terminal of the parallel arm resonator 22p and the other terminal of the capacitor 22C is connected to ground.

For example, the switch 22SW is a single pole single throw (SPST) switch element, and one terminal of the switch 22SW is connected to a connection node (node x2 in FIG. 2) between the parallel arm resonator 22p and the capacitor 22C (first impedance element) and the other terminal of the switch 22SW is connected to one terminal of the inductor 22L (second impedance element). The switch 22SW connects the connection node and the inductor 22L to each other or disconnects the connection node and the inductor 22L from each other by being switched on or off in accordance with the control signal φS22 from the control unit (RFIC 3 in this embodiment).

For example, the switch 22SW may be a field effect transistor (FET) switch composed of GaAs or a complementary metal oxide semiconductor (CMOS) or may be a diode switch. Since this kind of switch utilizing a semiconductor is compact, the filter 22A can be reduced in size.

The inductor 22L is the second impedance element, and the one terminal of the inductor 22L is connected to the other terminal of the switch 22SW and the other terminal of the inductor 22L is connected to ground.

That is, the switch 22SW and the inductor 22L, which are connected in series with each other, are connected in parallel with the capacitor 22C. Therefore, the parallel arm resonator 22p is serially connected to the capacitor 22C when the switch 22SW is off, and the parallel arm resonator 22p is serially connected to an LC parallel resonance circuit formed of the capacitor 22C and the inductor 22L when the switch 22SW is on.

In this case, the variable frequency widths of the pass band and attenuation poles of the filter 22A depend on the constants of the capacitor 22C and the inductor 22L, and for example the frequency variable widths increase toward the high-frequency side as the constant of the capacitor 22C becomes smaller and the frequency variable widths increase toward the low-frequency side as the constant of the inductor 22L becomes larger. Therefore, the constants of the capacitor 22C and the inductor 22L can be appropriately determined upon in accordance with the frequency specifications required for the filter 22A.

In addition, the capacitor 22C may be a variable capacitor such as a varicap or a digitally tunable capacitor (DTC). Furthermore, the inductor 22L may be a variable inductor that uses a micro-electromechanical system (MEMS). In this way, it is possible to finely adjust the frequency variable width. In addition, just one of the capacitor 22C and the inductor 22L may be a variable impedance element (variable capacitor or variable inductor).

The parallel arm resonator 22p, the capacitor 22C, the switch 22SW, and the inductor 22L form a parallel arm circuit 12 that is connected between the node x1 on the path (on the series arm) that connects the input/output terminal 22m and the input/output terminal 22n, and the ground. In other words, the parallel arm circuit 12 is formed of the parallel arm resonator 22p, which is provided in one parallel arm that connects the series arm and the ground and is connected to any 1 node x1 on the series arm, as well as the impedance element, the switch element, and so on that are connected to the series arm via the parallel arm resonator 22p.

In other words, the parallel arm circuit 12 includes the parallel arm resonator 22p and an impedance circuit 13 that is serially connected to the parallel arm resonator 22p. Here, the impedance circuit 13 includes the capacitor 22C, which is one first impedance element that is one of an inductor and a capacitor, the inductor 22L, which is one second impedance element that is the other of an inductor and a capacitor, and the switch 22SW that is serially connected to the inductor 22L. In addition, a first series circuit 14, which is formed of the inductor 22L and the switch 22SW, is connected in parallel with the capacitor 22C.

The thus-configured filter 22A has a ladder filter structure formed of one series arm circuit 11 and one parallel arm circuit 12.

Regarding the composite impedance of the parallel arm circuit 12, the resonant frequency, which is the frequency at which the impedance is smallest, is shifted toward the low-frequency side or the high-frequency side in accordance with the switch 22SW being switched between on and off. This will be described later along with the bandpass characteristic of the filter 22A.

Regarding the order in which the impedance circuit 13 and the parallel arm resonator 22p are connected to each other, in this embodiment, the impedance circuit 13 is connected between the parallel arm resonator 22p and the ground. That is, the parallel arm resonator 22p is connected on the node x1 side and the impedance circuit 13 is connected on the ground side. However, the connection order is not particularly limited and may be reversed. However, when this connection order is reversed, the loss inside the pass band of the filter 22A is degraded. In addition, in the case where the parallel arm resonator 22p is formed on a resonator chip (package) together with another elastic wave resonator, an increase in chip size is incurred due to the increase in the number of terminals of the chip. Therefore, it is preferable to connect the impedance circuit 13 and the parallel arm resonator 22p in the order described in this embodiment from the viewpoint of the filter characteristics and the size reduction.

Here, in this embodiment, the resonators that form the filter 22A (series arm resonator 22s and parallel arm resonator 22p) are resonators that use surface acoustic waves. Consequently, the filter 22A can be formed using interdigital transducer (IDT) electrodes formed on a piezoelectric substrate, and therefore a compact low-profile filter circuit can be realized that has a bandpass characteristic with a high degree of steepness. Next, the structure of a surface acoustic wave resonator will be described.

Figure 3:
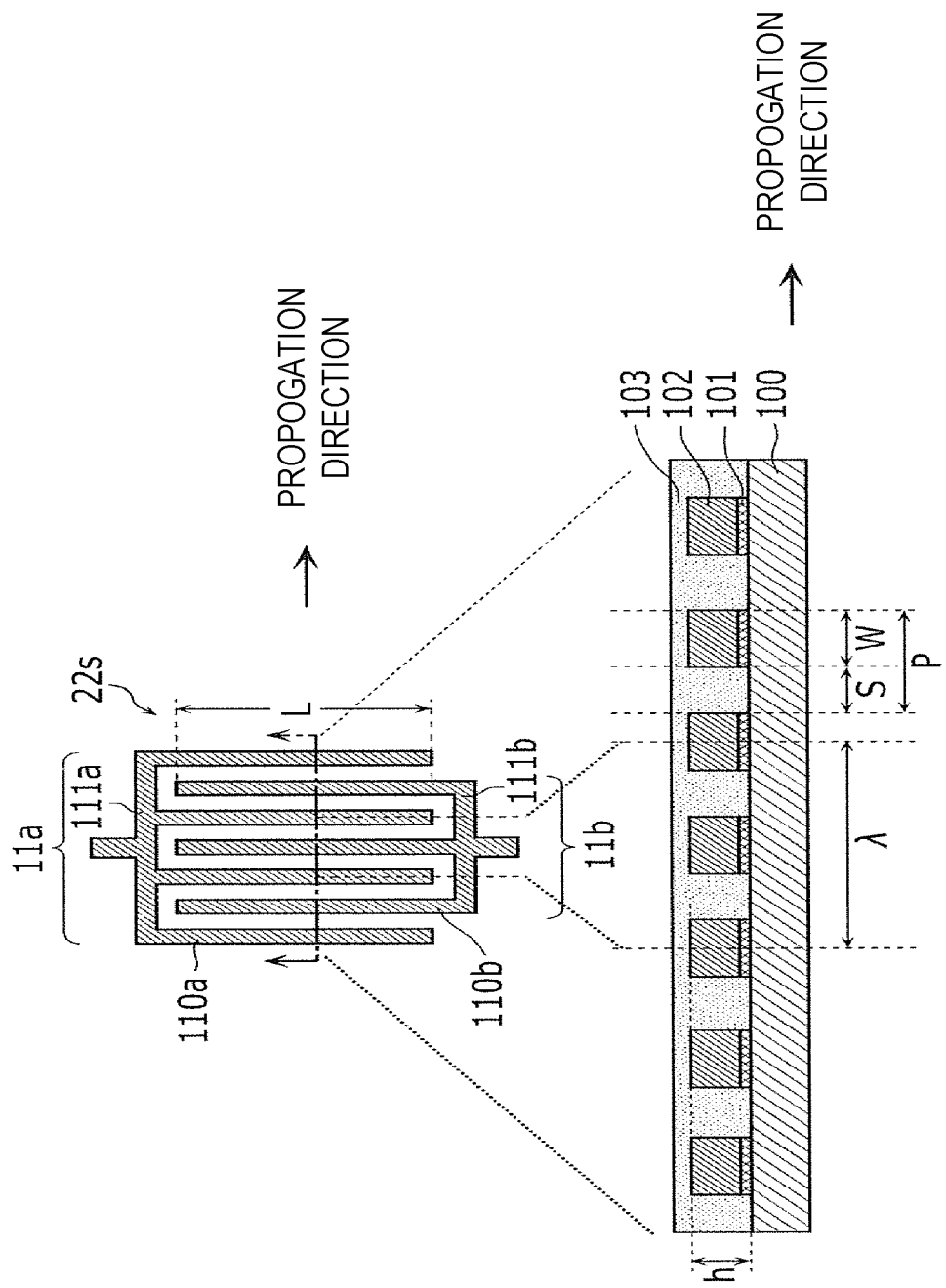
FIG. 3 depicts examples of a plan view and a sectional view schematically illustrating each resonator of the filter according to embodiment 1.

FIG. 3 depicts examples of a plan view and a sectional view schematically illustrating each resonator of the filter 22A according to embodiment 1. In the figure, a schematic plan view and a schematic sectional view illustrating the structure of the series arm resonator 22s among the resonators forming the filter 22A are exemplified. The series arm resonator illustrated in FIG. 3 is for the purpose of explaining the typical structure of the plurality of resonators, and the number, length, and so forth of the electrode fingers forming the electrodes are not limited to those illustrated in this example.

Each resonator of the filter 22A is formed of a piezoelectric substrate 100 and IDT electrodes 11a and 11b having a comb-like shape.

As illustrated in the plan view of FIG. 3, the pair of IDT electrodes 11a and 11b, which face each other, are formed on the piezoelectric substrate 100. The IDT electrode 11a is formed of a plurality of electrode fingers 110a, which are parallel to each other, and a busbar electrode 111a that connects the plurality of electrode fingers 110a to each other. Furthermore, the IDT electrode 11b is formed of a plurality of electrode fingers 110b, which are parallel to each other, and a busbar electrode 111b that connects the plurality of electrode fingers 110b to each other. The plurality of electrode fingers 110a and 110b are formed so as to extend in a direction perpendicular to a propagation direction of surface acoustic waves, and are formed in a periodic manner in the propagation direction.

In the thus-configured resonator, the wavelength of an excited surface acoustic wave is defined by the design parameters and so forth of the IDT electrodes 11a and 11b. Hereafter, the design parameters of the IDT electrodes 11a and 11b will be described.

The wavelength of the surface acoustic wave is determined by a repeating period λ of the electrode fingers 110a and 110b connected to one busbar electrode among the plurality of electrode fingers 110a and 110b. Furthermore, an electrode finger pitch (pitch of plurality of electrode fingers 110a and 110b, that is, electrode finger period) P is ½ the repeating period λ, and is defined as P=(W+S), where W represents the line width of the electrode fingers 110a and 110b and S represents the space width between adjacent electrode fingers 110a and 110b. In addition, an electrode duty (duty ratio) is a line width occupation ratio of the plurality of electrode fingers 110a and 110b, and is defined by the ratio of the line width of the plurality of electrode fingers 110a with respect to the sum of the line width and the space width, that is, W/(W+S). In other words, the electrode duty is defined by the ratio of the width of the plurality of electrode fingers 110a to the electrode finger pitch (pitch of plurality of electrode fingers 110a), that is, W/P. In addition, "number of pairs" refers to the number of electrode fingers 110a that form pairs, and is roughly half of the total number of electrode fingers 110a. For example, M=2N+1 is satisfied, where N represents the number of pairs and M represents the total number of electrode fingers 110a. In addition, an electrostatic capacitance $C_0$ of a resonator is expressed by formula 1 below.

[Math 1]

$$\text{ELECTROSTATIC CAPACITANCE } C_0 = \frac{\varepsilon_0 \cdot \varepsilon_r \cdot \text{NUMBER OF PAIRS} \cdot \text{INTERSECTION WIDTH}}{2 \cdot (1 - \text{ELECTRODE DUTY})} \quad (1)$$

$\varepsilon_0$ is the dielectric constant of a vacuum and $\varepsilon r$ is the dielectric constant of the piezoelectric substrate 100.

Furthermore, as illustrated in the sectional view of FIG. 3, the IDT electrodes 11a and 11b formed of the plurality of electrode fingers 110a and 110b and the busbar electrodes 111a and 111b have a multilayer structure comprising of an adhesive layer 101 and a main electrode layer 102.

The adhesive layer 101 is a layer for improving adhesion between the piezoelectric substrate 100 and the main electrode layer 102, and for example Ti is used as the material thereof. The film thickness of the adhesive layer 101 is 12 nm, for example.

For example, Al containing 1% Cu is used as the material of the main electrode layer 102. The film thickness of the main electrode layer 102 is 162 nm, for example.

A protective layer 103 is formed so as to cover the IDT electrodes 11a and 11b. The purpose of the protective layer 103 is to protect the main electrode layer 102 from the outside environment, adjust the frequency-temperature characteristic, increase moisture resistance, and so forth, and for example is a film having silicon dioxide as a main component.

The materials forming the adhesive layer 101, the main electrode layer 102, and the protective layer 103 are not limited to the above-described materials. Furthermore, the IDT electrodes 11a and 11b do not need to have the above-described multilayer structure. For example, the IDT electrodes 11a and 11b may be formed of a metal such as Ti, Al, Cu, Pt, Au, Ag, or Pd or an alloy of such a metal, and may be formed of a plurality of multilayer bodies composed of such metals or alloys. In addition, the protective layer 103 does not have to be formed.

For example, the piezoelectric substrate 100 is composed of a 50° Y cut X propagation $LiTaO_3$ piezoelectric single crystal or a piezoelectric ceramic (lithium tantalate single crystal cut along the plane having a normal line that is an axis rotated 50° from a Y axis around an X axis, a ceramic, or a single crystal or ceramic for which the surface acoustic waves propagate in the X axis direction). In addition, in this embodiment, a 50° Y cut X propagation $LiTaO_3$ single crystal is exemplified as the piezoelectric substrate 100, but the single crystal material that forms the piezoelectric substrate 100 is not limited to $LiTaO_3$ and the cut angle of the single crystal material is not limited to the angle in this example. Furthermore, the piezoelectric substrate 100 may be a piezoelectric substrate composed of a $LiTaO_3$ piezoelectric single crystal, a $LiNbTaO_3$ piezoelectric single crystal or a piezoelectric ceramic, or may be a substrate having these piezoelectric properties in part thereof.

The structure of each resonator of the filter 22A is not limited to the structure illustrated in FIG. 3. For example, the IDT electrodes 11a and 11b may have a metal film multi-layer structure or may be composed a metal film single layer.

Furthermore, each resonator of the filter 22A may be a surface acoustic wave resonator or may be a resonator that uses BAWs. That is, it is sufficient that each resonator have a "resonant frequency", which is a singular point where the impedance is minimum (ideally, a point where the impedance is 0) and an "anti-resonant frequency", which is a singular point where the impedance is maximum (ideally a point where the impedance is infinite).

4. Bandpass Characteristics of Filter (Tunable Filter)

The bandpass characteristic of the filter 22A configured as described above can be switched between a first bandpass characteristic and a second bandpass characteristic by switching the switch 22SW between on and off in accordance with the control signal φS22. Accordingly, hereafter, the bandpass characteristic of the filter 22A will be described in conjunction with the states of the switch 22SW using two examples (example 1 and example 2) of the filter 22A.

Specifically, as example 1, a case in which a frequency fz at which the impedance of the impedance circuit 13 is maximum when the switch 22SW is on is higher than a resonant frequency frp of the parallel arm resonator 22p (fz>frp) will be described. As example 2, a case in which the frequency fz at which the impedance of the impedance circuit 13 is maximum when the switch 22SW is on is lower than the resonant frequency frp of the parallel arm resonator 22p (fz<frp) will be described.

Here, the frequency fz, at which the impedance of the LC parallel resonance circuit is maximum, is expressed by $fz=1/(2\pi\sqrt{(LC)})$, where C is the capacitance of the capacitor 22C and L is the inductance of the inductor 22L.

The circuit constants of the elements in example 1 and the circuit constants of the elements in example 2 are the same as each other except for those of the capacitor 22C and the inductor 22L, which have different values from each other, and specifically are as listed in Table 1 below.

TABLE 1

| | SERIES ARM RESONATOR 22s | PARALLEL ARM RESONATOR 22p |
|---|---|---|
| RESONANT FREQUENCY fr [MHz] | 1500 | 1450 |
| ANTI-RESONANT FREQUENCY fa [MHz] | 1545 | 1494 |
| ELECTROSTATIC CAPACITANCE Co [pF] | 3.0 | 3.0 |

| | INDUCTOR 22L | |
|---|---|---|
| | EXAMPLE 1 | EXAMPLE 2 |
| INDUCTANCE [nH] | 1.5 | 2.0 |

| | CAPACITOR 22C | |
|---|---|---|
| | EXAMPLE 1 | EXAMPLE 2 |
| CAPACITANCE [pF] | 3.0 | 7.0 |

Figure 4A:
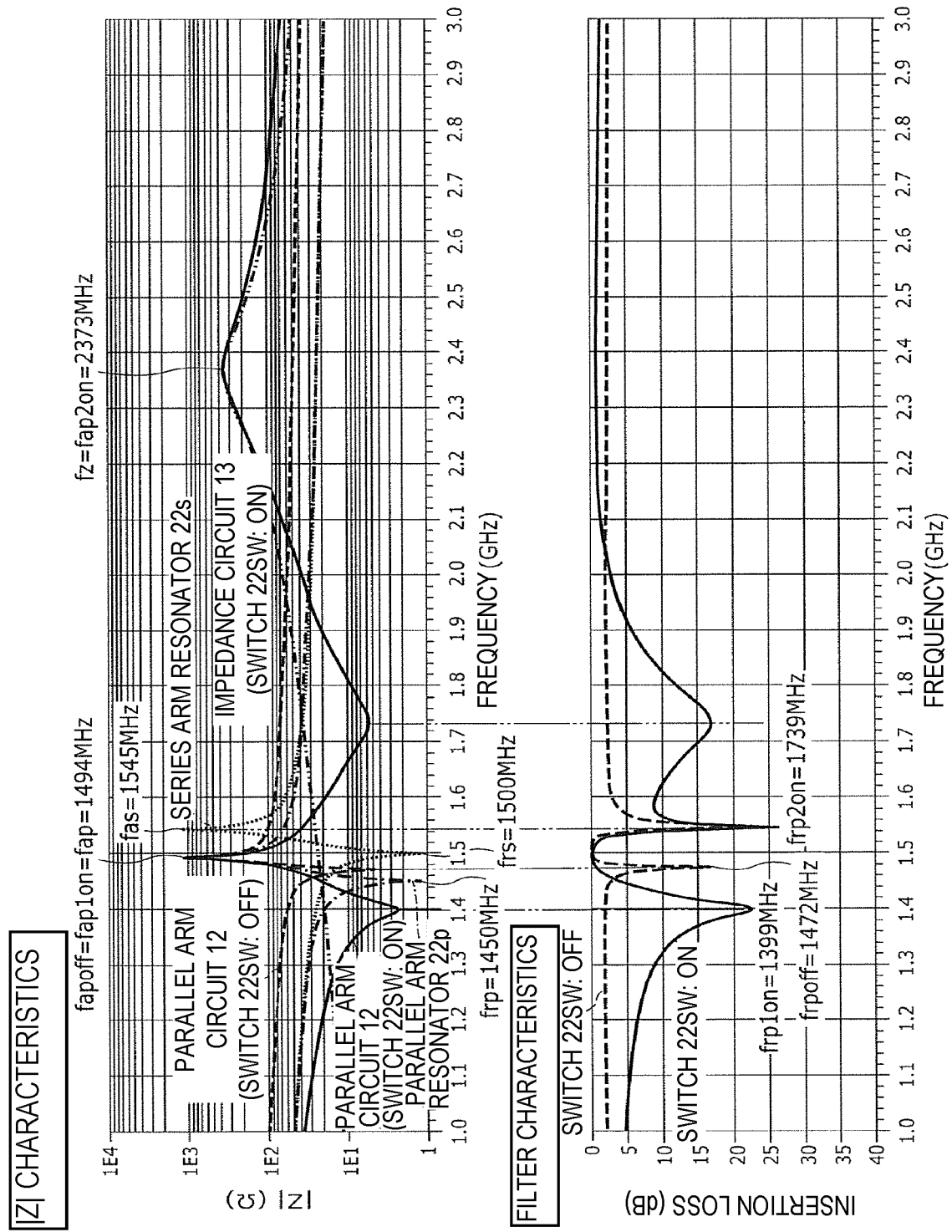
FIG. 4A illustrates graphs depicting the impedance characteristics related to the filter according to example 1 and the bandpass characteristics of the filter according to example 1.
Figure 4B:
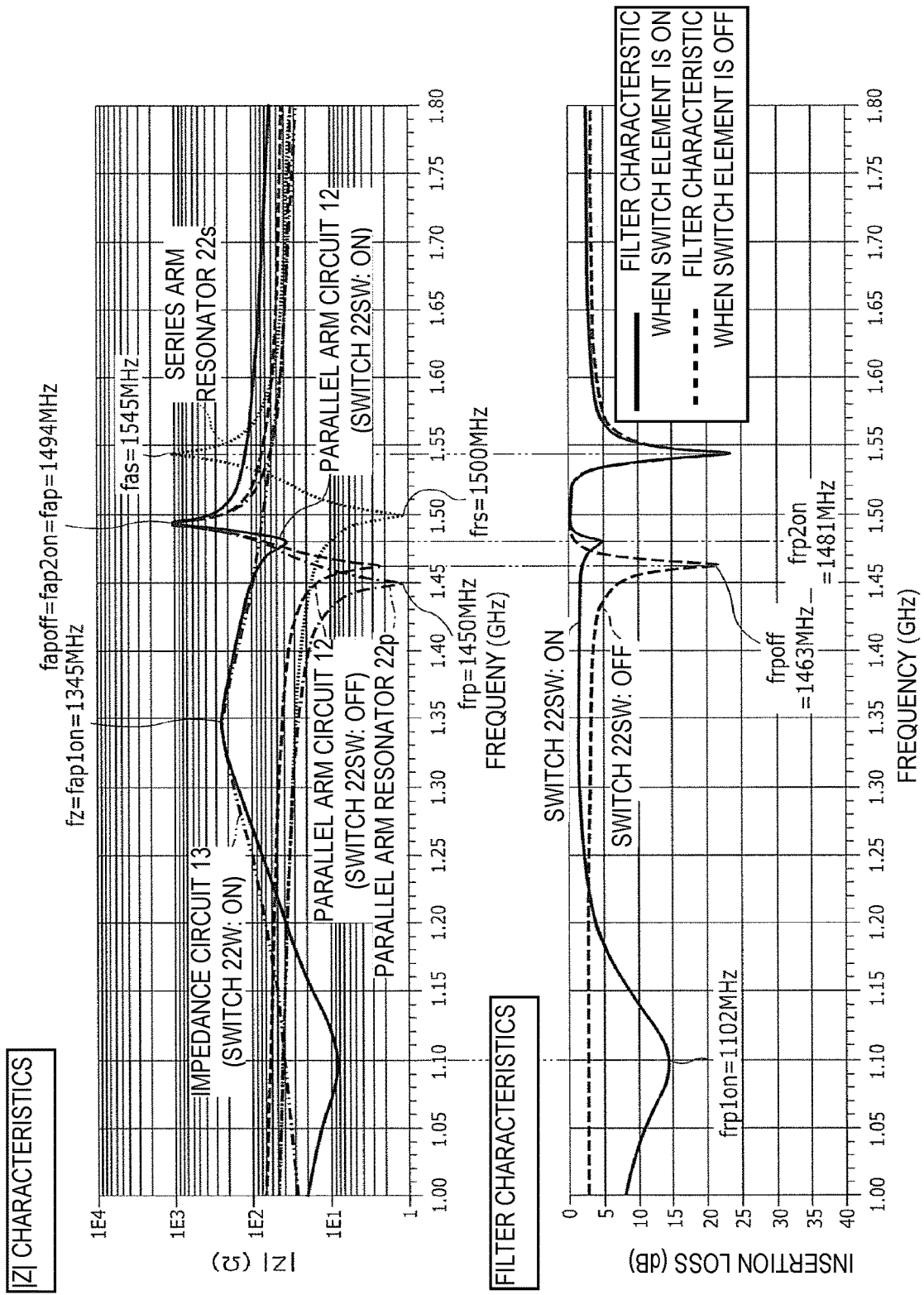
FIG. 4B illustrates graphs depicting the impedance characteristics related to a filter according to example 2 and the bandpass characteristics of the filter according to example 2.

FIG. 4A illustrates graphs depicting impedance characteristics (|Z| characteristic) related to the filter according to example 1 and the bandpass characteristics (that is, frequency-insertion loss characteristics) of the filter according to example 1. FIG. 4B illustrates graphs depicting impedance characteristics related to the filter according to example 2 and the bandpass characteristics of the filter according to example 2.

In the upper part of each figure, the following five impedance characteristics are illustrated.

(I-i) Impedance characteristic of parallel arm circuit 12 when switch 22SW is on ("PARALLEL ARM CIRCUIT 12 (SWITCH 22SW: ON)" in the figures)

(I-ii) Impedance characteristic of parallel arm circuit 12 when switch 22SW is off ("PARALLEL ARM CIRCUIT 12 (SWITCH 22SW: OFF)" in the figures)

(I-iii) Impedance characteristic of impedance circuit 13 when switch 22SW is on ("IMPEDANCE CIRCUIT 13 (SWITCH 22SW: ON)" in the figures)

(I-iv) Impedance characteristic of series arm resonator 22s, that is, impedance characteristic of series arm circuit 11 ("SERIES ARM RESONATOR 22s" in the figures)

(I-v) Impedance characteristic of parallel arm resonator 22p ("PARALLEL ARM RESONATOR 22p" in the figures)

Furthermore, in the lower part of each figure, the following two bandpass characteristics are illustrated.

(II-i) Bandpass characteristic of filter 22A when switch 22SW is on ("SWITCH 22SW: ON" in the figures)

(II-ii) Bandpass characteristic of filter 22A when switch 22SW is off ("SWITCH 22SW: OFF" in the figures)

First, the impedance characteristic of a resonator as a standalone unit will be described. Hereafter, for the sake of convenience, the frequency of a singular point where the impedance is minimum (ideally, the point where impedance is 0) will be referred to as a "resonant frequency" not only in the case of the impedance of a resonator as a standalone unit but also in the case of the composite impedance of a resonator and another circuit element. In addition, the frequency of a singular point where the impedance is maximum (ideally, the point where impedance is infinite) will be referred to as an "anti-resonant frequency".

As illustrated in FIGS. 4A and 4B, the series arm resonator 22s and the parallel arm resonator 22p have the following impedance characteristics. Specifically, the parallel arm resonator 22p has a resonant frequency frp and an anti-resonant frequency fap (at this time, frp<fap is satisfied). The series arm resonator 22s has a resonant frequency frs and an anti-resonant frequency fas (at this time, frs<fas and frp<frs are satisfied).

First, the impedance circuit 13 in the case where the switch 22SW is off is a circuit comprising of only the capacitor 22C, and therefore the impedance circuit 13 has a capacitive impedance. At this time, the parallel arm circuit 12 is a series circuit comprising of the parallel arm resonator 22p and the capacitor 22C, and as illustrated in FIGS. 4A and 4B, the parallel arm circuit 12 has one resonant frequency frpoff and one anti-resonant frequency faoff.

Specifically, at this time, as illustrated in FIGS. 4A and 4B, the resonant frequency frpoff of the parallel arm circuit 12 is higher than the resonant frequency frp of the parallel arm resonator 22p. In relation to this, the resonant frequency frpoff increases as the capacitance of the capacitor 22C becomes smaller. In addition, at this time, the anti-resonant frequency faoff of the parallel arm circuit 12 is substantially equal to the anti-resonant frequency fap of the parallel arm resonator 22p.

Two frequencies, that is, the resonant frequency frpoff and the anti-resonant frequency faoff of the parallel arm circuit 12 when the switch 22SW is off have been described above, and the details of the principles behind these frequencies will be described later using a resonator equivalent circuit model.

When configuring a ladder band pass filter, the anti-resonant frequency fapoff of the parallel arm circuit 12 and the resonant frequency frs of the series arm resonator 22s are made to be close to each other. As a result, when the switch 22SW is off, an attenuation pole is formed at the resonant frequency frpoff at which the impedance of the parallel arm circuit 12 approaches 0, and a low-frequency-side stop band is formed at frequencies in the vicinity of this attenuation pole. In addition, when the frequency increases from this point, the impedance of the parallel arm circuit becomes higher in the vicinity of the anti-resonant frequency fapoff, and the impedance of the series arm resonator 22s approaches 0 in the vicinity of the resonant frequency frs. As a result, a signal pass band is formed for a signal path (series arm) from the input/output terminal 22m to the input/output terminal 22n in the vicinity of the anti-resonant frequency fapoff and the resonant frequency frs. Furthermore, as the frequency increases further, an attenuation pole is formed at the anti-resonant frequency fas at which the impedance of the series arm resonator 22s is maximum, and a high-frequency-side stop band is formed at frequencies in the vicinity of this attenuation pole.

Therefore, when the switch 22SW is off, the filters according to example 1 and example 2 have the first bandpass characteristic ("SWITCH 22SW: OFF" in the lower parts of FIGS. 4A and 4B) in which the pass band is defined by the anti-resonant frequency fapoff of the parallel arm circuit 12 and the resonant frequency frs of the series arm resonator 22s, a pole (attenuation pole) on the low-frequency side of the pass band is defined by the resonant frequency frpoff of the parallel arm circuit 12, and a pole (attenuation pole) on the high-frequency side of the pass band is defined by the anti-resonant frequency fas of the parallel arm circuit 12.

Here, in example 1 and example 2, the resonant frequency frpoff of the parallel arm circuit 12 is higher than the resonant frequency frp of the parallel arm resonator 22p. Therefore, in the first bandpass characteristic, the pole on the low-frequency side of the pass band is shifted toward the high-frequency side compared with the bandpass characteristic of a basic ladder filter structure formed of only the series arm resonator 22s and the parallel arm resonator 22p. Therefore, with the filters according to example 1 and example 2, when the switch 22SW is off, the low-frequency end of the pass band is shifted toward the high-frequency side and the pass band width can be made smaller compared with the basic ladder filter structure.

On the other hand, when the switch 22SW is on, the impedance circuit 13 is an LC parallel resonance circuit that is a parallel circuit comprising of the capacitor 22C and the inductor 22L. Therefore, the impedance circuit 13 has the frequency fz at which the impedance is maximum, has an inductive impedance at frequencies lower than the frequency fz, and has a capacitive impedance at frequencies higher than the frequency fz.

That is, the impedance circuit 13 has an inductive impedance at the resonant frequency frp of the parallel arm resonator 22p in the case where the frequency fz is higher than the resonant frequency frp of the parallel arm resonator 22p (fz>frp) as in example 1. In contrast, the impedance circuit 13 has a capacitive impedance at the resonant frequency frp of the parallel arm resonator 22p in the case where the frequency fz is lower than the resonant frequency frp of the parallel arm resonator 22p (fz<frp) as in example 2.

At this time, the parallel arm circuit 12 is a series circuit comprising of the parallel arm resonator 22p and the LC parallel resonance circuit, and therefore, as illustrated in FIGS. 4A and 4B, the parallel arm circuit 12 has two resonant frequencies frp1on and frp2on and two anti-resonant frequencies fa1on and fa2on.

In relation to this, in both example 1 and example 2, among the two resonant frequencies frp1on and frp2on, the resonant frequency frp1on, which is on the low-frequency side, is lower than the resonant frequency frp of the parallel arm resonator 22p, and the resonant frequency frp2on, which is on the high-frequency side, is higher than the resonant frequency frp of the parallel arm resonator 22p. Specifically, as illustrated in FIG. 4A, in example 1, the resonant frequency frp1on on the low-frequency side is located close to the resonant frequency frp of the parallel arm resonator 22p. On the other hand, as illustrated in FIG. 4B, in example 2, the resonant frequency frp2on on the high-frequency side is located close to the resonant frequency frp of the parallel arm resonator 22p.

In addition, at this time, as illustrated in FIG. 4A, in example 1, a low-frequency-side anti-resonant frequency fap1on of the parallel arm circuit 12 substantially coincides with the anti-resonant frequency fap of the parallel arm resonator 22p. On the other hand, as illustrated in FIG. 4B, in example 2, a high-frequency-side anti-resonant frequency fap2on of the parallel arm circuit 12 substantially coincides with the anti-resonant frequency fap of the parallel arm resonator 22p.

The two resonant frequencies frp1on and frp2on and the two anti-resonant frequencies fap1on and fap2on of the parallel arm circuit 12 when the switch 22SW is on have been described above, and the details of the principles behind these frequencies will be described later using a resonator equivalent circuit model.

From the above description, when the switch 22SW is on, the filter according to example 1 has the second bandpass characteristic ("SWITCH 22SW: ON" in the lower part of FIG. 4A) in which the pass band is defined by the low-frequency side anti-resonant frequency fap1on of the parallel arm circuit 12 and the resonant frequency frs of the series arm resonator 22s, a pole (attenuation pole) on the low-frequency side of the pass band is defined by the low-frequency side resonant frequency frp1on of the parallel arm circuit 12, and t2o poles (attenuation poles) on the high-frequency side of the pass band are defined by the anti-resonant frequency fas of the series arm resonator 22s and the high-frequency side resonant frequency frp2on of the parallel arm circuit 12.

Here, in example 1, the low-frequency-side resonant frequency frp1on of the parallel arm circuit 12 is lower than the resonant frequency frp of the parallel arm resonator 22p. Therefore, in the second bandpass characteristic, the pole on the low-frequency side of the pass band is shifted toward the low-frequency side compared with the bandpass characteristic of the basic ladder filter structure comprising of only the series arm resonator 22s and the parallel arm resonator 22p. Therefore, with the filter according to example 1, when the switch 22SW is on, the low-frequency end of the pass band is shifted toward the low-frequency side and the pass band width can be made larger compared with the basic ladder filter structure. In addition, in this case, since the resonant frequency frp1on can be arranged on the low-frequency side of the resonant frequency frp of the parallel arm resonator 22p, sufficient attenuation can be secured in an attenuation band at a lower frequency than the resonant frequency frp of the parallel arm resonator 22p.

Furthermore, when the switch 22SW is on, the filter according to example 2 has the second bandpass characteristic ("SWITCH 22SW: ON" in the lower part of FIG. 4B) in which the pass band is defined by high-frequency-side anti-resonant frequency fap2on of the parallel arm circuit 12 and the resonant frequency frs of the series arm resonator 22s, two poles (attenuation poles) on the low-frequency side of the pass band are defined by the two resonant frequencies frp1on and frp2on of the parallel arm circuit 12, and a pole (attenuation pole) on the high-frequency side of the pass band is defined by the anti-resonant frequency fas of the series arm resonator 22s.

Here, in example 2, the high-frequency-side resonant frequency frp2on of the parallel arm circuit 12 is higher than the resonant frequency frp of the parallel arm resonator 22p. Therefore, in the second bandpass characteristic, the low-frequency side of the pass band is shifted toward the high-frequency side compared with the bandpass characteristic of the basic ladder filter structure formed of only the series arm resonator 22s and the parallel arm resonator 22p. Therefore, with the filter according to example 2, when the switch 22SW is off, the low-frequency end of the pass band is shifted toward the high-frequency side and the pass band width can be made smaller compared with the basic ladder filter structure. In addition, in this case, since the resonant frequency frp1on can be arranged on the low-frequency side of the resonant frequency frp of the parallel arm resonator 22p, sufficient attenuation can be secured in an attenuation band at a lower frequency than the resonant frequency frp of the parallel arm resonator 22p.

5. Explanation of Principles 1 Based On Resonance Analysis

Next, the principles that enable the resonant and anti-resonant frequencies of the parallel arm circuit 12 described above to be obtained will be described using the analysis (resonance analysis) of the impedance characteristics (resonance characteristics) using an equivalent circuit model of a resonator. Hereafter, a resistance component for equalizing the Q value of a resonator is omitted and the principles are explained using an equivalent circuit of an ideal resonator.

[5.1 Resonator as Standalone Unit]

First, the resonance characteristic of a resonator as a standalone unit will be described.

Figure 5A:
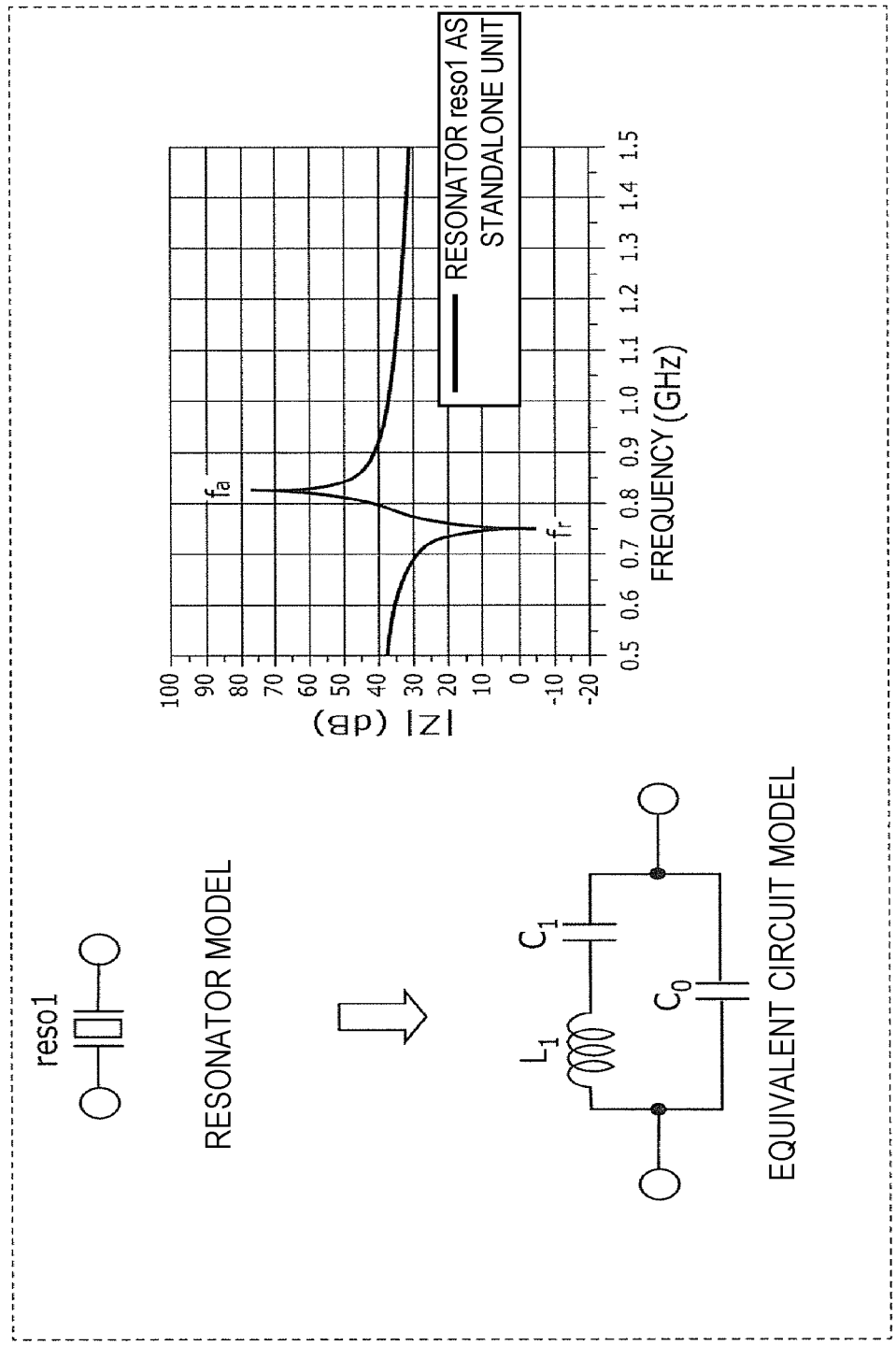
FIG. 5A is a diagram illustrating an equivalent circuit model of one resonator and the resonance characteristics thereof.

FIG. 5A is a diagram illustrating an equivalent circuit model of one resonator and the resonance characteristics thereof. As illustrated in the figure, a resonator resol can be represented as a circuit obtained by forming a circuit by connecting a capacitor $C_1$ and an inductor $L_1$ in series with each other, and then connecting a capacitor $C_0$ in parallel with the circuit in which the capacitor $C_1$ and the inductor $L_1$ are connected in series with each other. Here, the capacitor $C_0$ is the electrostatic capacitance of the resonator resol. In the case of a surface acoustic wave resonator having IDT electrodes, the electrostatic capacitance is expressed using formula 1 given above.

In the equivalent circuit, a resonant frequency fr of the resonator resol is defined by the circuit in which the capacitor $C_1$ and the inductor $L_1$ are connected in series with each other and is a frequency at which the impedance of the equivalent circuit is 0, and therefore the resonant frequency fr is expressed by formula 3, which is obtained by solving formula 2.

[Math 2]

$$Z_r = 0 = j\omega_r L_1 + \frac{1}{j\omega_r C_1} \quad (2)$$

[Math 3]

$$f_r = \frac{1}{2\pi\sqrt{L_1 C_1}} \quad (3)$$

In addition, an anti-resonant frequency $f_a$ of the resonator resol is the frequency at which an admittance $Y_a$ of the equivalent circuit is 0, and therefore the anti-resonant frequency fa is expressed by formula 5, which is obtained by solving formula 4.

[Math 4]

$$Y_a = \frac{1}{Z_a} = 0 = \frac{1}{\frac{1}{j\omega_a C_0}} + \frac{1}{j\omega_a L_1 + \frac{1}{j\omega_a C_1}} \quad (4)$$

[Math 5]

$$f_a = \frac{\sqrt{1 + \frac{C_1}{C_0}}}{2\pi\sqrt{L_1 C_1}} = f_r \sqrt{1 + \frac{C_1}{C_0}} \quad (5)$$

From formula 3 and formula 5 given above, as illustrated in the graph on the right-hand side of FIG. 5A, the anti-resonant frequency $f_a$ appears on the high-frequency side of the resonant frequency $f_r$.

In other words, the resonator resol has one resonant frequency and one anti-resonant frequency located on the high-frequency side of the resonant frequency.

[5.2 Serial Connection of Capacitor to Resonator]

Next, the resonance characteristic obtained when a capacitor is serially connected to the resonator resol will be described using an equivalent circuit model.

Figure 5B:
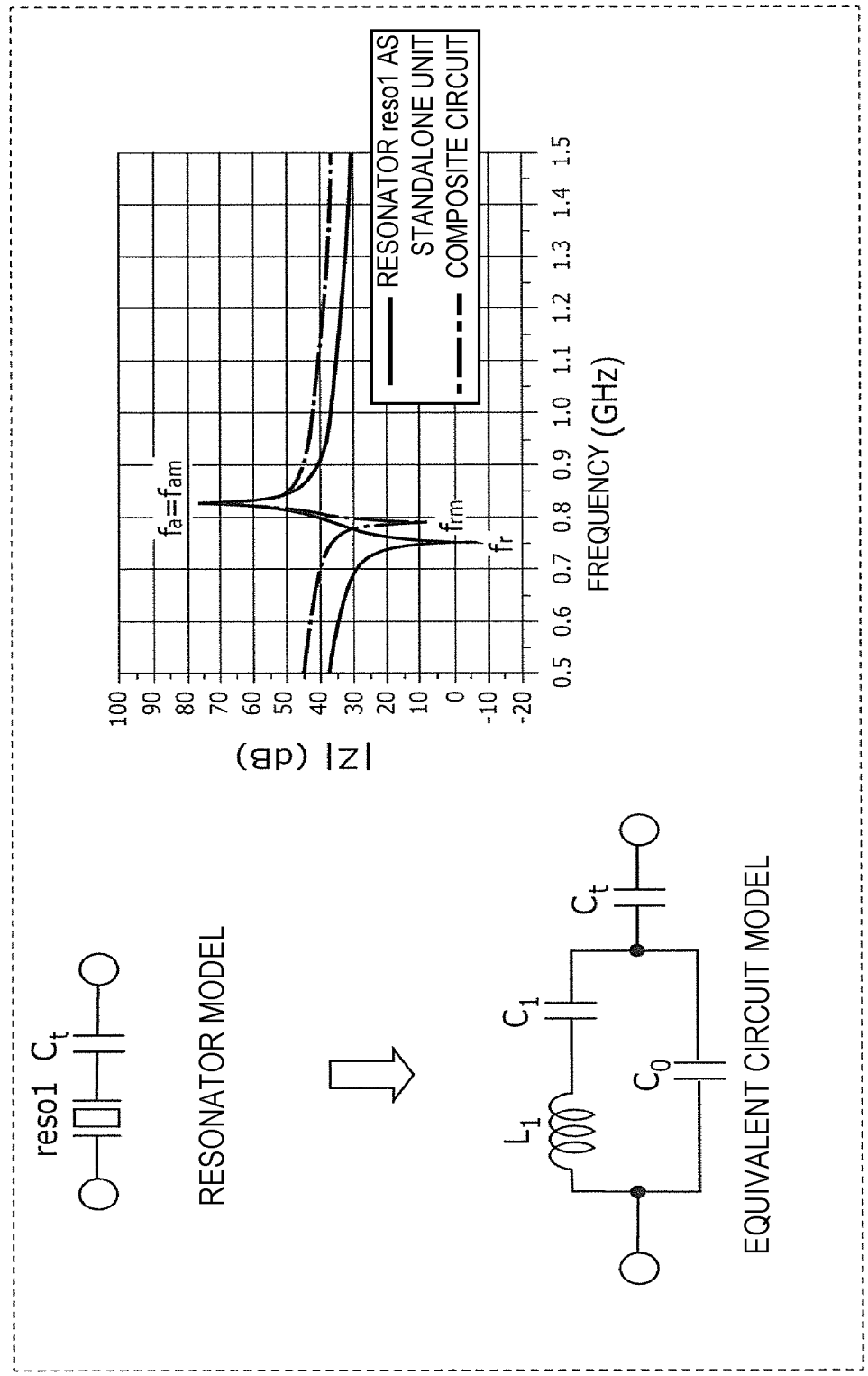
FIG. 5B is a diagram illustrating an equivalent circuit model for a case where a capacitor is connected in series with a resonator, and the resonance characteristics thereof.

FIG. 5B is a diagram illustrating an equivalent circuit model for a case where a capacitor $C_t$ is serially connected to the resonator resol, and the resonance characteristics thereof. As illustrated in the figure, the equivalent circuit model in this case has a configuration in which the capacitor $C_t$ is connected in series with the resonator resol, which is represented as a circuit in which the capacitor $C_0$ is connected in parallel with a circuit in which the capacitor $C_1$ and the inductor $L_1$ are connected in series with each other.

A resonant frequency $f_{rm}$ of this equivalent circuit is the frequency at which an impedance $Z_{rm}$ of the equivalent circuit is 0, and therefore is expressed by formula 7, which is obtained by solving formula 6.

[Math 6]

$$Z_{rm} = 0 = \cfrac{1}{\cfrac{1}{\cfrac{1}{j\omega_{rm}C_0} + \cfrac{1}{j\omega_{rm}L_1 + \cfrac{1}{j\omega_{rm}C_1}}}} + \cfrac{1}{j\omega_{rm}C_t} \qquad (6)$$

[Math 7]

$$f_{rm} = \cfrac{\sqrt{\cfrac{C_0 + C_1 + C_t}{L_1 C_1 C_t + L_1 C_0 C_t}}}{2\pi} \qquad (7)$$

On the other hand, an anti-resonant frequency $f_{am}$ of this equivalent circuit is the frequency at which an admittance $Y_{am}$ of the equivalent circuit is 0, and therefore is expressed by formula 9, which is obtained by solving formula 8.

[Math 8]

$$Y_{am} = \cfrac{1}{Z_{am}} = 0 = \cfrac{1}{\cfrac{1}{j\omega_{am}C_0}} + \cfrac{1}{j\omega_{am}L_1 + \cfrac{1}{j\omega_{am}C_1}} \qquad (8)$$

[Math 9]

$$f_{am} = \cfrac{\sqrt{1 + \cfrac{C_1}{C_0}}}{2\pi\sqrt{L_1 C_1}} = f_a = f_r\sqrt{1 + \cfrac{C_1}{C_0}} \qquad (9)$$

From formula 7 and formula 9, as illustrated in the graph on the right-hand side of FIG. 5B, it is clear that in a circuit in which the capacitor $C_t$ is serially connected to the resonator resol, the anti-resonant frequency $f_{am}$ is equal to the anti-resonant frequency $f_a$ of the resonator resol as a standalone unit as expressed by formula 4, and the resonant frequency $f_{rm}$ is shifted toward the high-frequency side from the resonant frequency $f_r$ of the resonator resol as a standalone unit.

[5.3 Serial Connection of LC Parallel Resonance Circuit to Resonator]

Next, the resonance characteristic obtained when an LC parallel resonance circuit is connected in series with the resonator resol will be described using an equivalent circuit model.

Figure 5C:
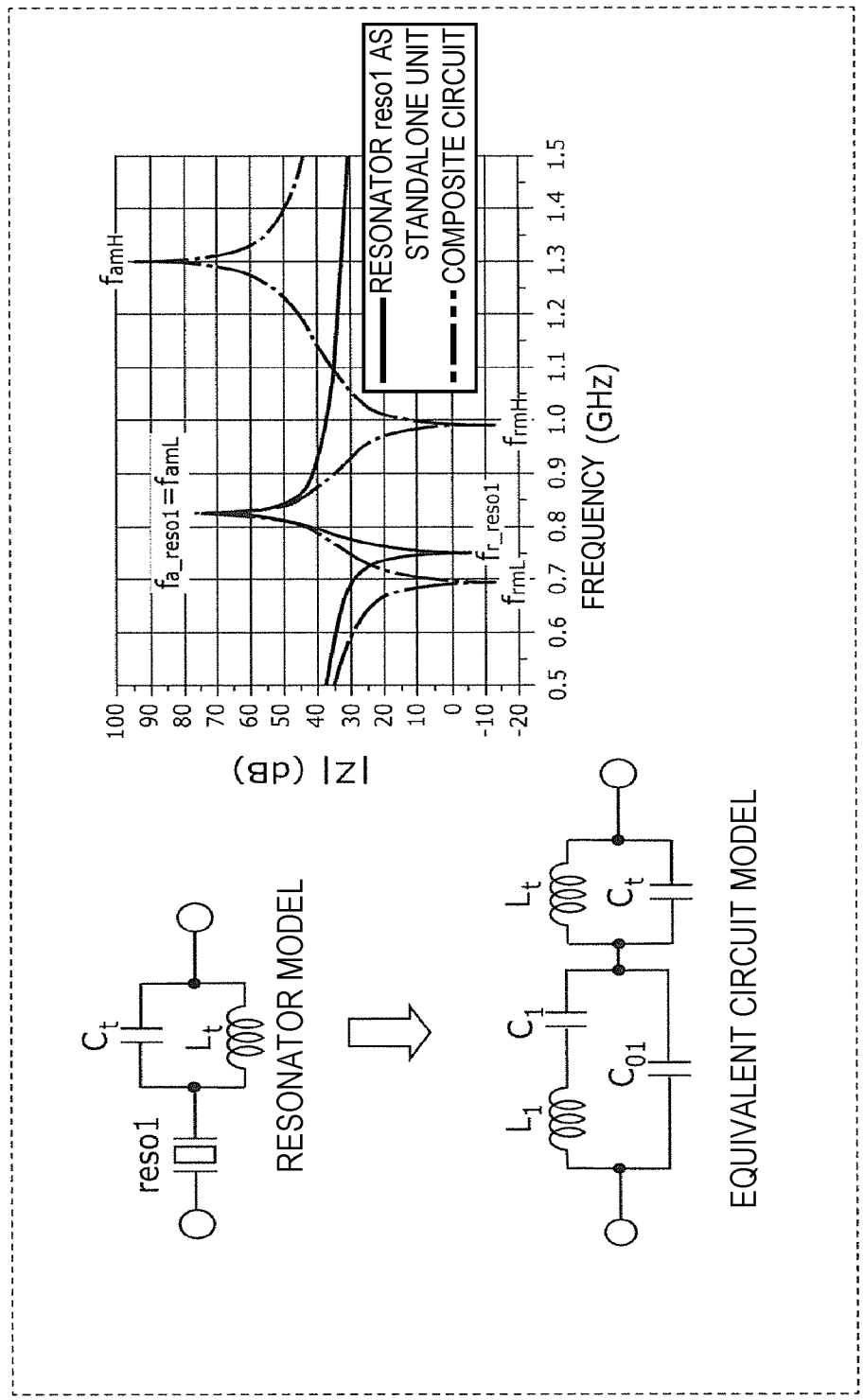
FIG. 5C is a diagram illustrating an equivalent circuit model for a case where an LC parallel resonance circuit, which comprises of a capacitor and an inductor, is connected in series with a resonator, and the resonance characteristics thereof.

FIG. 5C is a diagram illustrating an equivalent circuit model for a case where an LC parallel resonance circuit composed of a capacitor $C_t$ and an inductor $L_t$ is serially connected to the resonator resol, and the resonance characteristics thereof. As illustrated in the figure, an LC parallel resonance circuit composed of the capacitor $C_t$ and the inductor $L_t$ is serially connected to the resonator resol that is represented by a circuit in which the capacitor $C_0$ is connected in parallel with a circuit in which the capacitor $C_1$ and the inductor $L_1$ are connected in series with each other.

A resonant frequency $f_{rm}$ of this equivalent circuit is the frequency at which an impedance $Z_{rm}$ of the equivalent circuit is 0, and therefore is expressed by formula 11, which is obtained by solving formula 10.

[Math 10]

$$Z_{rm} = 0 = \cfrac{1}{\cfrac{1}{\cfrac{1}{j\omega_{rm}C_0}} + \cfrac{1}{j\omega_{rm}L_1 + \cfrac{1}{j\omega_{rm}C_1}}} + \cfrac{1}{\cfrac{1}{j\omega_{rm}L_t} + \cfrac{1}{j\omega_{rm}C_t}} \qquad (10)$$

[Math 11]

$$f_{rmL} = \cfrac{\sqrt{\cfrac{-b - \sqrt{b^2 - 4ac}}{2a}}}{2\pi} \qquad (11)$$

$$f_{rmH} = \cfrac{\sqrt{\cfrac{-b + \sqrt{b^2 - 4ac}}{2a}}}{2\pi}$$

$a = L_1 L_t C_0 C_1 + L_1 L_t C_1 C_t$
$b = -L_1 C_1 - L_t C_0 - L_t C_1 - L_t C_t$
$c = 1$

On the other hand, an anti-resonant frequency $f_{am}$ of this equivalent circuit is the frequency at which an admittance $Y_{am}$ of the equivalent circuit becomes 0, and therefore is expressed as follows. Specifically, in the case where the resonant frequency fr of the resonator resol is lower than a frequency $1/(2\pi\sqrt{L_t C_t})$ at which the impedance of the LC parallel resonance circuit is maximum, a low-frequency-side anti-resonant frequency $f_{amL}$ is expressed by formula 13, which is obtained by solving formula 12. In addition, in this case, a high-frequency-side anti-resonant frequency $f_{amH}$ is expressed by formula 15, which is obtained by solving formula 14.

[Math 12]

$$Y_{amL} = \cfrac{1}{Z_{amL}} = 0 = \cfrac{1}{\cfrac{1}{j\omega_{amL}C_0}} + \cfrac{1}{j\omega_{amL}L_1 + \cfrac{1}{j\omega_{amL}C_1}} \qquad (12)$$

[Math 13]

$$f_{amL} = \cfrac{\sqrt{1 + \cfrac{C_1}{C_0}}}{2\pi\sqrt{L_1 C_1}} = f_{a\_resol} = f_{r\_resol}\sqrt{1 + \cfrac{C_1}{C_0}} \qquad (13)$$

[Math 14]

$$Y_{amH} = \cfrac{1}{Z_{amH}} = 0 = \cfrac{1}{j\omega_{amH}L_t} + j\omega_{amH}C_t \qquad (14)$$

[Math 15]

$$f_{amH} = \cfrac{1}{2\pi\sqrt{L_t C_t}} \qquad (15)$$

From formulas 11, 13, and 15, as illustrated in the graph on the right-hand side of FIG. 5C, in this case, it is clear that the low-frequency-side anti-resonant frequency $f_{amL}$ is equal to an anti-resonant frequency $f_{a\_resol}$ of the resonator resol as a standalone unit and that a low-frequency-side resonant frequency $f_{rmL}$ is shifted toward the low-frequency side from a resonant frequency $f_{r\_resol}$ of the resonator resol as a standalone unit.

In contrast, in the case where the resonant frequency fr of the resonator resol is higher than the frequency $1/(2\pi\sqrt{L_t C_t})$ at which the impedance of the LC parallel resonance circuit is maximum, the low-frequency-side anti-resonant frequency $f_{amL}$ is expressed by formula 17, which is obtained by solving formula 16. In addition, in this case, the high-frequency-side anti-resonant frequency $f_{amH}$ is expressed by formula 19, which is obtained by solving formula 18.

[Math 16]

$$Y_{amL} = \frac{1}{Z_{amL}} = 0 = \frac{1}{j\omega_{amL}L_t} + j\omega_{amL}C_t \quad (16)$$

[Math 17]

$$f_{amL} = \frac{1}{2\pi\sqrt{L_t C_t}} \quad (17)$$

[Math 18]

$$Y_{amH} = \frac{1}{Z_{amH}} = 0 = \frac{1}{j\omega_{amH}L_t} + j\omega_{amH}C_t \quad (18)$$

[Math 19]

$$f_{amH} = \frac{\sqrt{1 + \frac{C_1}{C_0}}}{2\pi\sqrt{L_1 C_1}} == f_{a\_resol} = f_{r\_resol}\sqrt{1 + \frac{C_1}{C_0}} \quad (19)$$

Figure 8:
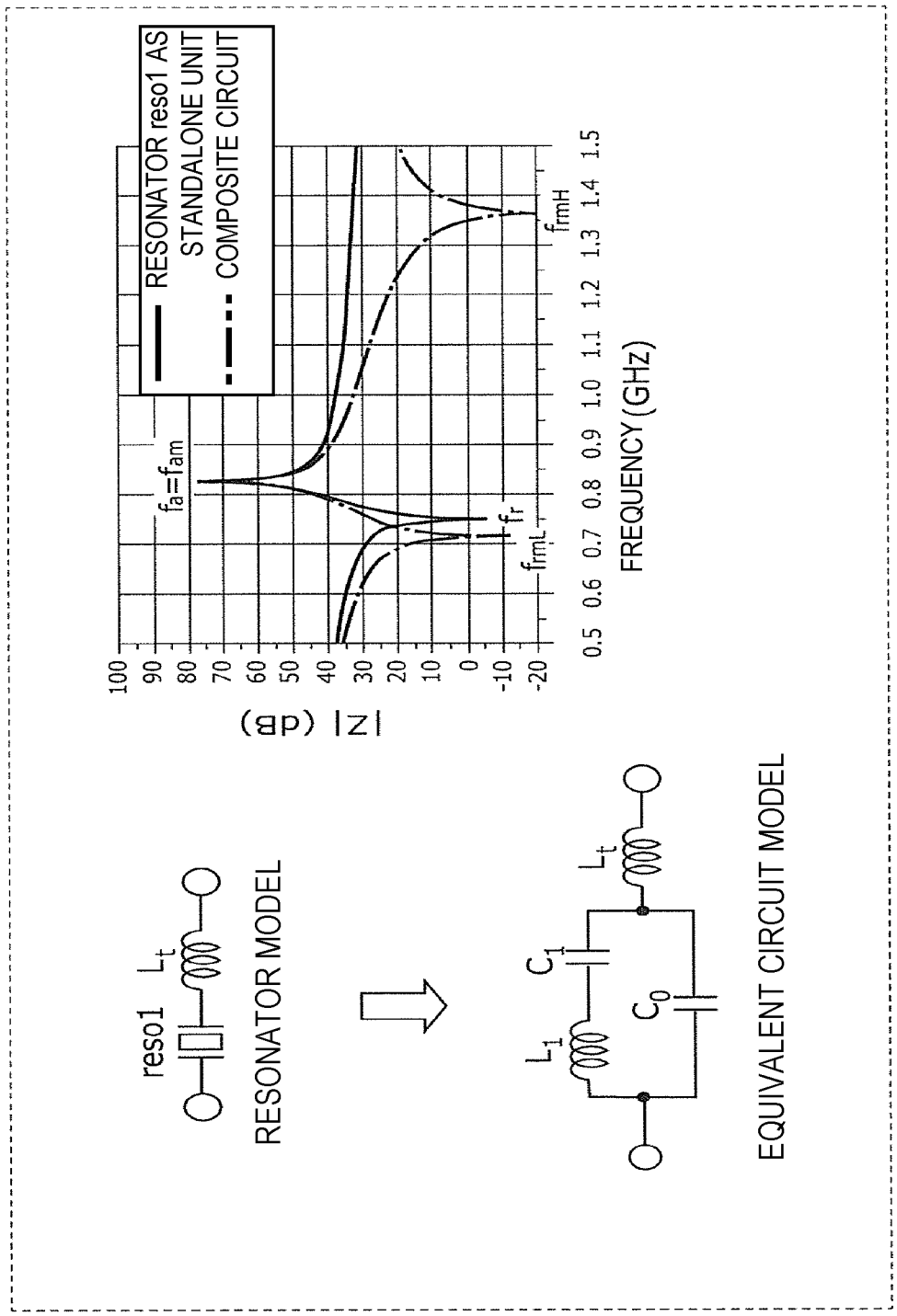
FIG. 8 is a diagram illustrating an equivalent circuit model for a case where an inductor is connected in series with a resonator, and the resonance characteristic thereof.

From formulas 11, 17, and 19, in this case, as illustrated in the graph on the right-hand side of FIG. 8, it is clear that the high-frequency-side anti-resonant frequency $f_{amH}$ is equal to the anti-resonant frequency $f_{a\_resol}$ of the resonator resol as a standalone unit and that a high-frequency-side resonant frequency $f_{rmH}$ is shifted toward the high-frequency side from the resonant frequency $f_r$ of the resonator resol as a standalone unit.

[5.4 Explanation of Characteristics Based on Resonance Analysis (Example 1 and Example 2)]

On the basis of this resonance analysis, explanation will be given regarding switching of the resonant frequency or anti-resonant frequency of the parallel arm circuit 12 in accordance with switching of the switch 22SW between on and off in example 1 and example 2 described above.

That is, when the switch 22SW is off, the capacitor 22C is connected in series with the parallel arm resonator 22p. Therefore, in this case, the resonant frequency and the anti-resonant frequency of the parallel arm circuit 12 will be explained using an equivalent circuit model for a case where the capacitor $C_t$ is serially connected to the resonator resol (refer to FIG. 5B). On the other hand, when the switch 22SW is on, the LC parallel resonance circuit composed of the capacitor 22C and the inductor 22L is serially connected to the parallel arm resonator 22p. Therefore, the resonant and anti-resonant frequencies of the parallel arm circuit 12 will be explained using an equivalent circuit model for a case where the LC parallel resonance circuit composed of the capacitor $C_t$ and the inductor $L_t$ is serially connected to the resonator resol (refer to FIG. 5C). In this case, the frequency fz at which the impedance of the impedance circuit 13 is maximum corresponds to a frequency $1/(2\pi\sqrt{L_t C_t})$ at which the impedance of the LC parallel resonance circuit is maximum in the equivalent circuit model.

In other words, for example, in example 1, when the switch 22SW is off, the resonant frequency frpoff of the parallel arm circuit 12 is explained by the above formula 7 and the anti-resonant frequency faoff of the parallel arm circuit 12 is explained by the above formula 9.

On the other hand, in example 1, when the switch 22SW is on, among the two resonant frequencies frp1on and frp2on of the parallel arm circuit 12, the low-frequency-side resonant frequency frp1on is explained by $f_{rmL}$ of the above formula 11 and the high-frequency-side resonant frequency frp2on is explained by $f_{rmH}$ of the above formula 11. Furthermore, in this case, among the two anti-resonant frequencies fap1on and fap2on of the parallel arm circuit 12, the low-frequency-side anti-resonant frequency fap1on is explained by the above formula 13 and the high-frequency side anti-resonant frequency fap2on is explained by the above formula 15.

In addition, for example, in example 2, when the switch 22SW is off, the resonant frequency frpoff and the anti-resonant frequency faoff of the parallel arm circuit 12 are explained in the same manner as in example 1.

On the other hand, in example 2, when the switch 22SW is on, the two resonant frequencies frp1on and frp2on of the parallel arm circuit 12 are explained in the same manner as in example 1. Furthermore, in this case, among the two anti-resonant frequencies fap1on and fap2on of the parallel arm circuit 12, the low-frequency-side anti-resonant frequency fap1on is explained using the above formula 17 and the high-frequency side anti-resonant frequency fap2on is explained by the above formula 19.

6. Modification of Filter (Tunable Filter)

A high-frequency filter circuit having a variable frequency function has been described above by exemplifying a configuration in which a capacitor is used as the first impedance element and an inductor is used as the second impedance element. However the relationship between these elements may be reversed. Accordingly, this configuration will be described as a modification of a high-frequency filter circuit having a variable frequency function according to this embodiment.

Figure 6:
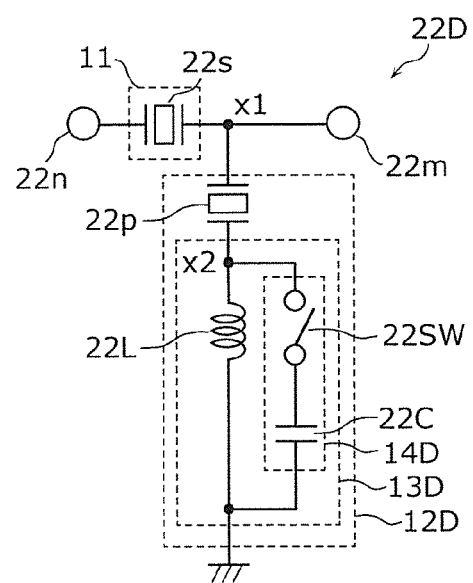
FIG. 6 is a circuit configuration diagram of a filter according to a modification of embodiment 1.

FIG. 6 is a circuit configuration diagram of a filter 22D according to a modification of embodiment 1. The filter 22D illustrated in the figure differs from the filter 22A illustrated in FIG. 2 in that the capacitor and the inductor are swapped with each other.

Hereafter, the description of the points that are the same as in the filter 22A according to embodiment 1 is omitted and the description will focus on the points that are different.

In this modification, the inductor 22L is the first impedance element that is serially connected to the parallel arm resonator 22p between the parallel arm resonator 22p and ground. That is, one terminal of the inductor 22L is connected to a ground-side terminal of the parallel arm resonator 22p and the other terminal of the inductor 22L is connected to ground.

In this modification, the capacitor 22C is the second impedance element, and one terminal of the capacitor 22C is connected to the other terminal of the switch 22SW and the other terminal of the capacitor 22C is connected to ground.

In other words, in this modification, a parallel arm circuit 12D includes the parallel arm resonator 22p and an impedance circuit 13D that is serially connected to the parallel arm resonator 22p. Here, the impedance circuit 13D includes the inductor 22L, which is an example of a first impedance element that is one of an inductor and a capacitor, the capacitor 22C, which is an example of a second impedance element that is the other of an inductor and a capacitor, and the switch 22SW that is serially connected to the capacitor 22C. In addition, a first series circuit 14D formed of the capacitor 22C and the switch 22SW is connected in parallel with the inductor 22L.

In other words, in this modification, the switch 22SW and the capacitor 22C, which are connected in series with each other, are connected in parallel with the inductor 22L. Therefore, the parallel arm resonator 22p is serially connected to the inductor 22L when the switch 22SW is off, and similarly to embodiment 1, the parallel arm resonator 22p is serially connected to the LC parallel resonance circuit formed of the inductor 22L and the capacitor 22C when the switch 22SW is on.

The bandpass characteristic of the filter 22D configured as described above is switched between a first bandpass characteristic and a second bandpass characteristic by switching the switch 22SW between on and off in accordance with a control signal. Accordingly, hereafter, the bandpass characteristic of the filter 22D will be described in conjunction with the states of the switch 22SW using two examples (example 3 and example 4) of the filter 22D.

Specifically, as example 3, a case in which a frequency fz at which the impedance of the impedance circuit 13D is maximum when the switch 22SW is on is lower than the resonant frequency frp of the parallel arm resonator 22p (fz<frp) will be described. As example 4, a case in which the frequency fz at which the impedance of the impedance circuit 13 is maximum when the switch 22SW is on is higher than the resonant frequency frp of the parallel arm resonator 22p (fz>frp) will be described.

The circuit constants in example 3 and the circuit constants in example 4 are the same as each other except for those of the capacitor 22C and the inductor 22C, which have different values, and specifically are as listed in Table 2 below. The parameters of the series arm resonator 22s and the parallel arm resonator 22p are the same as in example 1 and example 2, and therefore the description thereof is omitted.

TABLE 2

|  | INDUCTOR 22L | |
|---|---|---|
|  | EXAMPLE 3 | EXAMPLE 4 |
| INDUCTANCE [nH] | 2.5 | 2.5 |
|  | CAPACITOR 22C | |
|  | EXAMPLE 3 | EXAMPLE 4 |
| CAPACITANCE [pF] | 7.7 | 1.5 |

Figure 7A:
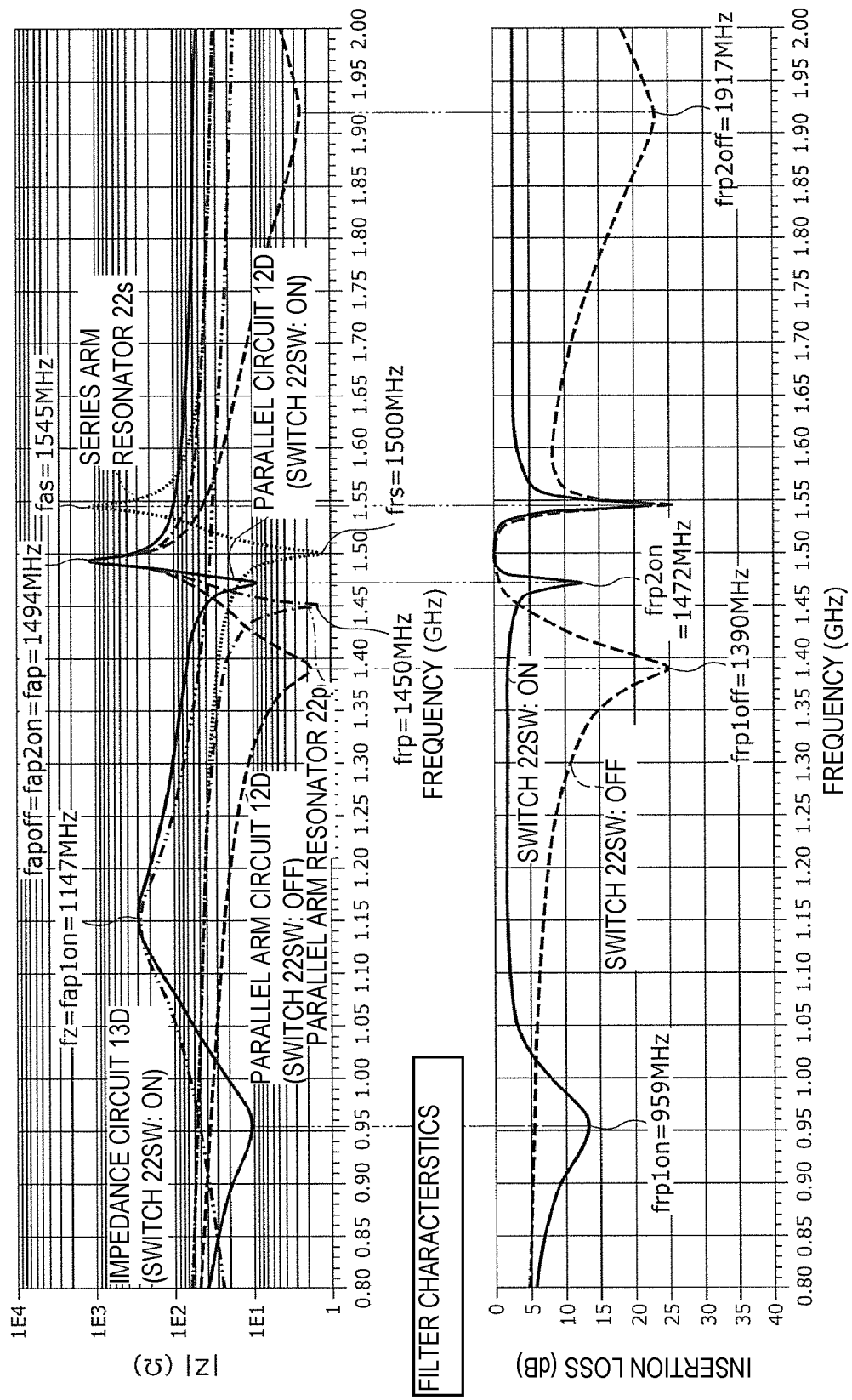
FIG. 7A illustrates graphs depicting the impedance characteristics related to a filter according to example 3 and the bandpass characteristics of the filter according to example 3.
Figure 7B:
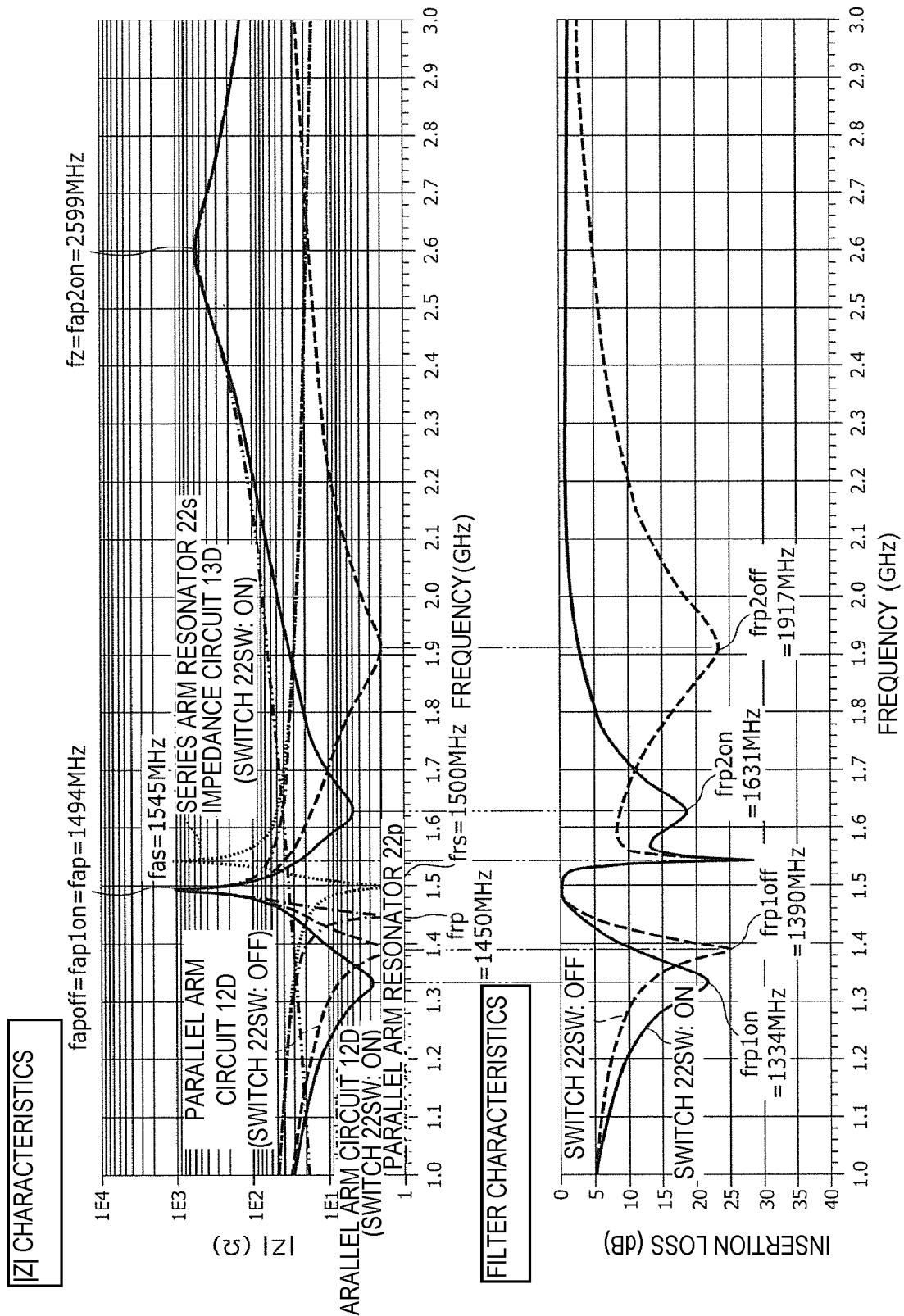
FIG. 7B illustrates graphs depicting the impedance characteristics related to a filter according to example 4 and the bandpass characteristics of the filter according to example 4.

FIG. 7A illustrates graphs depicting impedance characteristics related to the filter according to example 3 and the bandpass characteristics of the filter according to example 3. FIG. 7B illustrates graphs depicting impedance characteristics related to the filter according to example 4 and the bandpass characteristics of the filter according to example 4.

In the upper part of each figure, the following five impedance characteristics are illustrated.

(I-i) Impedance characteristic of parallel arm circuit 12D when switch 22SW is on ("PARALLEL ARM CIRCUIT 12D (SWITCH 22SW: ON)" in the figures)

(I-ii) Impedance characteristic of parallel arm circuit 12D when switch 22SW is off ("PARALLEL ARM CIRCUIT 12D (SWITCH 22SW: OFF)" in the figures)

(I-iii) Impedance characteristic of impedance circuit 13D when switch 22SW is on ("IMPEDANCE CIRCUIT 13D (SWITCH 22SW: ON)" in the figures)

(I-iv) Impedance characteristic of series arm resonator 22s, that is, impedance characteristic of series arm circuit 11 ("SERIES ARM RESONATOR 22s" in the figures)

(I-v) Impedance characteristic of parallel arm resonator 22p ("PARALLEL ARM RESONATOR 22p" in the figures)

Furthermore, in the lower part of each figure, the following two bandpass characteristics are illustrated.

(II-i) Bandpass characteristic of filter 22D when switch 22SW is on ("SWITCH 22SW: ON" in the figures)

(II-ii) Bandpass characteristic of filter 22D when switch 22SW is off ("SWITCH 22SW: OFF" in the figures)

Here, the impedance characteristic of the resonator as a standalone unit is the same as the characteristic described in the case of the filter 22A, and therefore the description thereof is omitted hereafter.

In both example 3 and example 4, when the switch 22SW is off, the impedance circuit 13D is a circuit comprising of only the inductor 22L, and therefore the impedance circuit 13D has an inductive impedance. At this time, the parallel arm circuit 12D is a series circuit comprising of the parallel arm resonator 22p and the inductor 22L, and as illustrated in FIGS. 7A and 7B, the parallel arm circuit 12D has two resonant frequencies frp1off and frp2off and one anti-resonant frequency faoff.

Specifically, among the two resonant frequencies frp1off and frp2off, the resonant frequency frp1off, which is on the low-frequency side, is lower than the resonant frequency frp of the parallel arm resonator 22p, and the resonant frequency frp2off, which is on the high-frequency side, is higher than the resonant frequency frp of the parallel arm resonator 22p. In relation to this, both of the two resonant frequencies frp1off and frp2off become lower as the inductance value of the inductor 22L increases.

In addition, at this time, as illustrated in FIG. 7A, in example 3, a high-frequency-side anti-resonant frequency fa2off of the parallel arm circuit 12D substantially coincides with the anti-resonant frequency fap of the parallel arm resonator 22p. On the other hand, as illustrated in FIG. 7B, in example 4, a low-frequency-side anti-resonant frequency fap1on of the parallel arm circuit 12 substantially coincides with the anti-resonant frequency fap of the parallel arm resonator 22p.

The two resonant frequencies frp1off and frp2off and the one anti-resonant frequency faoff of the parallel arm circuit 12D when the switch 22SW is off have been described above, and the details of the principles behind these frequencies will be described later using a resonator equivalent circuit model.

In other words, when the switch 22SW is off, the filters according to examples 3 and 4 have the first bandpass characteristic ("SWITCH 22SW: OFF" in the lower parts of FIGS. 7A and 7B) in which the pass band is defined by the high-frequency side anti-resonant frequency fap2off of the parallel arm circuit 12D and the resonant frequency frs of the series arm resonator 22s, a pole (attenuation pole) on the low-frequency side of the pass band is defined by the low-frequency side resonant frequency frp1off of the parallel arm circuit 12D, and a pole (attenuation pole) on the high-frequency side of the pass band is defined by the anti-resonant frequency fas of the series arm resonator 22s and the resonant frequency frp2off of the parallel arm circuit 12D.

Here, in example 3 and example 4, the low-frequency-side resonant frequency frp1off of the parallel arm circuit 12D is lower than the resonant frequency frp of the parallel arm resonator 22p. Therefore, in the first bandpass characteristic, the pole on the low-frequency side of the pass band is shifted toward the low-frequency side compared with the bandpass characteristic of the basic ladder filter structure comprising of only the series arm resonator 22s and the parallel arm resonator 22p. Therefore, with the filters according to example 3 and example 4, when the switch 22SW is off, the low-frequency end of the pass band is shifted toward the low-frequency side and the pass band width can be made larger compared with the basic ladder filter structure. In addition, in this case, since the low-frequency-side resonant frequency frp1on of the parallel arm circuit 12D is lower than the resonant frequency frp of the parallel arm resonator 22p, sufficient attenuation can be secured in an attenuation band at a lower frequency than the resonant frequency frp of the parallel arm resonator 22p.

On the other hand, when the switch 22SW is on, the impedance circuit 13D is an LC parallel resonance circuit that is a parallel circuit comprising of the capacitor 22C and the inductor 22L. Therefore, the parallel arm circuit 12D has the two resonant frequencies frp1on and frp2on and the two anti-resonant frequencies fa1on and fa2on as illustrated in FIGS. 7A and 7B due to the same principles as in example 1 and example 2 described above.

In relation to this, among the two resonant frequencies frp1on and frp2on, the resonant frequency frp1on, which is on the low-frequency side, is lower than the resonant frequency frp of the parallel arm resonator 22p, and the resonant frequency frp2on, which is on the high-frequency side, is higher than the resonant frequency frp of the parallel arm resonator 22p. Specifically, as illustrated in FIG. 7A, in example 3, the resonant frequency frp2on on the high-frequency side is located close to the resonant frequency frp of the parallel arm resonator 22p. On the other hand, as illustrated in FIG. 7B, in example 4, the resonant frequency frp1on on the low-frequency side is located close to the resonant frequency frp of the parallel arm resonator 22p.

In addition, at this time, as illustrated in FIG. 7A, in example 3, the high-frequency-side anti-resonant frequency fap2on of the parallel arm circuit 12D substantially coincides with the anti-resonant frequency fap of the parallel arm resonator 22p. On the other hand, as illustrated in FIG. 7B, in example 4, the low-frequency-side anti-resonant frequency fap1on of the parallel arm circuit 12D substantially coincides with the anti-resonant frequency fap of the parallel arm resonator 22p.

The two resonant frequencies frp1on and frp2on and the two anti-resonant frequencies fap1on and fap2on of the parallel arm circuit 12D when the switch 22SW is on have been described above, and the details of the principles behind these frequencies will be described later using a resonator equivalent circuit model.

Furthermore, from the above description, when the switch 22SW is on, the filter according to example 3 has the second bandpass characteristic ("SWITCH 22SW: ON" in the lower part of FIG. 7A) in which the pass band is defined by the high-frequency-side anti-resonant frequency fap2on of the parallel arm circuit 12D and the resonant frequency frs of the series arm resonator 22s, two poles (attenuation poles) on the low-frequency side of the pass band are defined by the two resonant frequencies frp1on and frp2on of the parallel arm circuit 12D, and a pole (attenuation pole) on the high-frequency side of the pass band is defined by the anti-resonant frequency fas of the series arm resonator 22s.

Here, in example 3, the high-frequency-side resonant frequency frp2on of the parallel arm circuit 12D is higher than the resonant frequency frp of the parallel arm resonator 22p. Therefore, in the second bandpass characteristic, the low-frequency side of the pass band is shifted toward the high-frequency side compared with the bandpass characteristic of the basic ladder filter structure formed of only the series arm resonator 22s and the parallel arm resonator 22p.

Therefore, with the filter according to example 3, when the switch 22SW is off, the low-frequency end of the pass band is shifted toward the high-frequency side and the pass band width can be made smaller compared with the basic ladder filter structure. In addition, when the switch 22SW is on, the low-frequency-side resonant frequency frp1on of the parallel arm circuit 12D is lower than the resonant frequency frp of the parallel arm resonator 22p. Therefore, sufficient attenuation can be secured in an attenuation band at a lower frequency than the resonant frequency frp of the parallel arm resonator 22p.

In addition, when the switch 22SW is on, the filter according to example 4 has the second bandpass characteristic ("SWITCH 22SW: ON" in the lower part of FIG. 7B) in which the pass band is defined by the low-frequency side anti-resonant frequency fap1on of the parallel arm circuit 12D and the resonant frequency frs of the series arm resonator 22s, a pole (attenuation pole) on the low-frequency side of the pass band is defined by the low-frequency side resonant frequency frp1on of the parallel arm circuit 12D, and a pole (attenuation pole) on the high-frequency side of the pass band is defined by the anti-resonant frequency fas of the series arm resonator 22s and the high-frequency side resonant frequency frp2on of the parallel arm circuit 12D.

Here, in example 4, the low-frequency-side resonant frequency frp1on of the parallel arm circuit 12D is lower than the resonant frequency frp of the parallel arm resonator 22p. Therefore, in the second bandpass characteristic, the pole on the low-frequency side of the pass band is shifted toward the low-frequency side compared with the bandpass characteristic of the basic ladder filter structure comprising of only the series arm resonator 22s and the parallel arm resonator 22p. Therefore, with the filter according to example 4, when the switch 22SW is on, the low-frequency end of the pass band is shifted toward the low-frequency side and the pass band width can be made larger compared with the basic ladder filter structure. Furthermore, regardless of whether the switch 22SW is on or off, the low-frequency-side resonant frequency of the parallel arm circuit 12D (frp1on when switch 22SW is on and frp1off when switch 22SW is off), is lower than the resonant frequency frp of the parallel arm resonator 22p. Therefore, sufficient attenuation can be secured in an attenuation band at a lower frequency than the resonant frequency frp of the parallel arm resonator 22p.

7. Explanation of Principles 2 Based On Resonance Analysis

Next, the principles that enable the resonant and anti-resonant frequencies of the parallel arm circuit 12D described above to be obtained will be described using the analysis (resonance analysis) of the impedance characteristic (resonance characteristic) using an equivalent circuit model of a resonator.

[7.1 Serial Connection of Inductor to Resonator]

First, the resonance characteristic obtained when an inductor is connected in series with the resonator resol will be described using an equivalent circuit model.

FIG. 8 is a diagram illustrating an equivalent circuit model for a case where the inductor $L_t$ is serially connected to the resonator resol, and the resonance characteristics thereof. As illustrated in the figure, the equivalent circuit model in this case has a configuration in which the inductor $L_t$ is connected in series with the resonator resol, which is represented as a circuit in which the capacitor $C_0$ is connected in parallel with a circuit in which the capacitor $C_1$ and the inductor $L_1$ are connected in series with each other.

A resonant frequency of this equivalent circuit is the frequency at which an impedance $Z_{rm}$ of the equivalent circuit is 0, and therefore is expressed by formulas 21 and 22, which are obtained by solving formula 20. Specifically, the low-frequency-side resonant frequency $f_{rmL}$ is expressed by formula 21, and the high-frequency-side resonant frequency $f_{rmH}$ is expressed by formula 22.

[Math 20]

$$Z_{rm} = 0 = \frac{1}{\dfrac{1}{\dfrac{1}{j\omega_{rm}C_0} + j\omega_{rm}L_1 + \dfrac{1}{j\omega_{rm}C_1}}} + j\omega_{rm}L_t \quad (20)$$

[Math 21]

$$f_{rmL} = \frac{\sqrt{\dfrac{-(-L_1C_1 - L_tC_0 - L_tC_1) - \sqrt{(-L_1C_1 - L_tC_0 - L_tC_1)^2 - 4(L_1L_tC_0C_1)}}{2(L_1L_tC_0C_1)}}}{2\pi} \quad (21)$$

[Math 22]

$$f_{rmH} = \frac{\sqrt{\dfrac{-(-L_1C_1 - L_tC_0 - L_tC_1) + \sqrt{(-L_1C_1 - L_tC_0 - L_tC_1)^2 4(L_1L_tC_0C_1)}}{2(L_1L_tC_0C_1)}}}{2\pi} \quad (22)$$

On the other hand, an anti-resonant frequency $f_{am}$ of this equivalent circuit is the frequency at which an admittance $Y_{am}$ of the equivalent circuit is 0, and therefore is expressed by formula 24, which is obtained by solving formula 23.

[Math 23]

$$Y_{am} = \frac{1}{Z_{am}} = 0 = \frac{1}{\dfrac{1}{j\omega_{am}C_0}} + \frac{1}{j\omega_{am}L_1 + \dfrac{1}{j\omega_{am}C_1}} \quad (23)$$

[Math 24]

$$f_{am} = \frac{\sqrt{1 + \dfrac{C_1}{C_0}}}{2\pi\sqrt{L_1C_1}} = f_a = f_r\sqrt{1 + \dfrac{C_1}{C_0}} \quad (24)$$

From formulas 21, 22, and 24, as illustrated in the graph on the right-hand side of FIG. 8, it is clear that in a circuit in which the inductor $L_t$ is serially connected to the resonator resol, the anti-resonant frequency $f_{am}$ is equal to the anti-resonant frequency $f_a$ of the resonator resol as a standalone unit, the low-frequency-side resonant frequency $f_{rmL}$ is a frequency that is lower than the resonant frequency $f_r$ of the resonator resol as a standalone unit, and the high-frequency-side resonant frequency $f_{rmH}$ is a frequency that is higher than the resonant frequency $f_r$ of the resonator resol as a standalone unit. In other words, it is clear that there are two anti-resonant frequencies in this circuit.

[7.2 Explanation of Characteristics Based on Resonance Analysis (Example 3 and Example 4)]

On the basis of this resonance analysis, explanation will be given regarding switching of the resonant frequency or anti-resonant frequency and switching of the number of such frequencies of the parallel arm circuit 12 in accordance with switching of the switch 22SW between on and off in example 3 and example 4 described above.

That is, when the switch 22SW is off, the inductor 22L is connected in series with the parallel arm resonator 22p. Therefore, in this case, the resonant and anti-resonant frequencies of the parallel arm circuit 12D will be explained using an equivalent circuit model for a case where the inductor $L_t$ is serially connected to the resonator resol (refer to FIG. 8). On the other hand, when the switch 22SW is on, the LC parallel resonance circuit composed of the inductor 22L and the capacitor 22C is serially connected to the parallel arm resonator 22p. Therefore, the resonant and anti-resonant frequencies of the parallel arm circuit 12 will be explained using an equivalent circuit model for a case where the LC parallel resonance circuit composed of the capacitor $C_t$ and the inductor $L_t$ is serially connected to the resonator resol (refer to FIG. 5C). In this case, the frequency fz at which the impedance of the impedance circuit 13D is maximum corresponds to a frequency $1/(2\pi\sqrt{L_tC_t})$ at which the impedance of the LC parallel resonance circuit is maximum in the equivalent circuit model.

In other words, for example, in example 3, when the switch 22SW is off, among the two resonant frequencies frp1off and frp2off of the parallel arm circuit 12D, the low-frequency-side resonant frequency frp1off is explained by the above formula 21 and the high-frequency-side resonant frequency frp2off is explained by the above formula 22. In addition, the anti-resonant frequency faoff of the parallel arm circuit 12D is explained by the above formula 24.

On the other hand, in example 3, when the switch 22SW is on, among the two resonant frequencies frp1on and frp2on of the parallel arm circuit 12D, the low-frequency-side resonant frequency frp1on is explained by $f_{rML}$ of the above formula 11 and the high-frequency-side resonant frequency frp2on is explained by $f_{rmH}$ of the above formula 11. Furthermore, in this case, among the two anti-resonant frequencies fap1on and fap2on of the parallel arm circuit 12D, the low-frequency-side anti-resonant frequency fap1on is explained using the above formula 13 and the high-frequency side anti-resonant frequency fap2on is explained using the above formula 15.

In addition, for example, in example 4, when the switch 22SW is off, the resonant frequency frpoff and the anti-resonant frequency faoff of the parallel arm circuit 12D are explained in the same manner as in example 3.

On the other hand, in example 4, when the switch 22SW is on, the two resonant frequencies frp1on and frp2on of the parallel arm circuit 12D are explained in the same manner as in example 3. Furthermore, in this case, among the two anti-resonant frequencies fap1on and fap2on of the parallel arm circuit 12D, the low-frequency-side anti-resonant frequency fap1on is explained by the above formula 17 and the high-frequency side anti-resonant frequency fap2on is explained by the above formula 19.

8. Effects Etc.

Filters 22A and 22D (high-frequency filter circuits) according to embodiment 1 and the modification thereof have been described above. Hereafter, the effects exhibited by the filters 22A and 22D will be described.

The filters 22A and 22D (high-frequency filter circuits) according to this embodiment and the modification thereof are each provided with an impedance circuit (impedance circuit 13 in embodiment and impedance circuit 13D in modification) that is serially connected to the parallel arm resonator 22p. In the impedance circuit, a first series circuit, which is formed of the switch 22SW and the second impedance element (inductor 22L in embodiment and capacitor 22C in modification) connected in series with each other, is connected in parallel with the first impedance element.

Thus, the second impedance element is switched between a connected state and a disconnected state in the impedance circuit in accordance with the switch 22SW being switched on and off, and the impedance of the impedance circuit is thereby switched. In addition, the first impedance element is one of an inductor and a capacitor and the second impedance element is the other of an inductor and a capacitor, and therefore the impedance circuit in the case where the switch 22SW is on has the frequency fz at which the impedance is maximum due to the parallel circuit comprising of the inductor and the capacitor. Furthermore, the parallel arm circuit in the case where the switch 22SW is on has two resonant frequencies frp1on and frp2on. The two resonant frequencies frp1on and frp2on includes the resonant frequency frp1on that is lower than the resonant frequency frp of the parallel arm resonator 22p. On the other hand, the parallel arm circuit in the case where the switch 22SW is off has one resonant frequency.

Therefore, in the parallel arm circuit in the case where the switch 22SW is on, since the resonant frequency frp1on can be arranged on the low-frequency side of the resonant frequency frp of the parallel arm resonator 22p, sufficient attenuation can be secured in an attenuation band at a lower frequency than the resonant frequency frp of the parallel arm resonator 22p.

From another point of view, in the configuration disclosed in Patent Document 1, the frequency variable width of the pass band (frequency shift amount) is restricted by the element value of the impedance element (capacitor in above-cited Patent Document 1) that is connected to or disconnected from a parallel arm resonator in accordance with a switch being switched on or off. Therefore, in order to increase the frequency variable width, a configuration has been considered in which a plurality of impedance elements are provided and switches are provided that selectively connect the plurality of impedance elements and parallel arm resonators to each other. However, in this configuration, the miniaturization of the high-frequency circuit is obstructed by an increase in the number of switches.

In contrast, the filters 22A and 22D according to this embodiment and the modification thereof each include the series arm resonator 22s which is connected between the input/output terminal 22m (first input/output terminal) and the input/output terminal 22n (second input/output terminal), the parallel arm resonator 22p which is connected between the node x1 on the path connecting the input/output terminal 22m and the input/output terminal 22n and ground, the first impedance element that is one of an inductor and a capacitor and is serially connected to the parallel arm resonator 22p between the node x1 and ground, the second impedance element that is the other one of an inductor and a capacitor, and the switch 22SW that is serially connected to the second impedance element. Furthermore, the first series circuit comprising of the second impedance element and the switch 22SW is connected in parallel with the first impedance element.

Thus, the second impedance element is connected to or disconnected from the parallel arm resonator 22p in accordance with the switch 22SW being switched on and off, and the impedance added to the parallel arm resonator 22p can be thereby varied. Therefore, the frequency at which the impedance of the parallel arm between the node on the path connecting the input/output terminal 22m (first input/output terminal) and the input/output terminal 22n (second input/output terminal), and ground is minimum (resonant frequency of parallel arm circuit in above description) can be varied. Therefore, the pole (attenuation pole) on the low-frequency side of the pass band defined by the frequency at which the impedance of the parallel arm is minimum can vary in accordance with switching of the switch 22SW between on and off, and the frequency of the low-frequency end of the pass band can be varied.

Here, the first impedance element is one of an inductor and a capacitor and the second impedance element is the other one of an inductor and a capacitor, and as a result the following two states can be realized by just switching the one switch 22SW between on and off. Specifically, regarding the frequency at which the impedance of the parallel arm circuit is minimum, which is the frequency that defines the attenuation pole on the low-frequency side of the pass band, a first state in which that frequency is made to be located on the low-frequency side of the resonant frequency frp of the parallel arm resonator 22p and a second state in which that frequency is made to be located on the high-frequency side of the resonant frequency frp of the parallel arm resonator 22p can be realized. Therefore, the frequency variable width of the low-frequency end of the pass band can be increased in accordance with switching of the switch 22SW between on and off. In other words, with the filters 22A and 22D according to this embodiment and the modification thereof, the frequency variable width of the pass band and the attenuation pole on the low-frequency side of the pass band can be increased.

Furthermore, with the filter 22A according to this embodiment, the first impedance element is the capacitor 22C and the second impedance element is the inductor 22L.

Thus, the impedance circuit in the case where the switch 22SW is on is a circuit in which the inductor and the capacitor are connected in parallel with each other, and has an impedance characteristic having a frequency at which the impedance is maximum. Therefore, the parallel arm circuit in the case where the switch 22SW is on has two resonant frequencies frp1on and frp2on including the resonant frequency frp1on that is on the low-frequency side of the resonant frequency frp of the parallel arm resonator 22p.

On the other hand, the impedance circuit in the case where the switch 22SW is off is a circuit comprising of only the capacitor, and therefore the impedance circuit has a capacitive impedance. Therefore, the parallel arm circuit in the case where the switch 22SW is off has one resonant frequency frpoff that is on the high-frequency side of the resonant frequency frp of the parallel arm resonator 22p and on the low-frequency side of the anti-resonant frequency fap of the parallel arm resonator 22p.

Therefore, a resonant frequency of the parallel arm circuit and the number of resonant frequencies of the parallel arm circuit can be switched in accordance with switching of the switch 22SW between on and off, and therefore the frequency of an attenuation pole and the number of attenuation poles can be switched. Furthermore, sufficient attenuation can be secured in an attenuation band at a lower frequency than the resonant frequency frp of the parallel arm resonator 22p when the switch 22SW is on.

From another point of view, the low-frequency end of the pass band and the attenuation pole on the low-frequency side of the pass band can be shifted toward the low-frequency side by switching the switch 22SW on, and the low-frequency end of the pass band and the attenuation pole on the low-frequency side of the pass band can be shifted toward the high-frequency side by switching the switch 22SW off. In addition, generally, a capacitor has a higher Q value than an inductor. Therefore, as a result of the first impedance element being the capacitor 22C, the Q value of the parallel arm in the case where the switch 22SW is on can be increased. As a result, the steepness of the attenuation slope on the low-frequency side of the pass band in the case where the switch 22SW is off can be increased.

Furthermore, according to this embodiment, when the switch 22SW is on, the frequency at which the impedance of the impedance circuit is maximum may be higher than the resonant frequency frp of the parallel arm resonator 22p, as in example 1.

Thus, in the impedance circuit in the case where the switch 22SW is on, the frequency at which the impedance is maximum is located at a higher frequency than the resonant frequency frp of the parallel arm resonator 22p, and therefore the impedance circuit has an inductive impedance at the resonant frequency frp of the parallel arm resonator 22p. Therefore, the parallel arm circuit in the case where the switch 22SW is on has two resonant frequencies frp1on and frp2on, namely, the resonant frequency frp1on that is on the low-frequency side of the resonant frequency frp of the parallel arm resonator 22p and the resonant frequency frp2on that is on the high-frequency side of the resonant frequency frp and the anti-resonant frequency fap of the parallel arm resonator 22p.

On the other hand, the impedance circuit in the case where the switch 22SW is off is a circuit comprising of only the capacitor, and therefore the impedance circuit has a capacitive impedance. Therefore, the parallel arm circuit in the case where the switch 22SW is off has only one resonant frequency frpoff that is on the high-frequency side of the resonant frequency frp of the parallel arm resonator 22p and on the low-frequency side of the anti-resonant frequency fap of the parallel arm resonator 22p.

Therefore, the frequency of the attenuation pole on the low-frequency side of the pass band and the presence/absence of an attenuation pole on the high-frequency side of the pass band can be switched in accordance with switching of the switch 22SW between on and off. Furthermore, sufficient attenuation can be secured in an attenuation band at a lower frequency than the resonant frequency frp of the parallel arm resonator 22p when the switch 22SW is on.

From another viewpoint, in example 1, when the switch 22SW is on, the resonant frequency frp2on, which is the frequency on the high-frequency side at which the composite impedance of the parallel arm resonator 22p, the inductor 22L, and the capacitor 22C is minimum, is located on the low-frequency side of the resonant frequency frp of the parallel arm resonator 22p. On the other hand, in the case where the switch 22SW is off, the resonant frequency frpoff of the parallel arm circuit, which is the frequency at which the composite impedance of the parallel arm resonator 22p and the capacitor C22 is minimum, is located on the high-frequency side of the resonant frequency frp of the parallel arm resonator 22p.

Thus, the frequency variable widths of the low-frequency end of the pass band and the attenuation pole on the low-frequency side of the pass band can be increased between the first pass band and the second pass band, which are switched in accordance with the switch 22SW being switched between on and off.

Furthermore, according to this embodiment, when the switch 22SW is on, the frequency fz at which the impedance of the impedance circuit is maximum may be lower than the resonant frequency frp of the parallel arm resonator 22p, as in example 2.

Thus, in the impedance circuit in the case where the switch 22SW is on, the frequency at which the impedance is maximum is located at a lower frequency than the resonant frequency frp of the parallel arm resonator 22p, and therefore the impedance circuit has a capacitive impedance at the resonant frequency frp of the parallel arm resonator 22p. Therefore, the parallel arm circuit in the case where the switch 22SW is on has two resonant frequencies frp1on and frp2on, namely, the resonant frequency frp1on that is on the low-frequency side of the resonant frequency frp of the parallel arm resonator 22p and the resonant frequency frp2on that is on the high-frequency side of the resonant frequency frp of the parallel arm resonator 22p and the low-frequency side of the anti-resonant frequency fap of the parallel arm resonator 22p.

On the other hand, the impedance circuit in the case where the switch 22SW is off is a circuit comprising of only the capacitor, and therefore the impedance circuit has a capacitive impedance. Therefore, the parallel arm circuit in the case where the switch 22SW is off has only one resonant frequency frpoff that is on the high-frequency side of the resonant frequency frp of the parallel arm resonator 22p and on the low-frequency side of the anti-resonant frequency fap of the parallel arm resonator 22p.

Therefore, the frequency of an attenuation pole and the number of attenuation poles on the low-frequency side of the pass band can be switched in accordance with switching of the switch 22SW between on and off. Furthermore, sufficient attenuation can be secured in an attenuation band at a lower frequency than the resonant frequency frp of the parallel arm resonator 22p when the switch 22SW is on.

In addition, with the filter 22D according to the modification of this embodiment, the first impedance element is the inductor 22L and the second impedance element is the capacitor 22C.

Thus, the impedance circuit in the case where the switch 22SW is on is a circuit in which the inductor and the capacitor are connected in parallel with each other, and has an impedance characteristic having a frequency at which the impedance is maximum. Therefore, the parallel arm circuit in the case where the switch 22SW is on has two resonant frequencies frp1on and frp2on including the resonant frequency frp1on that is on the low-frequency side of the resonant frequency frp of the parallel arm resonator 22p.

On the other hand, the impedance circuit in the case where the switch 22SW is off is a circuit comprising of only the inductor, and therefore the impedance circuit has an inductive impedance. Therefore, the parallel arm circuit in the case where the switch 22SW is off has two resonant frequencies frp1off and frp2off, namely, the resonant frequency frp1off that is on the low-frequency side of the resonant frequency frp of the parallel arm resonator 22p and the resonant frequency frp2off that is on the high-frequency side of the resonant frequency frp of the parallel arm resonator 22p.

Therefore, the frequency of an attenuation pole can be switched in accordance with switching of the switch 22SW between on and off. Furthermore, sufficient attenuation can be secured in an attenuation band at a lower frequency than the resonant frequency frp of the parallel arm resonator 22p when the switch 22SW is on.

From another point of view, the low-frequency end of the pass band and the attenuation pole on the low-frequency side of the pass band can be shifted toward the high-frequency side by switching the switch 22SW on, and the low-frequency end of the pass band and the attenuation pole on the low-frequency side of the pass band can be shifted toward the low-frequency side by switching the switch 22SW off. In addition, the loss in the pass band in the case when the switch 22SW is off can be reduced compared with the case where the first impedance element is a capacitor and the second impedance element is an inductor.

Furthermore, according to the modification of this embodiment, when the switch 22SW is on, the frequency at which the impedance of the impedance circuit is maximum may be lower than the resonant frequency frp of the parallel arm resonator 22p, as in example 3.

Thus, in the impedance circuit in the case where the switch 22SW is on, the frequency at which the impedance is maximum is located at a lower frequency than the resonant frequency frp of the parallel arm resonator 22p, and therefore the impedance circuit has a capacitive impedance at the resonant frequency frp of the parallel arm resonator 22p. Therefore, the parallel arm circuit in the case where the switch 22SW is on has two resonant frequencies frp1on and frp2on that are on the low-frequency side of the resonant frequency frp of the parallel arm resonator 22p.

On the other hand, the impedance circuit in the case where the switch 22SW is off is a circuit comprising of only the inductor, and therefore the impedance circuit has an inductive impedance. Therefore, the parallel arm circuit in the case where the switch 22SW is off has two resonant frequencies frp1off and frp2off, namely, the resonant frequency frp1off that is on the low-frequency side of the resonant frequency frp of the parallel arm resonator 22p and the resonant frequency frp2off that is on the high-frequency side of the resonant frequency frp of the parallel arm resonator 22p.

Therefore, the frequency of an attenuation pole and the number of attenuation poles on the low-frequency side of the pass band and the presence/absence of an attenuation pole on the high-frequency side of the pass band can be switched in accordance with switching of the switch 22SW between on and off. Furthermore, sufficient attenuation can be secured in an attenuation band at a lower frequency than the resonant frequency frp of the parallel arm resonator 22p when the switch 22SW is on.

From another viewpoint, in example 3, when the switch 22SW is on, the high-frequency-side resonant frequency frp2on of the parallel arm circuit, which is the frequency at which the composite impedance of the parallel arm resonator 22p, the inductor 22L and the capacitor 22C is minimum, is located on the high-frequency side of the resonant frequency frp of the parallel arm resonator 22p. On the other hand, in the case where the switch 22SW is off, the low-frequency side resonant frequency frp1off of the parallel arm circuit, at which the composite impedance of the parallel arm resonator 22p and the inductor 22L is minimum, is located on the low-frequency side of the resonant frequency frp of the parallel arm resonator 22p.

Thus, the frequency variable widths of the low-frequency end of the pass band and the attenuation pole on the low-frequency side of the pass band can be increased between the first pass band and the second pass band, which are switched in accordance with the switch 22SW being switched between on and off.

Furthermore, according to the modification of this embodiment, when the switch 22SW is on, the frequency at which the impedance of the impedance circuit is maximum may be higher than the resonant frequency frp of the parallel arm resonator 22p, as in example 4.

Thus, in the impedance circuit in the case where the switch 22SW is on, the frequency at which the impedance is maximum is located at a higher frequency than the resonant frequency frp of the parallel arm resonator 22p, and therefore the impedance circuit has an inductive impedance at the resonant frequency frp of the parallel arm resonator 22p. Therefore, the parallel arm circuit in the case where the switch 22SW is on has two resonant frequencies, namely, the resonant frequency on the low-frequency side of the resonant frequency frp of the parallel arm resonator 22p and the resonant frequency on the high-frequency side of the resonant frequency frp and the anti-resonant frequency fap of the parallel arm resonator 22p.

On the other hand, the impedance circuit in the case where the switch 22SW is off is a circuit comprising of only the inductor, and therefore the impedance circuit has an inductive impedance. Therefore, the parallel arm circuit in the case where the switch 22SW is off has two resonant frequencies, namely, the resonant frequency on the low-frequency side of the resonant frequency frp of the parallel arm resonator 22p and the resonant frequency on the high-frequency side of the resonant frequency frp of the parallel arm resonator 22p.

Therefore, the frequency of the attenuation pole on the low-frequency side of the pass band and the frequency of the attenuation pole on the high-frequency side of the pass band can be switched in accordance with switching of the switch 22SW between on and off. Furthermore, sufficient attenuation can be secured in an attenuation band at a lower frequency than the resonant frequency frp of the parallel arm resonator 22p when the switch 22SW is on.

In addition, in the filters 22A and 22D according to this embodiment and the modification thereof, the parallel arm resonator 22p is preferably a surface acoustic wave resonator or a bulk elastic wave resonator. In this way, it is possible to reduce the size of the parallel arm resonator 22p, and therefore it is possible to reduce the size and the cost of the filters 22A and 22D. Furthermore, elastic wave resonators in which surface acoustic wave resonators and bulk elastic wave resonators are used typically exhibit high Q characteristics, and therefore the loss inside the pass band can be reduced and a high degree of selectivity can be realized.

In addition, with the filters 22A and 22D according to this embodiment and the modification thereof, the switch 22SW (switch element) is preferably an FET switch or a diode switch composed of GaAs or CMOS. Since this kind of switch that uses a semiconductor is compact, the filters 22A and 22D can be reduced in size.

Embodiment 2

Embodiment 1 and the modification thereof described above illustrate filters each of which includes one first series circuit 14 or 14D that is formed of a switch element and a second impedance element. In contrast, embodiment 2 illustrates a filter that includes a plurality of the first series circuits.

Figure 9:
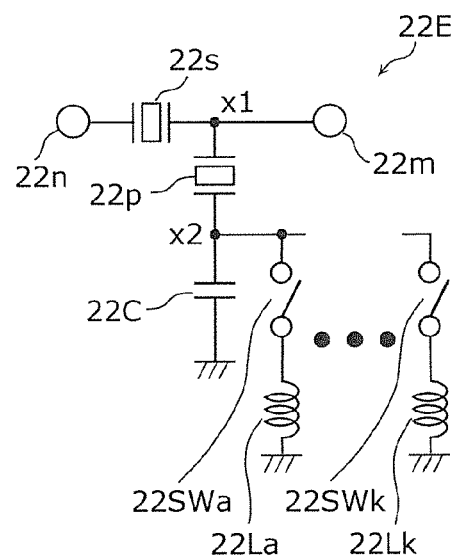
FIG. 9 is a circuit configuration diagram of a filter according to embodiment 2.

FIG. 9 is a circuit configuration diagram of a filter 22E according to embodiment 2.

Compared with the filter 22A according to embodiment 1, the filter 22E illustrated in the figure includes a plurality of first series circuits each comprising of a switch element and a second impedance element (inductor in this case).

Specifically, similarly to the filter 22A, the filter 22E includes the series arm resonator 22s, the parallel arm resonator 22p, and the capacitor 22C (first impedance element). In addition, the filter 22E includes a plurality of switches 22SWa to 22SWk and a plurality of inductors 22La to 22Lk (second impedance elements). Here, the plurality of switches 22SWa to 22SWk and the plurality of inductors 22La to 22Lk are serially connected to each other in a one-to-one manner (one-to-one correspondence).

One terminal of each of the plurality of switches 22SWa to 22SWk is connected to a connection node x2 between the parallel arm resonator 22p and the capacitor 22C.

One terminal of each of the plurality of inductors 22La to 22Lk is connected to the other terminal of the prescribed switch among the switches 22SWa to 22SWk and the other terminal of each of the plurality of inductors 22La to 22Lk is connected to ground. Each inductor forms a first series circuit together with the corresponding switch.

That is, the filter 22E according to this embodiment includes a plurality of first series circuits each comprising of a switch element (switches 22SWa to 22SWk in this case), one terminal of which is connected to a connection node (node x2 in FIG. 9) between the parallel arm resonator 22p and the first impedance element (capacitor 22C in this case), and a second impedance element (inductors 22La to 22Lk in this case).

The thus-configured filter 22E (high-frequency filter circuit) has a configuration similar to the filter 22A according to embodiment 1, and therefore similar effects to embodiment 1 are exhibited.

Furthermore, the filter 22E according to this embodiment includes a plurality of the first series circuits that each comprise of a switch element and a second impedance element. Thus, the frequencies of attenuation poles and the number of attenuation poles can be finely adjusted by appropriately switching the switch elements of the plurality of first series circuits on and off.

Modification 1 of Embodiment 2

Embodiment 2 described above, as an example, illustrates a filter in which a capacitor is used as the first impedance element and inductors are used as the second impedance elements. However the relationship between these elements may be reversed. In other words, an inductor may be used as the first impedance element and capacitors may be used as the second impedance elements. Accordingly, in modification 1 of embodiment 2, this kind of filter will be described.

Figure 10:
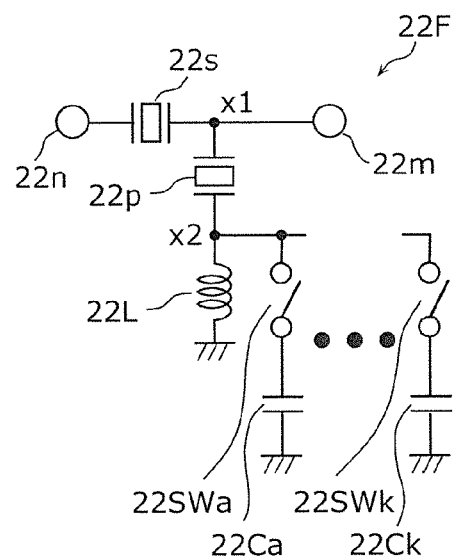
FIG. 10 is a circuit configuration diagram of a filter according to modification 1 of embodiment 2.

FIG. 10 is a circuit configuration diagram of a filter 22F according to modification 1 of embodiment 2.

Compared with the filter 22D according to modification 1 of embodiment 1, the filter 22F illustrated in the figure includes a plurality of first series circuits each comprising of a switch element and a second impedance element (capacitor in this case). Here, the first series circuits are each a circuit obtained by interchanging an inductor and a capacitor in the first series circuit in embodiment 2, and therefore the detailed description thereof is omitted.

The same effects as with the filter 22E according to embodiment 2 is exhibited by the thus-configured filter 22F (high-frequency filter circuit).

Modification 2 of Embodiment 2

Embodiment 2 and modification 1 thereof described above illustrate filters each of which includes a plurality of first series circuits that each comprise of a switch element and a second impedance element. In contrast, modification 2 of embodiment 2 illustrates a filter that further includes second series circuits that each comprise of a switch element and a third impedance element.

Figure 11:
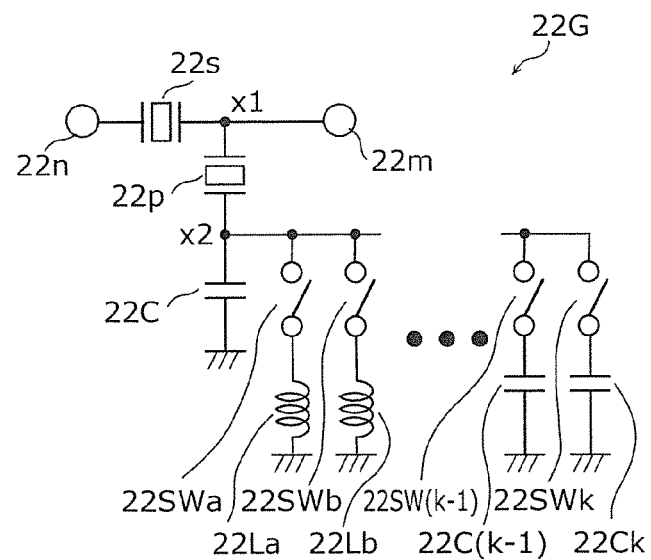
FIG. 11 is a circuit configuration diagram of a filter according to modification 2 of embodiment 2.

FIG. 11 is a circuit configuration diagram of a filter 22G according to modification 2 of embodiment 2.

Compared with the filter 22E according to embodiment 2, the filter 22G illustrated in the figure includes second series circuits each comprising of a switch element and a third impedance element (capacitor in this case) that are connected in parallel with first series circuits each comprising of a switch element and a second impedance element (inductor in this case).

Specifically, similarly to the filter 22E, the filter 22G includes the series arm resonator 22s, the parallel arm resonator 22p, and the capacitor 22C (first impedance element). In addition, the filter 22G includes a plurality of switches 22SWa to 22SWk, a plurality of inductors (second impedance elements) including inductors 22La to 22Lb, and a plurality of capacitors (third impedance elements) including capacitors 22C(k-1) to 22Ck. Here, the plurality of switches 22SWa to SWk, the plurality of inductors, and the plurality of capacitors are serially connected to one another in a one-to-one manner (one-to-one correspondence).

The plurality of capacitors (third impedance elements) each have one terminal connected to the other terminal of a switch, other than the switches of the plurality of inductors, among the switches 22SWa to SWk and have another terminal that is connected to ground. Each inductor forms a second series circuit together with the corresponding switch.

That is, the filter 22G according to this modification includes a plurality of second series circuits each comprising of a switch element (switch 22SW(k-1), 22SWk and so on in this case) having one terminal connected to a connection node (node x2 in FIG. 11) between the parallel arm resonator 22p and the first impedance element (capacitor 22C in this case), and a third impedance element (capacitors 22C(k-1), 22Ck and so on in this case) having one terminal connected to the other terminal of the switch element and the other terminal connected to ground.

The number of second series circuits included in the filter 22G does not have to be plural and just one second series circuit may be provided.

The thus-configured filter 22G (high-frequency filter circuit) has a configuration similar to the filter 22E according to embodiment 2, and therefore similar effects to embodiment 2 are exhibited.

Furthermore, the filter 22G according to this modification includes the second series circuits each comprising of a switch element and a third impedance element. Thus, the frequencies of attenuation poles and the number of attenuation poles can be finely adjusted by appropriately switching the switch elements of the first series circuits and second series circuits on and off.

Here, the filter circuit 22G according to this modification includes a plurality of second series circuits. Therefore, the frequencies of attenuation poles and the number of attenuation poles can be more finely adjusted by appropriately switching the switch elements of the first series circuits and second series circuits on and off.

Modification 3 of Embodiment 2

Modification 2 of embodiment 2 described above, as an example, illustrates a filter in which capacitors are used as the first impedance element and the third impedance elements and inductors are used as the second impedance elements. However the relationship between these elements may be reversed. That is, inductors may be used as the first impedance element and the third impedance elements, and capacitors may be used as the second impedance elements. Accordingly, in modification 3 of embodiment 2, this kind of filter will be described.

Figure 12:
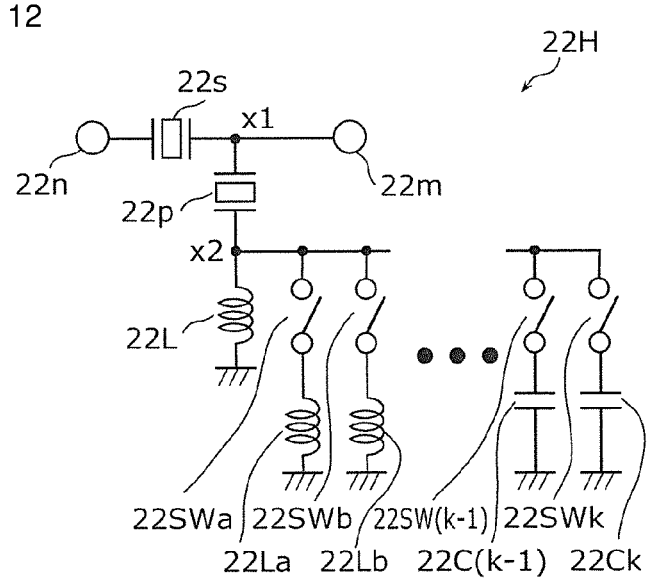
FIG. 12 is a circuit configuration diagram of a filter according to modification 3 of embodiment 2.

FIG. 12 is a circuit configuration diagram of a filter 22H according to modification 3 of embodiment 2.

Compared with the filter 22G according to modification 2 of embodiment 2, the filter 22H illustrated in the figure has the following configuration. That is, the inductor 22L is used as the first impedance element instead of the capacitor 22C. In addition, capacitors 22C(k−1) and 22Ck are provided as a plurality of second impedance elements instead of the inductors 22La and 22Lb. Furthermore inductors 22La and 22Lb are provided as a plurality of third impedance elements instead of the capacitors 22C(k−1) and 22Ck.

That is, in the filter 22H, first series circuits are formed of the capacitors 22C(k−1) and 22Ck and the switches 22SW(k−1) and 22SWk serially connected thereto in an individual manner. Furthermore, second series circuits are formed of the inductors 22La and 22Lb and the switches 22SWa and 22SWb serially connected thereto in an individual manner.

Thus, the filter 22H includes series circuits (second series circuits) that each comprise of a switch element and a third impedance element (inductor in this case) and are connected in parallel with series circuits (first series circuits) that each comprise of a switch element and a second impedance element (capacitor in this case).

Here, the first and second series circuits are circuits obtained by interchanging inductors with capacitors and interchanging capacitors with inductors in the first and second series circuits of modification 2 of embodiment 2, and therefore the detailed description thereof is omitted.

Similar effects as with the filter 22G according to modification 2 of embodiment 2 are exhibited by the thus-configured filter 22H (high-frequency filter circuit).

Embodiment 3

Embodiments 1 and 2 and the modifications thereof described above illustrate, as an example, filters that have a ladder filter structure that comprises of one series arm circuit and one parallel arm circuit. However, a filter may have a ladder filter structure comprising of at least two parallel arm circuits and at least one series arm circuit. Accordingly, in embodiment 3, as an example of such a filter, a diversity tunable filter is described that comprises of four series arm circuits and four parallel arm circuits and supports reception bands of Band 11, Band 21, and Band 32.

First, the frequency bands allocated to these bands will be described.

Band 11 comprises of a reception band of 1475.9-1495.9 [MHz] and a transmission band of 1427.9-1447.9 [MHz]. Band 21 comprises of a reception band of 1495.9-1510.9 [MHz] and a transmission band of 1447.9-1462.9 [MHz]. Band 32 is a dedicated reception band and comprises of a reception band of 1452.0-1496.0 [MHz]. Hereafter, the reception bands (Rx) and transmission bands (Tx) of the various bands may be referred to an abbreviated manner using the band name and text indicating a reception band or a transmission band appended to the end of the band name such as "Band 11 Rx band" for the Band 11 reception band (Rx), for example.

These bands are exclusively used, for example. Therefore, the filter according to this embodiment is configured as a tunable filter that enables the pass band to be switched between a Band 11 Rx band, a Band 21 Rx band, and a Band 32 Rx band.

Figure 13:
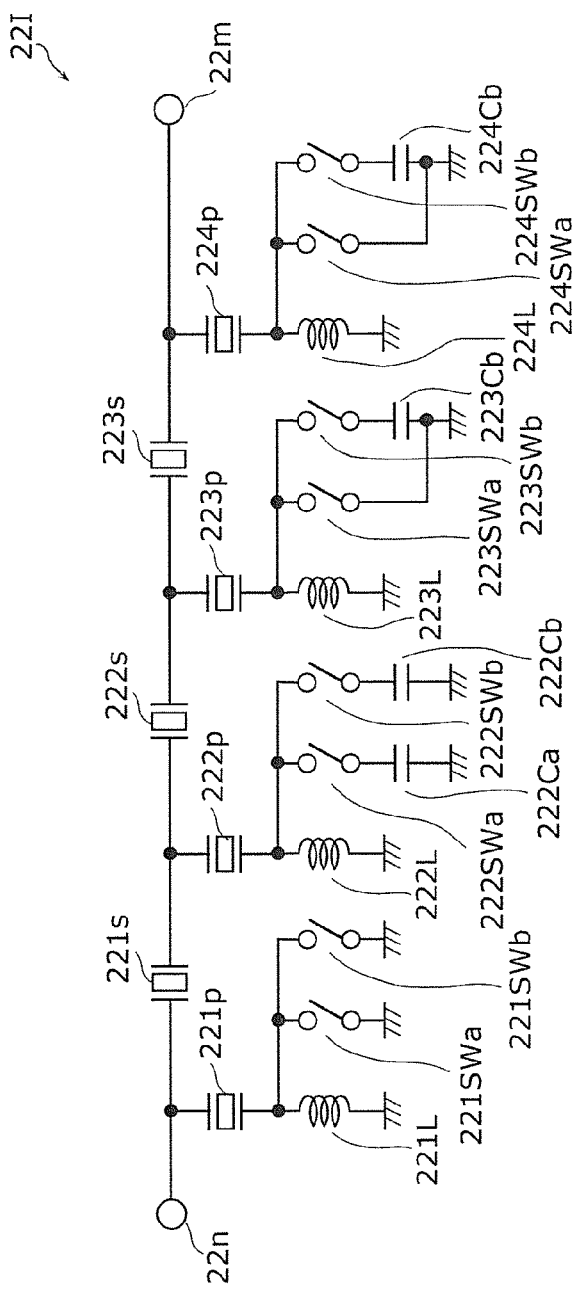
FIG. 13 is a circuit configuration diagram of a filter according to embodiment 3.

FIG. 13 is a circuit configuration diagram of a filter 22I according to embodiment 3.

As illustrated in the figure, the filter 22I is a ladder filter circuit that includes series arm resonators 221s to 223s and parallel arm resonators 221p to 224p. The filter 22I further includes inductors 221L to 224L (first impedance elements) that are individually serially connected to the parallel arm resonators 221p to 224p. The inductors 221L to 224L each have an inductance of 1 to 8 [nH]. Furthermore, the filter 22I includes switches 221SWa to 224SWa and 221SWb to 224SWb (switch elements) and capacitors 222Ca, 222Cb, 223Cb, and 224Cb (second impedance elements) that are for allowing the pass band to be varied.

Here, the series arm resonators 221s to 223s each form a series arm circuit. In addition, the parallel arm resonators 221p to 224p and circuit elements such as capacitors, inductors or switches provided in the same parallel arms as the parallel arm resonators form parallel arm circuits. Therefore, the filter 22I has a ladder filter structure comprising of three series arm circuit and four parallel arm circuits.

One terminal of each of the switches 221SWa and 221SWb is connected to a connection node between the parallel arm resonator 221p and the inductor 221L. Similarly, one terminal of each of the switches 222SWa and 222SWb is connected to a connection node between the parallel arm resonator 222p and the inductor 222L, one terminal of each of the switches 223SWa and 223SWb is connected to a connection node between the parallel arm 223p and the inductor 223L, and one terminal of each of the switches 224SWa and 224SWb is connected to a connection node between the parallel arm resonator 224p and the inductor 224L.

One terminal of the capacitor 222Ca is connected to the other terminal of the switch 222SWa and the other terminal of the capacitor 222Ca is connected to ground. Similarly, one terminal of each of the capacitors 222Cb, 223Cb, and 224Cb is respectively connected to the other terminal of each of the switches 222SWb, 223SWb, and 224SWb and the other terminal of each of the capacitors 222Cb, 223Cb, and 224Cb are connected to ground.

Regarding switches having another terminal that is not connected to the capacitor 222Ca, 222Cb, 223Cb, or 224Cb among the switches 221SWa to 224SWa and 221SWb to 224SWb, this other terminal is connected to ground.

Here, the series circuit comprising of the switch 222SWa and the capacitor 222Ca, the series circuit comprising of the switch 222SWb and the capacitor 222Cb, series circuit comprising of the switch 223SWb and the capacitor 223Cb, and the series circuit comprising of the switch 224SWb and the capacitor 224Cb each correspond to the above-described first series circuit.

The thus-configured filter 22I switches the pass band to any of the Band 11 Rx band, the Band 21 Rx band, and the Band 32 Rx band by switching the switches 221SWa to 224SWa on and off and switching the switches 221SWb to 224SWb on and off in accordance with a control signal. Accordingly, hereafter the bandpass characteristic of the filter 22I will be described using FIGS. 14A to 14D. Hereafter, numerical ranges represented in the form greater than or equal to A and less than or equal to B are abbreviated as A to B.

Figure 14A:
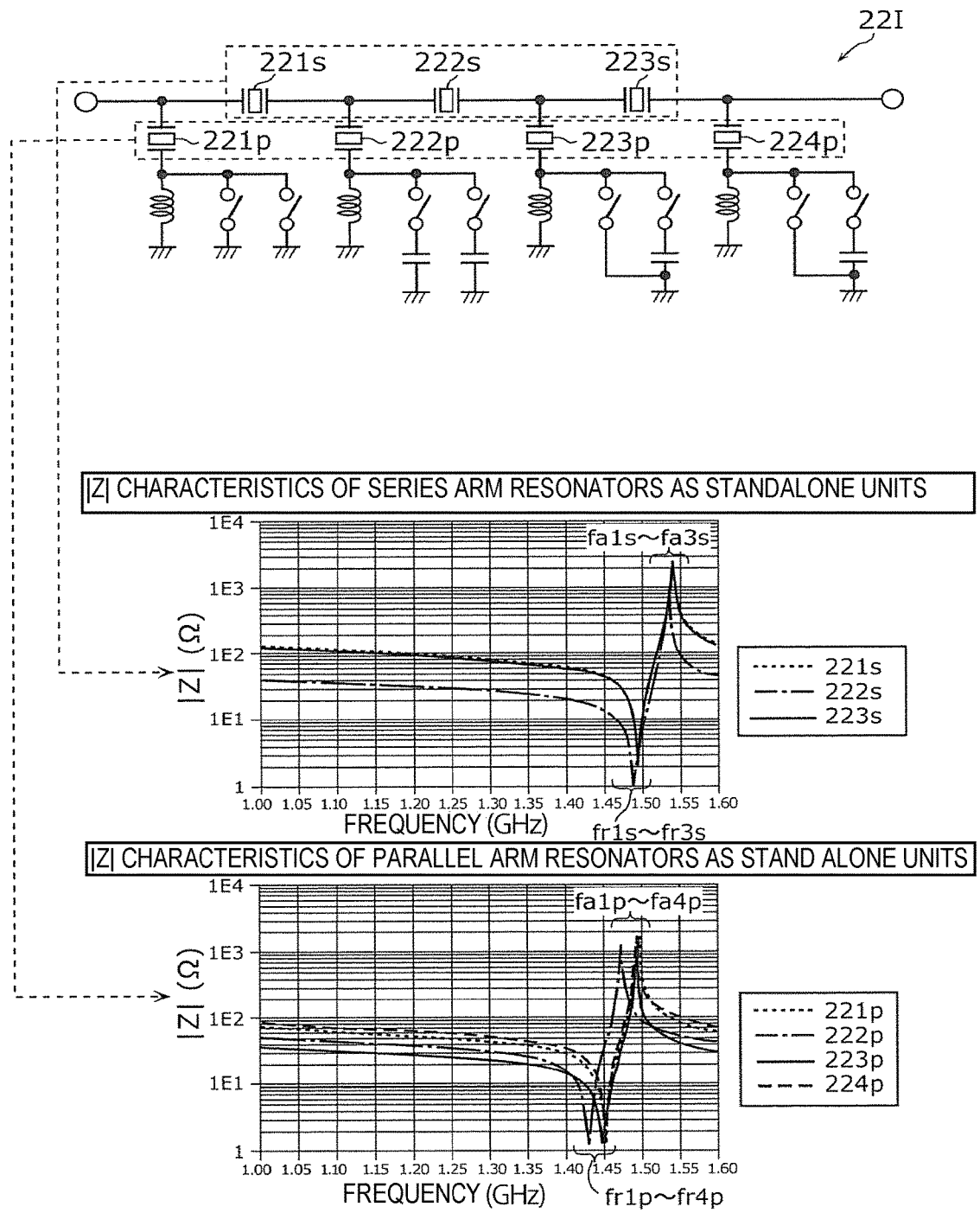
FIG. 14A illustrates graphs depicting the impedance characteristics of resonators, which are included in the filter according to embodiment 3, as standalone units.
Figure 14B:
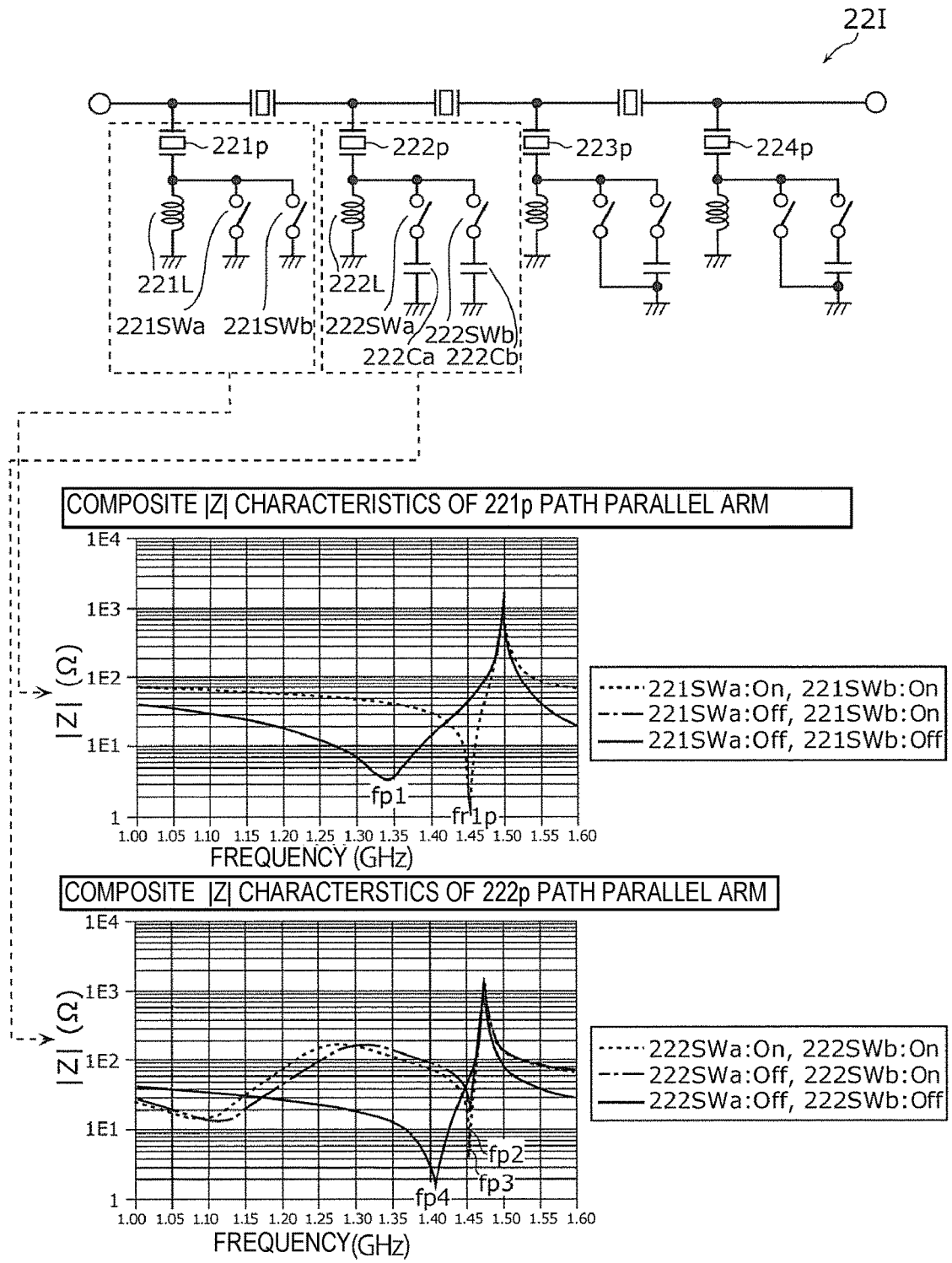
FIG. 14B illustrates graphs depicting the impedance characteristics of some parallel arm circuits of embodiment 3.
Figure 14C:
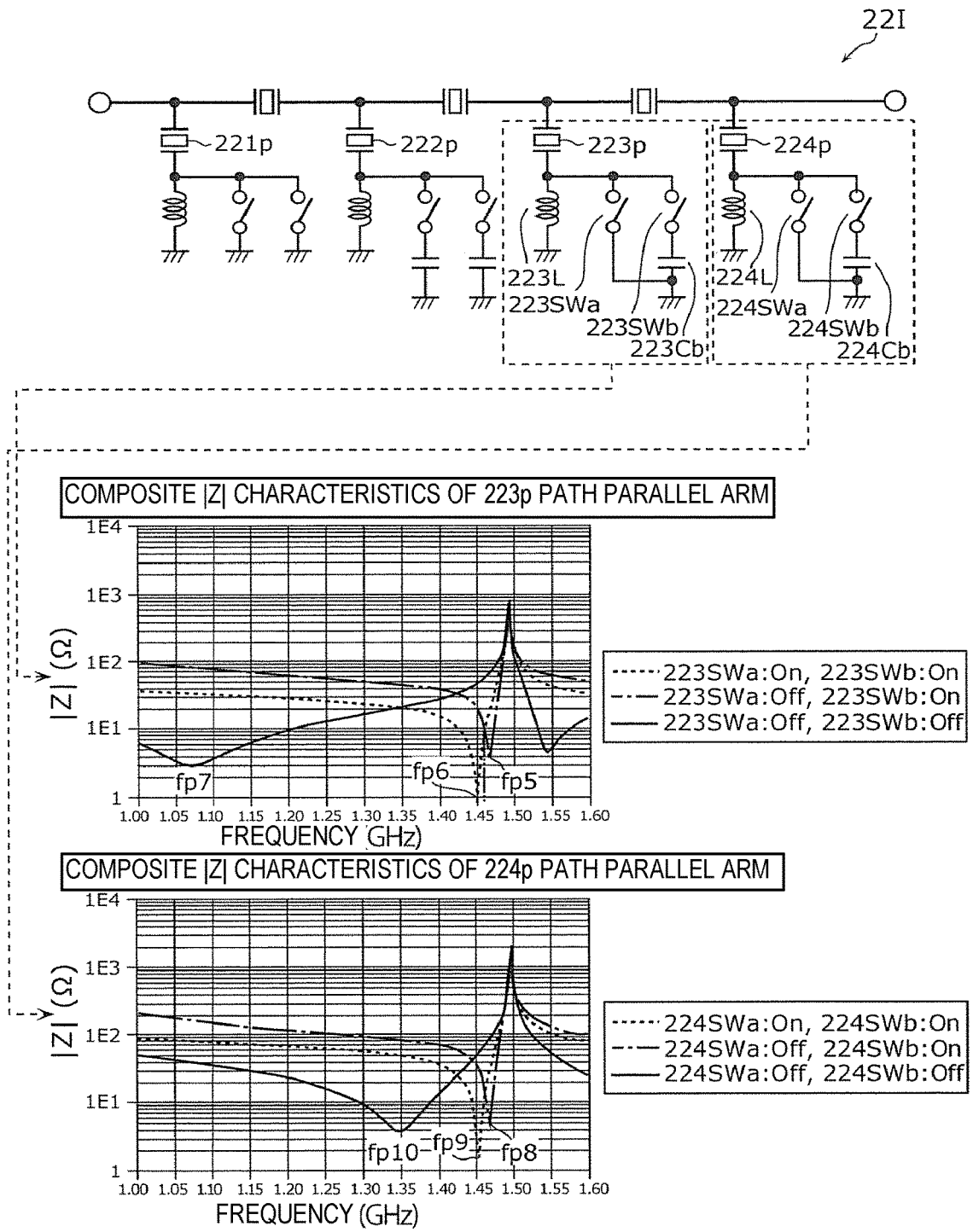
FIG. 14C illustrates graphs depicting the impedance characteristics of the remaining parallel arm circuits of embodiment 3.

FIG. 14A illustrates graphs depicting the impedance characteristics of resonators, which are included in the filter 22I according to embodiment 3, as standalone units. FIG. 14B illustrates graphs depicting an impedance characteristic of the parallel arm circuit in which the parallel arm resonator 221p is provided (221p path parallel arm composite characteristic) and an impedance characteristic of the parallel arm circuit in which the parallel arm resonator 222p is provided (222p path parallel arm composite characteristic). FIG. 14C illustrates graphs depicting an impedance characteristic of the parallel arm circuit in which the parallel arm resonator 223p is provided (223p path parallel arm composite characteristic) and an impedance characteristic of the parallel arm circuit in which the parallel arm resonator 224p is provided (224p path parallel arm composite characteristic). FIG. 14D illustrates a graph depicting bandpass characteristics of the filter 22I.

First, the impedance characteristics of resonators as stand-alone units will be described using FIG. 14A.

The series arm resonators 221s to 223s respectively have resonant frequencies fr1s to fr3s of 1480 to 1500 [MHz] as illustrated in the center part of FIG. 14A. The parallel arm resonators 221p to 224p respectively have resonant frequencies fr1p to fr4p of 1430 to 1460 [MHz] as illustrated in the lower part of FIG. 14A.

Next, the impedance characteristic of the parallel arm circuit in which the parallel arm resonator 221p is provided will be described while referring to FIG. 14A and using the center part of FIG. 14B. The impedance characteristic in the case where the switch 222SWa is off and the switch 222SWb is on and the impedance characteristic in the case where the switches 221SWa and 221SWb are both on are the same as each other. Therefore, in the center part of FIG. 14B, the graphs depicting these two characteristics coincide with each other.

In the case where both the switches 221SWa and 221SWb are on, the inductor 221L is short-circuited by the switches 221SWa and 221SWb, and therefore the parallel arm circuit is a circuit in which the inductor 221L is not added to the parallel arm resonator 221p. Therefore, the impedance characteristic of the parallel arm circuit is substantially matched with the impedance characteristic of the parallel arm resonator 221p. Therefore, the resonant frequency of the parallel arm circuit is substantially matched with the resonant frequency fr1p of the parallel arm resonator 221p. In addition, the same impedance characteristic is also exhibited in the case where only one of the switches 221SWa and 221SWb is on.

In contrast, in the case where both the switches 221SWa and 221SWb are off, the parallel arm circuit is a circuit in which the inductor 221L is serially added to the parallel arm resonator 221p. Therefore, the impedance characteristic of the parallel arm circuit is the composite impedance characteristic of the parallel arm resonator 221p and the inductor 221L. Therefore, the resonant frequency fp1 of the parallel arm circuit is on the low-frequency side of the resonant frequency fr1p of the parallel arm resonator 221p.

In addition, regardless of whether the switches 221SWa and 221SWb are on or off, the anti-resonant frequency of the parallel arm circuit is substantially matched with the anti-resonant frequency fa1p of the parallel arm resonator 221p.

Next, the impedance characteristic of the parallel arm circuit in which the parallel arm resonator 222p is provided will be described while referring to FIG. 14A and using the lower part of FIG. 14B.

In the case where the switch 222SWa is off and the switch 222SWb is on, the parallel arm circuit is a circuit in which an LC parallel resonance circuit comprising of the inductor 222L and the capacitor 222Cb is serially added to the parallel arm resonator 222p. In this embodiment, a frequency fz at which the impedance of the LC parallel resonance circuit is maximum is adjusted so as to be lower than a resonant frequency fr2p of the parallel arm resonator 222p (for example, around 1300 [MHz]). As a result, a high-frequency-side resonant frequency fp2 of the parallel arm circuit at this time is on the high-frequency side of the resonant frequency fr2p of the parallel arm resonator 222p. In addition, the low-frequency-side resonant frequency of the parallel arm circuit at this time is around 1120 [MHz]. Here, the frequency fz at which the impedance of the LC parallel resonance circuit is maximum is expressed by fz=1/(2π√(L1·C2)), where L1 is the inductance of the inductor 222L and C2 is the capacitance of the capacitor 222Cb.

In contrast, in the case where both the switches 222SWa and 222SWb are on, the parallel arm circuit is a circuit in which an LC parallel resonance circuit comprising of the inductor 222L and the capacitors 222Ca and 222Cb is serially added to the parallel arm resonator 222p. In this embodiment, the frequency fz at which the impedance of the LC parallel resonance circuit is maximum is adjusted so as to be lower than fr2p and lower than fr1 (for example, around 1250 [MHz]). As a result, a high-frequency-side resonant frequency fp3 of the parallel arm circuit in this case is on the high-frequency side of the resonant frequency fr2p of the parallel arm resonator 222p. In addition, the low-frequency-side resonant frequency of the parallel arm circuit in this case is around 1080 [MHz]. In addition, at this time, compared with the case where the switch 222SWa is off and the switch 222SWb is on, the capacitance added to parallel arm resonator 222p is larger, and therefore fp3 is on the low-frequency side of fp2 described above. Here, the frequency fz at which the impedance of the LC parallel resonance circuit is maximum is expressed by fz=1/(2π√(L1(C1+C2))), where L1 is the inductance of the inductor 222L and C1 and C2 are the respective capacitances of the capacitors 222Ca and 222Cb.

In contrast, in the case where both the switches 222SWa and 222SWb are off, the parallel arm circuit is a circuit in which the inductor 222L is serially added to the parallel arm resonator 222p. Therefore, a resonant frequency fp4 of the parallel arm circuit at this time is on the low-frequency side of the resonant frequency fr2p of the parallel arm resonator 222p.

In addition, regardless of the whether the switches 222SWa and 222SWb are on or off, the anti-resonant frequency of the parallel arm circuit substantially matches an anti-resonant frequency fa2p of the parallel arm resonator 222p.

Next, the impedance characteristic of the parallel arm circuit in which the parallel arm resonator 223p is provided will be described while referring to FIG. 14A and using the center part of FIG. 14C.

In the case where the switch 223SWa is off and the switch 223SWb is on, the parallel arm circuit is a circuit in which an LC parallel resonance circuit comprising of the inductor 223L and the capacitor 223Cb is serially added to the parallel arm resonator 223p. In this embodiment, a frequency fz at which the impedance of the LC parallel resonance circuit is maximum is adjusted so as to be lower than a resonant frequency fr3p of the parallel arm resonator 223p (for example, around 800 [MHz]). As a result, a high-frequency-side resonant frequency fp5 of the parallel arm circuit at this time is on the high-frequency side of the resonant frequency fr3p of the parallel arm resonator 223p. Here, the frequency fz at which the impedance of the LC parallel resonance circuit is maximum is expressed by fz=1/(2π√(L3·C3)), where L3 is the inductance of the inductor 223L and C3 is the capacitance of the capacitor 223Cb.

In contrast, in the case where both the switches 223SWa and 223SWb are on, the inductor 223L is short-circuited by the switch 223SWa, and therefore the parallel arm circuit is equivalent to a circuit in which the inductor 223L is not added to the parallel arm resonator 223p. Therefore, the impedance characteristic of the parallel arm circuit is substantially matched with the impedance characteristic of the parallel arm resonator 223p. Therefore, a resonant frequency fp6 of the parallel arm circuit at this time is substantially matched with the resonant frequency fr3p of the parallel arm resonator 223p.

In contrast, in the case where both the switches 223SWa and 223SWb are off, the parallel arm circuit is a circuit in which the inductor 223L is serially added to the parallel arm resonator 223p. Therefore, a resonant frequency fp7 of the parallel arm circuit at this time is on the low-frequency side of the resonant frequency fr3p of the parallel arm resonator 223p.

In addition, regardless of the whether the switches 223SWa and 223SWb are on or off, the anti-resonant frequency of the parallel arm circuit substantially matches an anti-resonant frequency fa3p of the parallel arm resonator 223p.

Next, the impedance characteristic of the parallel arm circuit in which the parallel arm resonator 224p is provided will be described while referring to FIG. 14A using the lower part of FIG. 14C. In this case, the parallel arm circuit in which the parallel arm resonator 224p is provided has the same configuration as the parallel arm circuit in which the parallel arm resonator 223p is provided as described above, and therefore the parallel arm circuit is described in an abbreviated manner hereafter.

In the case where the switch 224SWa is off and the switch 224SWb is on, the parallel arm circuit is a circuit in which an LC parallel resonance circuit comprising of the inductor 224L and the capacitor 224Cb is serially added to the parallel arm resonator 224p. In this embodiment, a frequency fz at which the impedance of the LC parallel resonance circuit is maximum is adjusted so as to be lower than a resonant frequency fr4p of the parallel arm resonator 224p (for example, around 880 [MHz]). As a result, a high-frequency-side resonant frequency fp8 of the parallel arm circuit at this time is on the high-frequency side of the resonant frequency fr4p of the parallel arm resonator 224p.

In contrast, in the case where both the switches 224SWa and 224SWb are on, the impedance characteristic of the parallel arm circuit is substantially matched with the impedance characteristic of the parallel arm resonator 224p. Therefore, a resonant frequency fp9 of the parallel arm circuit at this time is substantially matched with the resonant frequency fr4p of the parallel arm resonator 224p.

In contrast, in the case where both the switches 224SWa and 224SWb are off, a resonant frequency fp10 of the parallel arm circuit is on the low-frequency side of the resonant frequency fr4p of the parallel arm resonator 224p.

Thus far, the impedance characteristics of the series arm resonators 221s to 223s and the impedance characteristics that can be varied by switching the switches of the parallel arm circuits of the parallel arm resonators 221p to 224p on and off have been described. Hereafter, the bandpass characteristics of the filter 22I defined by these impedance characteristics will be described using FIG. 14D. In this case, hereafter, the switches 221SWa to 224SWa are switched on and off together in accordance with a control signal (for example, control signal φS22a in FIG. 14D), and the switches 221SWb to 224SWb are switched on and off together in accordance with a control signal (for example, control signal φS22b in FIG. 14D). In addition, these switches 221SWa to 224SWa and 221SWb to 224SWb may be switched on and off in an individual manner.

First, in the case where the switches 221SWa to 224SWa are switched off and the switches 221SWb to 224SWb are switched on, the bandpass characteristic of the filter 22I is as follows. Specifically, the pass band is defined by the resonant frequencies fr1s to fr3s of the series arm resonators 221s to 223s and by the high-frequency-side anti-resonant frequencies of the parallel arm circuits described above (that is the anti-resonant frequencies fa1p to fa4p of the parallel arm resonators 221p to 224p). In addition, an attenuation band (stop band) in the vicinity of the low-frequency side of the pass band is defined by the high-frequency-side resonant frequencies fr1p, fp2, fp5, and fp8 of the parallel arm circuits described above. Furthermore, an attenuation band (stop band) on the high-frequency side of the pass band is defined by the anti-resonant frequencies fa1s to fa3s of the series arm resonators 221s to 223s. In addition, the attenuation band (stop band) on the low-frequency side of the pass band is also defined by the low-frequency-side resonant frequency of parallel arm circuit in which the parallel arm resonator 222p is provided (around 1080 MHz).

Thus, the bandpass characteristic in this case takes the form of a graph illustrated by the one-dot chain line in the lower part of FIG. 14D. That is, the filter 22I in this case is a filter in which Band 21 Rx is a pass band and Band 21 Tx is an attenuation band.

Next, in the case where the switches 221SWa to 224SWa are switched on and the switches 221SWb to 224SWb are also switched on, the bandpass characteristic of the filter 22I is as follows. Specifically, the pass band is defined by the resonant frequencies fr1s to fr3s of the series arm resonators 221s to 223s and by the high-frequency-side anti-resonant frequencies of the parallel arm circuits described above (that is the anti-resonant frequencies fa1p to fa4p of the parallel arm resonators 221p to 224p). In addition, an attenuation band (stop band) in the vicinity of the low-frequency side of the pass band is defined by the high-frequency-side resonant frequencies fr1p, fp3, fp6, and fp9 of the parallel arm circuits described above. Furthermore, an attenuation band (stop band) on the high-frequency side of the pass band is defined by the anti-resonant frequencies fa1s to fa3s of the series arm resonators 221s to 223s. In addition, the attenuation band (stop band) on the low-frequency side of the pass band is also defined by the low-frequency-side resonant frequency of parallel arm circuit in which the parallel arm resonator 222p is provided (around 1120 MHz).

Thus, the bandpass characteristic in this case takes the form of a graph illustrated by the short dash line in the lower part of FIG. 14D. That is, the filter 22I in this case is a filter in which Band 11 Rx is a pass band and Band 11 Tx is an attenuation band.

Next, in the case where the switches 221SWa to 224SWa are switched off and the switches 221SWb to 224SWb are also switched off, the bandpass characteristic of the filter 22I is as follows. Specifically, the pass band is defined by the resonant frequencies fr1s to fr3s of the series arm resonators 221s to 223s and by the anti-resonant frequencies of the parallel arm circuits described above (that is the anti-resonant frequencies fa1p to fa4p of the parallel arm resonators 221p to 224p). In addition, an attenuation band (stop band) on the low-frequency side of the pass band is defined by the resonant frequencies fp1, fp4, fp7, and fp10 of the parallel arm circuits described above. Furthermore, an attenuation band (stop band) on the high-frequency side of the pass band is defined by the anti-resonant frequencies fa1s to fa3s of the series arm resonators 221s to 223s.

Thus, the bandpass characteristic in this case takes the form of a graph illustrated by the solid line in the lower part of FIG. 14D. That is, the filter 22I in this case is a filter in which Band 32 Rx is a pass band.

Thus, the filter 22I according to this embodiment is able to switch the pass band thereof to any of the Band 11 Rx band, the Band 21 Rx band, and the Band 32 Rx band by switching the switches 221SWa to 224SWa and 221SWb to 224SWb on and off in accordance with control signals.

In addition, in this embodiment, the three parallel arm circuits in which the parallel arm resonators 222$p$ to 224$p$ are provided each have the configuration of a parallel arm circuit according to any of embodiments 1 and 2 and the modifications thereof. Therefore, according to this embodiment, the same effects as in embodiments 1 and 2 and the modifications thereof are exhibited.

That is, sufficient attenuation can be secured in an attenuation band at a lower frequency than the resonant frequencies fr1$p$ to fr4$p$ of the parallel arm resonators 222$p$ to 224$p$.

Specifically, in this embodiment, in the three parallel arm circuits in which the parallel arm resonators 222$p$ to 224$p$ are provided, the second impedance elements serially connected to the switches are capacitors and the first impedance elements connected in parallel with a first series circuit comprising of a switch and a second impedance element are inductors.

In addition, the filter is not limited to this configuration, and it is sufficient that the filter have a ladder filter configuration comprising of at least two parallel arm circuits according to any one of embodiments 1 and 2 and the modifications thereof and at least one series arm circuit according to any one of embodiments 1 and 2 and the modifications thereof. Therefore, the number and configurations of the parallel arm circuits and the series arm circuit are not limited to the examples described here. Furthermore, in the filter, the first impedance element may be a capacitor and the second impedance element may be an inductor in each of the at least two parallel arm circuits. In addition, in the filter, the first impedance element may be a capacitor and the second impedance element may be an inductor in some of the parallel arm circuits among the at least two parallel arm circuits, and the first impedance element may be an inductor and the second impedance element may be a capacitor in the other parallel arm circuits.

The filter 22I has the following structure for example.

Figure 15A:
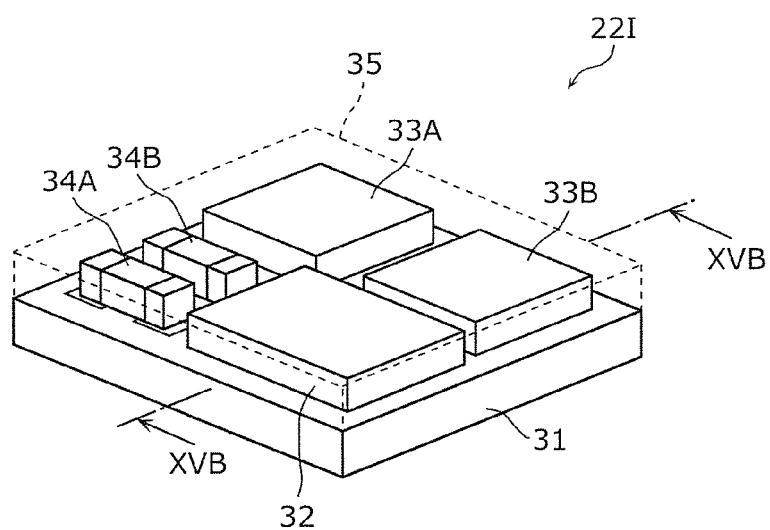
FIG. 15A is an external perspective view of the filter according to embodiment 3.
Figure 15B:
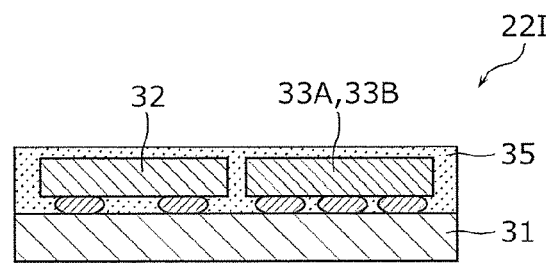
FIG. 15B is a sectional view of the filter according to embodiment 3.

FIG. 15A is an external perspective view of the filter 22I according to embodiment 3. FIG. 15B is a sectional view of the filter 22I according to embodiment 3, specifically a sectional view taken along line XVB-XVB in FIG. 15A. In FIG. 15A, components sealed by a sealing member 35 are illustrated with the sealing member 35 being transparent.

As illustrated in these figures, the filter 22I includes a module substrate 31, an elastic wave resonator package 32, switch integrated circuits (IC's) 33A and 33B, chip components 34A and 34B, and the sealing member 35. In this embodiment, the filter 22I has a stack structure in which the elastic wave resonator package 32, the switch IC's 33A and 33B, and the chip components 34A and 34B are arranged on the module substrate 31.

For example, the module substrate 31 is a low temperature co-fired ceramic (LTCC) substrate into which elements having comparatively small constants among inductors and capacitors (first impedance elements and second impedance elements) and wiring lines included in the filter 22I are incorporated.

The elastic wave resonator package 32 has resonators built therein, and is formed of piezoelectric substrates, IDT electrodes, and so forth, for example.

The switch IC's 33A and 33B are chip components having the switches 221SWa to 224SWa and 221SWb to 224SWb built therein, and for example have four SPST switches built therein that are switched on and off in accordance with control signals from control terminals (not illustrated).

The chip components 34A and 34B are elements having comparatively large constants among the inductors and capacitors (first impedance elements and second impedance elements).

The sealing member 35 seals the components arranged on the module substrate 31 and is composed of resin, for example. In addition, a shield electrode may be provided on the resin surface.

The filter 22I according to this embodiment has a stack structure, and therefore space can be saved in terms of the mounting area. The filter 22I is not limited to having a stack structure, and for example, some of the components may be mounted on a different substrate from the module substrate 31.

Embodiment 4

The filter 22I described in embodiment 3 can also be applied to a high-frequency filter circuit that supports a system in which a greater number bands are used than in the high-frequency front end circuit 2 according to embodiment 1. Accordingly, such a high-frequency front end circuit will be described in this embodiment.

Figure 16:
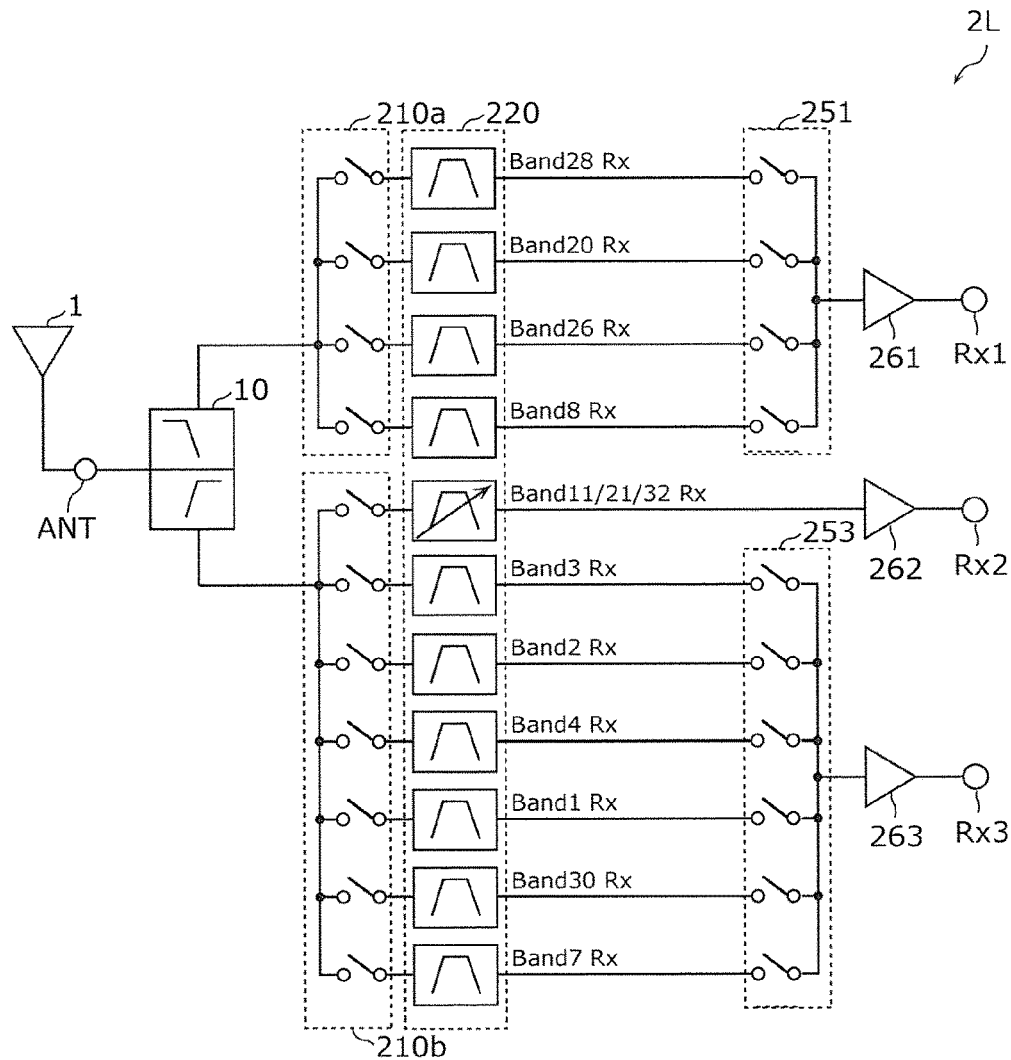
FIG. 16 is a configuration diagram of a high-frequency front end circuit according to embodiment 4.

FIG. 16 is a configuration diagram of a high-frequency front end circuit 2L according to embodiment 4.

As illustrated in the figure, the high-frequency front end circuit 2L includes an antenna terminal ANT connected to an antenna element 1 and reception terminals Rx1 to Rx3, and includes, in order from the antenna terminal ANT side, a diplexer 10, switch groups 210$a$ and 210$b$ that are each formed of a plurality of switches, a filter group 220 that is formed of a plurality of filters, reception switches 251 and 253, and reception amplification circuits 261 to 263.

The diplexer 10 is a branching filter that branches low-band-side high-frequency signals and high-band-side high-frequency signals.

The switch groups 210$a$ and 210$b$ connect the antenna terminal ANT and signal paths corresponding to the prescribed bands in accordance with a control signal from a control unit (not illustrated) and are each formed of a plurality of SPST switches, for example. The configuration is not limited to only one signal path being connected to the antenna terminal ANT, and a plurality of signal paths may be connected to the antenna terminal ANT. In other words, the high-frequency front end circuit 2L may support carrier aggregation. In addition, the switch groups 210$a$ and 210$b$ may be each formed of SPnT switches.

The filter group 220 is formed of a plurality of filters having the following pass bands, for example. Specifically, the bands are (i) Band 28 reception band, (ii) Band 20 reception band, (iii) Band 26 reception band, (iv) Band 8 reception band, (v) Band 11 (or Band 21 or Band 32) reception band, (vi) Band 3 reception band, (vii) Band 2 reception band, (viii) Band 4 reception band, (ix) Band 1 reception band, (x) Band 30 reception band, and (xi) Band 7 reception band.

The reception switch 251 is a switch circuit having a plurality of selection terminals that are connected to a plurality of reception-side signal paths on the low band side and having a common terminal that is connected to the reception amplification circuit 261. The reception switch 253 is a switch circuit having a plurality of selection terminals that are connected to a plurality of reception-side signal paths on the high band side and having a common terminal that is connected to the reception amplification circuit 263. These reception switches 251 and 253 are provided in a stage subsequent to the filter group 220 (subsequent stage on reception-side signal paths in this case), and the connection states thereof are switched in accordance with control signals from the control unit (not illustrated). Thus, high-frequency signals inputted to the antenna terminal ANT (high-frequency reception signals in this case) pass through the prescribed filters of the filter group 220, are amplified by the reception amplification circuits 261 to 263, and are output to the RFIC 3 (refer to FIG. 1) from the reception terminals Rx1 to Rx3. An RFIC that supports low bands and an RFIC that supports high bands may be individually provided.

The reception amplification circuit 261 is a low noise amplifier that amplifies the power of a low-band high-frequency reception signal, the reception amplification circuit 262 is a low noise amplifier that amplifies the power of a Band 11 (or Band 21 or Band 32) high-frequency reception signal, and the reception amplification circuit 263 is a low noise amplifier that amplifies the power of a high-band high-frequency reception signal.

The thus-configured high-frequency front end circuit 2L includes the filter 22I according to embodiment 3 as a filter having the (v) Band 11 (or Band 21 or Band 32) reception band as a pass band. That is, the filter switches the pass band to the Band 11 Rx band, the Band 21 Rx band, or the Band 32 Rx band in accordance with a control signal.

The thus-configured high-frequency front end circuit 2L includes the filter 22I (high-frequency filter circuit) according to embodiment 3, and as a result, the number of filters can be reduced compared with the case where a filter is provided for each band, and therefore a reduction in size can be achieved.

The high-frequency front end circuit 2L is not limited to including the filter 22I, and may instead include the filter according to embodiment 1 or 2 or a modification thereof.

Furthermore, the high-frequency front end circuit 2L according to this embodiment includes the reception switches 251 and 253 (switch circuits) provided in a stage prior to or subsequent to the filter group 220 (a plurality of high-frequency filter circuits). Thus, common signal paths can be used for the parts of the signal paths along which high-frequency signals propagate. Therefore, the reception amplification circuits 261 and 262 (amplification circuits) can be commonly used to support a plurality of high-frequency filter circuits. Therefore, the high-frequency front end circuit 2L can be reduced in size and cost.

In addition, it is sufficient that at least one of the reception switches 251 and 253 be provided. Furthermore, the number of selection terminals and so on of the reception switches 251 and 253 are not limited to the examples given in this embodiment, and may be two or more.

Embodiment 5

In addition, a filter having a variable frequency function as described above can be applied to a multiplexer that includes a plurality of filters including such a filter. Accordingly, this embodiment illustrates, as an example of such a multiplexer, a multiplexer having a configuration including a filter that supports Band 11, Band 21 and Band 32 reception bands and a filter that supports a Band 1 reception band.

Figure 17:
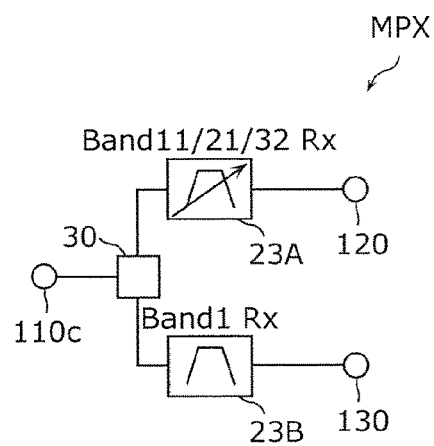
FIG. 17 is a configuration diagram of a multiplexer according to embodiment 5.

FIG. 17 is a configuration diagram of a multiplexer MPX according to embodiment 5.

The multiplexer MPX illustrated in the figure is a reception diplexer, and includes a filter 23A having a variable frequency function and a filter 23B not having a variable frequency function. In this embodiment, the multiplexer MPX further includes a connection circuit 30.

The filter 23A is a reception filter having a variable frequency function for Band 11, Band 21 and Band 32 reception bands, and one input/output terminal thereof is connected to a common terminal 110c of the multiplexer MPX via the connection circuit 30 and the other input/output terminal thereof is connected to an input/output terminal 120 of the multiplexer MPX.

The filter 23A has the configuration of a filter having a variable frequency function as described in any of embodiments 1 to 4 and the modifications thereof.

The filter 23B is a reception filter for the Band 1 reception band and does not have a variable frequency function, and one input/output terminal thereof is connected to the common terminal 110c of the multiplexer MPX via the connection circuit 30 and the other input/output terminal thereof is connected to an input/output terminal 130 of the multiplexer MPX.

The connection circuit 30 connects the common terminal 110c of the multiplexer MPX and one input/output terminal of each of the filters 23A and 23B to each other. For example, the connection circuit 30 is a phase adjuster, a switch for selecting at least either of the filter 23A and the filter 23B, or a circulator.

In the multiplexer MPX, the filter 23A has the configuration of a filter having a variable frequency function as described in any of embodiments 1 to 4 and the modifications thereof, and consequently the multiplexer MPX is a multiplexer that can be applied to a system that supports multiple bands and can be a reduced in size.

The multiplexer MPX does not have to include the connection circuit 30. In other words, the multiplexer MPX is not limited to having a configuration in which the filters 23A and 23B are indirectly connected to the common terminal 110c via the connection circuit 30 and the filters 23A and 23B may be directly connected to the common terminal 110c without any circuit elements interposed therebetween.

Furthermore, the multiplexer MPX is not limited to being used for reception and may be used for transmission, and the multiplexer MPX may be duplexer including a reception filter and a transmission filter, for example. In addition, the multiplexer MPX may include three or more filters.

OTHER EMBODIMENTS

The high-frequency filter circuits and high-frequency front end circuits according to embodiments of the present disclosure described above have been described in the form of embodiments 1 to 5 and modifications thereof, but the present disclosure is not limited to these embodiments and modifications. Other embodiments realized by combining any of the constituent elements of the above-described embodiments and modifications with one another, modifications obtained by modifying the above-described embodiments in various ways, as thought of by one skilled in the art, without departing from the gist of the present disclosure, and various devices having a high-frequency filter circuit and a front-end module of the present disclosure built therein are also included in the present disclosure.

For example, a communication device including the high-frequency front end circuit 2 and the RFIC 3 (RF signal processing circuit) described above is also included in the present disclosure. According to such a communication device 4, sufficient attenuation can be secured in an attenuation band at a low frequency in the communication device 4 that supports multiple bands.

In addition, for example, the parallel arm circuit does not have to be connected to a node on the input/output terminal 22m side of the series arm resonator 22s, and may instead be connected to a node on the input/output terminal 22n side of the series arm resonator 22s.

Furthermore, in the above description, regarding the parallel arm resonator 22p and the first impedance element, the parallel arm resonator 22p is connected to the node x1. However, it is sufficient that the first impedance element be serially connected to the parallel arm resonator 22p between the node x1 and ground, for example, the first impedance element may be connected to the node x1.

In addition, for example, in the first series circuit, the order of connecting the second impedance element and the switch element is not limited. That is, among the second impedance element and the switch element in the first series circuit described above, the second impedance element is connected on the ground side, but the switch element may instead be connected on the ground side.

Similarly, for example, in the second series circuit, the order of connecting the third impedance element and the switch element is not limited. That is, among the third impedance element and the switch element in the second series circuit described above, the third impedance element is connected on the ground side, but the switch element may instead be connected on the ground side.

In addition, for example, the control unit may be provided outside the RFIC 3 (RF signal processing circuit), and for example, may be provided in the high-frequency front end circuit. That is, the high-frequency front end circuit is not limited to the above-described configurations, and may include a high-frequency filter circuit having an impedance circuit (that is, filter having a frequency variable width function) and a control unit that controls switching of a switch element of the impedance circuit between on and off. With the thus-configured high-frequency front end circuit, sufficient attenuation can be secured in an attenuation band at a low frequency in a high-frequency front end circuit that supports multiple bands.

In addition, a high-frequency filter having an impedance circuit is not limited to being a transmission filter and may be a reception filter.

Furthermore, for example, inductors and capacitors may be connected between constituent elements of such a high-frequency front end circuit or communication device. Such inductors may include wiring line inductors formed by wiring lines connecting the constituent elements.

The present disclosure can be widely used in communication devices such as cellular phones in the form of compact filters, front end circuits, and communication devices that can be applied to multi-band systems.

1 antenna element
2, 2L high-frequency front end circuit
3 RFIC (RF signal processing circuit)
4 communication device
10 diplexer
11 series arm circuit
12, 12D parallel arm circuit
13, 13D impedance circuit
14, 14D first series circuit
22A, 22B, 22D to 22I, 23A, 23B filter (high-frequency filter circuit)
22C, 22Ca, 22C(k−1), 22Ck, 222Ca, 222Cb, 223Cb, 224Cb capacitor
22L, 22La, 22Lb, 22Lk, 221L to 224L inductor
22m input/output terminal (first input/output terminal)
22n input/output terminal (second input/output terminal)
22SW, 22SWa, 22SWb, 22SW(k−1), 22SWk, 221SWa to 224SWa, 221SWb to 224SWb switch (switch element)
22p, 221p to 224p parallel arm resonator
22s, 221s to 223s series arm resonator
24 transmission amplification circuit
26, 261 to 263 reception amplification circuit
30 connection circuit
31 module substrate
32 elastic wave resonator package
33A, 33B switch IC
34A, 34B chip component
35 sealing member
100 piezoelectric substrate
101 adhesive layer
102 main electrode layer
103 protective layer
110a, 110b electrode finger
110c common terminal
111a, 111b busbar electrode
120, 130 input/output terminal
120A, 120D to 120F, 120Z, 121G to 123G parallel arm circuit
210a, 210b switch group
220 filter group
251, 253 reception switch (switch circuit)
ANT antenna terminal
MPX multiplexer
Tx, Tx1, Tx2 transmission terminal
Rx, Rx1, Rx2 reception terminal

The invention claimed is:
1. A high-frequency filter circuit comprising:
a series arm circuit on a path connecting a first input/output terminal and a second input/output terminal; and
a parallel arm circuit connected between a node on the path and ground, wherein:
the parallel arm circuit includes a parallel arm resonator and an impedance circuit connected in series with the parallel arm resonator,
the impedance circuit includes a first impedance element connected in parallel with a first series circuit,
the first impedance element is an inductor or a capacitor,
the first series circuit includes a second impedance element and a switch connected in series with each other, and
the second impedance element is the other of the inductor or the capacitor.
2. The high-frequency filter circuit according to claim 1, wherein the first impedance element is the capacitor and the second impedance element is the inductor.
3. The high-frequency filter circuit according to claim 2, wherein when the switch is in a conductive state, a frequency at which an impedance of the impedance circuit is at a maximum is greater than a resonant frequency of the parallel arm resonator.
4. The high-frequency filter circuit according to claim 2, wherein when the switch is in a conductive state, a fre- quency at which an impedance of the impedance circuit is at a maximum is less than a resonant frequency of the parallel arm resonator.

5. The high-frequency filter circuit according to claim 1, wherein the first impedance element is the inductor and the second impedance element is the capacitor.

6. The high-frequency filter circuit according to claim 5, wherein when the switch is in a conductive state, a frequency at which an impedance of the impedance circuit is at a maximum is less than a resonant frequency of the parallel arm resonator.

7. The high-frequency filter circuit according to claim 5, wherein when the switch is in a conductive state, a frequency at which an impedance of the impedance circuit is at a maximum is greater than a resonant frequency of the parallel arm resonator.

8. The high-frequency filter circuit according to claim 1, further comprising:
a second series circuit connected in parallel with the first impedance element, wherein:
the second series circuit includes a third impedance element and a second switch connected in series with each other, and
the third impedance element is a second inductor or a second capacitor.

9. The high-frequency filter circuit according claim 1, wherein the high-frequency filter circuit has a ladder filter structure comprising a plurality of the parallel arm circuits and at least one series arm circuit.

10. The high-frequency filter circuit according to claim 9, wherein in each parallel arm circuit, the first impedance element is the capacitor and the second impedance element is the inductor.

11. The high-frequency filter circuit according to claim 9, wherein in each parallel arm circuit, the first impedance element is the inductor and the second impedance element is the capacitor.

12. The high-frequency filter circuit according to claim 9, wherein:
in a first of the parallel arm circuits, the first impedance element is the capacitor and the second impedance element is the inductor, and
in a second of the parallel arm circuits, the first impedance element is the inductor and the second impedance element is the capacitor.

13. A high-frequency front end circuit comprising:
a plurality of high-frequency filter circuits including the high-frequency filter circuit according to claim 1; and
a switch circuit having a plurality of selection terminals that are individually connected to the plurality of high-frequency filter circuits and a common terminal that is selectively connected to the plurality of selection terminals.

14. A communication device comprising:
an RF signal processing circuit configured to process a high-frequency signal transmitted or received by an antenna; and
the high-frequency front end circuit according to claim 13, the high-frequency front end circuit being configured to transmit the high-frequency signal between the antenna and the RF signal processing circuit.

15. A high-frequency front end circuit comprising:
the high-frequency filter circuit according to claim 1; and
a controller configured to control selective switching of the switch between a conductive state and a non-conductive state.

16. A communication device comprising:
an RF signal processing circuit configured to process a high-frequency signal transmitted or received by an antenna; and
the high-frequency front end circuit according to claim 15, the high-frequency front end circuit being configured to transmit the high-frequency signal between the antenna and the RF signal processing circuit.

17. A high-frequency filter circuit comprising:
a series arm resonator on a path connecting a first input/output terminal and a second input/output terminal;
a parallel arm resonator connected between a node on the path and ground;
a first impedance element connected in series with the parallel arm resonator between the node and ground; and
a first series circuit connected in parallel with the first impedance element and including a second impedance element and a switch connected in series with each, wherein:
the first impedance element is an inductor or a capacitor, the second impedance element is the other of the inductor or the capacitor.

18. A high-frequency front end circuit comprising:
a plurality of high-frequency filter circuits including the high-frequency filter circuit according to claim 17; and
a switch circuit having a plurality of selection terminals that are individually connected to the plurality of high-frequency filter circuits and a common terminal that is selectively connected to the plurality of selection terminals.

19. A high-frequency front end circuit comprising:
the high-frequency filter circuit according to claim 17; and
a controller configured to control selective switching of the switch between a conductive state and a non-conductive state.

* * * * *